US011502169B2

(12) United States Patent
Xie et al.

(10) Patent No.: US 11,502,169 B2
(45) Date of Patent: Nov. 15, 2022

(54) NANOSHEET SEMICONDUCTOR DEVICES WITH N/P BOUNDARY STRUCTURE

(71) Applicant: International Business Machines Corporation, Armonk, NY (US)

(72) Inventors: Ruilong Xie, Niskayuna, NY (US); Jingyun Zhang, Albany, NY (US); Xin Miao, Slingerlands, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 17/128,351

(22) Filed: Dec. 21, 2020

(65) Prior Publication Data

US 2022/0199772 A1    Jun. 23, 2022

(51) Int. Cl.
*H01L 29/06* (2006.01)
*H01L 29/66* (2006.01)
*H01L 29/786* (2006.01)

(52) U.S. Cl.
CPC ...... *H01L 29/0673* (2013.01); *H01L 29/6656* (2013.01); *H01L 29/66742* (2013.01); *H01L 29/78696* (2013.01)

(58) Field of Classification Search
CPC ............. H01L 29/0673; H01L 29/6656; H01L 29/66742; H01L 29/78696
USPC ........................................................ 257/288
See application file for complete search history.

(56) References Cited

U.S. PATENT DOCUMENTS

| 8,791,502 B2 | 7/2014 | Wang |
| 9,331,088 B2 | 5/2016 | Takaki |
| 9,812,449 B2 | 11/2017 | Obradovic et al. |
| 10,319,846 B1* | 6/2019 | Ando .............. H01L 21/823807 |
| 10,510,620 B1 | 12/2019 | Chanemougame |
| 2018/0138291 A1 | 5/2018 | Smith et al. |
| 2018/0175194 A1 | 6/2018 | Reboh et al. |

(Continued)

FOREIGN PATENT DOCUMENTS

| CN | 108933084 A | 12/2018 |
| CN | 109904219 A | 6/2019 |

OTHER PUBLICATIONS

Loubet et al., "Stacked Nanosheet Gate-All-Around Transistor to Enable Scaling Beyond FinFET", Research Gate, Conference Paper • Jun. 2017, 3 pages.

(Continued)

*Primary Examiner* — Tong-Ho Kim
(74) *Attorney, Agent, or Firm* — Jeffrey M. Ingalls

(57) ABSTRACT

A method of manufacturing a nanosheet field effect transistor (FET) device is provided. The method includes forming a plurality of nanosheet stacks on a substrate, the nanosheet stacks including alternating layers of first type sacrificial layers and active semiconductor layers. The method includes forming the first type sacrificial layer on sidewalls of the nanosheet stacks, then forming a dielectric pillar between the sidewall portions of the first type sacrificial layers of adjacent nanosheet stacks, and then removing the first type sacrificial layer. The method also includes forming a PWFM layer in spaces formed by the removal of the first type sacrificial layer for a first one of the nanosheet stacks, and includes forming a NWFM layer in spaces formed by the removal of the first type sacrificial layer for an adjacent second one of the nanosheet stacks.

19 Claims, 53 Drawing Sheets

(56) References Cited

U.S. PATENT DOCUMENTS

| | | | |
|---|---|---|---|
| 2018/0342615 A1 | 11/2018 | Bergendahl et al. | |
| 2018/0350935 A1 | 12/2018 | Bao et al. | |
| 2019/0214311 A1 | 7/2019 | Seshadri | |
| 2020/0035567 A1* | 1/2020 | Chanemougame | ... H01L 29/401 |
| 2020/0294863 A1* | 9/2020 | Chiang | ........... H01L 21/823807 |
| 2020/0357703 A1 | 11/2020 | Lee | |
| 2022/0123124 A1* | 4/2022 | Chiu | ................. H01L 29/78696 |

OTHER PUBLICATIONS

Jang et al., "Device Exploration of NanoSheet Transistors for Sub-7-nm Technology Node", IEEE Transactions on Electron Devices, vol. 64, No. 6, Jun. 2017, 7 pages.

International Search Report and Written Opinion for Application PCT/CN2021/131488, dated Feb. 10, 2022, 10 pages.

\* cited by examiner

NANOSHEET SEMICONDUCTOR DEVICES WITH N/P BOUNDARY STRUCTURE

BACKGROUND

The present disclosure relates to fabrication methods and resulting structures for semiconductor devices. More specifically, the present disclosure relates to fabrication methods and resulting structures for nanosheet field effect transistors (FETs).

In certain semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased.

Nanosheets generally refer to two-dimensional nanostructures with a thickness range on the order of about 1 nanometer (nm) to about 100 nm, and they can facilitate the fabrication of non-planar semiconductor devices having a reduced footprint compared to conventional planar-type semiconductor devices.

For example, nanosheet transistors, in contrast to conventional planar FETs, include a gate stack that wraps around the full perimeter of multiple stacked nanosheet channel regions for a reduced device footprint and improved control of channel current flow. Nanosheet transistors also enable full depletion in the nanosheet channel regions and reduce short-channel effects. Accordingly, nanosheets and nanowires are seen as feasible options for reducing the footprints of semiconductor transistor devices to 7 nanometers or less.

SUMMARY

Embodiments of the present disclosure relate to a method of manufacturing a nanosheet field effect transistor (FET) device. In particular, certain embodiments include forming a plurality of nanosheet stacks on a substrate, the nanosheet stacks including alternating layers of first type sacrificial layers and active semiconductor layers. The method includes forming the first type sacrificial layer on sidewalls of the nanosheet stacks, then forming a dielectric pillar between the sidewall portions of the first type sacrificial layers of adjacent nanosheet stacks, and then removing the first type sacrificial layer. The method also includes forming a PWFM layer in spaces formed by the removal of the first type sacrificial layer for a first one of the nanosheet stacks, and includes forming a NWFM layer in spaces formed by the removal of the first type sacrificial layer for an adjacent second one of the nanosheet stacks.

Other embodiments relate to a nanosheet FET device. The nanosheet FET device includes a substrate and a plurality of nanosheet stacks formed on the substrate. A first one of the nanosheet stacks includes alternating layers of PWFM layers and active semiconductor layers. A second adjacent one of the nanosheet stacks includes alternating layers of NWFM layers and the active semiconductor layers. The PWFM layers and NWFM layers are also formed on sidewalls of the respective nanosheet stacks. The nanosheet FET device also includes a dielectric pillar formed between the sidewall portions of the PWFM layers and NWFM layers of the adjacent nanosheet stacks, where the dielectric pillar extend from the substrate to a level above an upper surface of the nanosheet stacks.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1B:
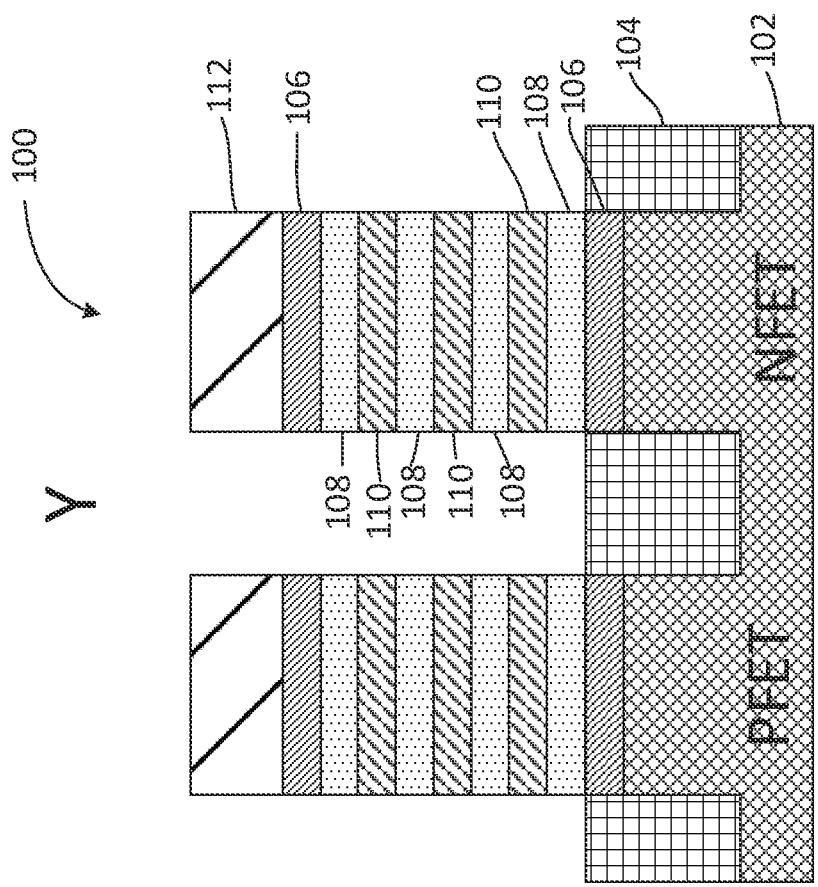
FIG. 1B depicts a cross-sectional view of the semiconductor nanosheet device of FIG. 1A taken along line Y of FIG. 1A, according to embodiments.

The present disclosure describes horizontally stacked gate-all-around (GAA) nanosheet structures (e.g., nanosheet field effect transistor (FET) devices) and methods of manufacturing the nanosheet structures. In particular, the present disclosure describes nanosheet FET devices with improved negative FET (NFET) to positive FET (PFET) (i.e., N-2-P) boundaries.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, semiconductor nanosheet devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Figure 1A:
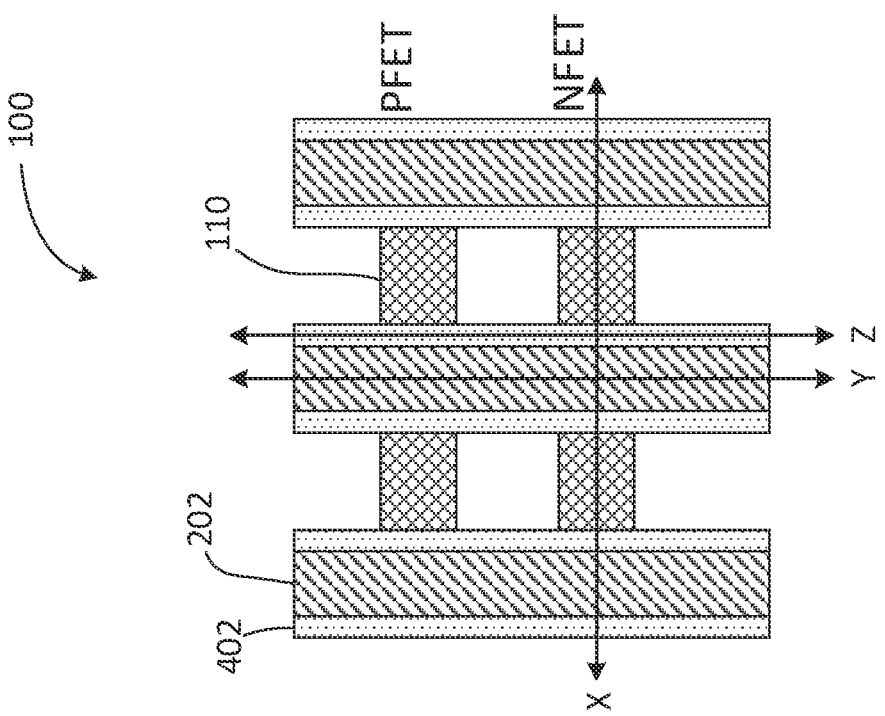
FIG. 1A depicts a top view of a semiconductor nanosheet device at an intermediate stage of a semiconductor fabrication process flow, according to embodiments.

Referring now to the drawings in which like numerals represent the same or similar elements and initially to FIG. 1A, a top down view of a semiconductor nanosheet device 100 is shown at an intermediate stage of the manufacturing process. As shown in FIG. 1A, several cut lines X, Y and Z are illustrated, and they will used herein to describe cross-sectional views of the semiconductor nanosheet device 100 at several stages of the manufacturing process from these different viewpoints. The semiconductor nanosheet device 100 includes a silicon based substrate (see, FIG. 1B, element 102) including a p-type semiconductor field effect transistor (PFET) region and an n-type semiconductor field effect transistor (NFET) region. Thus, in certain embodiments, the silicon based substrate 102 is doped in different areas with different materials to form the PFET and NFET regions. The device includes a nanosheet stack 150 (see, FIG. 2A), which will be described in further detail with reference to FIG. 1B. The semiconductor nanosheet device 100 shown in FIG. 1A also includes a dummy gate 202. This dummy gate 202 is later removed, as further discussed below with reference to FIGS. 8A and 8B.

Referring now to FIG. 1B, this figure shows a cross-sectional view of the semiconductor nanosheet device 100 of FIG. 1A taken along the Y line at an intermediate stage of the manufacturing process. As described above with respect to FIG. 1A, the semiconductor nanosheet device 100 includes a silicon based substrate 102 having PFET and NFET regions. In certain embodiments, a multi-layer nanosheet stack 150 (see also, FIG. 2A) is formed that includes a first type sacrificial layer 106, followed by the formation of alternating layers of a second type sacrificial layer 108 and an active semiconductor layer 110, followed by the formation of another first type sacrificial layer 106. The first type sacrificial layer 106 is formed directly on an upper surface of the substrate 102. In an example, the first type sacrificial layer 106 is composed of 65% silicon-germanium (SiGe65). Then, a second type sacrificial layer 108 is formed on an upper surface of the first type sacrificial layer 106. In an example, the second type sacrificial layer 108 is composed of 30% silicon-germanium (SiGe30). Next, an active semiconductor layer 110 is formed on an upper surface of the second type sacrificial layer 108. In an example, the active semiconductor layer 110 is composed of silicon. Several additional layers of the second type sacrificial layer 108 and the active semiconductor layer 110 are alternately formed. In the example illustrated in FIG. 1B, there are a total of four second type sacrificial layers 108 and three active semiconductor layers 110 that are alternately formed. However, it should be appreciated that any suitable number of alternating layers may be formed. Another first type sacrificial layer 106 is formed on an upper surface of the topmost second type sacrificial layer 108.

The first type sacrificial layers 106 are composed of a first semiconductor material, the second type sacrificial layers 108 are composed of a second semiconductor material, and the active semiconductor layers 110 are composed of a third semiconductor material, where the first, second and third semiconductor materials are different from each other. For example, the first type sacrificial layers 106 are composed of 65% silicon-germanium (SiGe65), the second type sacrificial layers 108 are composed of 30% silicon-germanium (SiGe30), while the active semiconductor layers 110 are composed of silicon (Si). It should be appreciated that although the silicon-germanium concentrations described in the example above are 30% and 65%, the concentrations could be other amounts provided that there is a sufficient difference to allow for selective removal of the first type sacrificial layers 106 without removing the second type sacrificial layers 108 (i.e., selective to), as described in further detail below with respect to FIGS. 3A, 3B and 3C.

In certain embodiments, the first type sacrificial layers 106 and the second type sacrificial layers 108 have a vertical thickness ranging, for example, from approximately 3 nm to approximately 20 nm. In certain embodiments, the active semiconductor layers 110 have a vertical thickness ranging, for example, from approximately 3 nm to approximately 10 nm. Although nine total layers are illustrated, it should be appreciated that the nanosheet stack 150 can include any suitable number of layers. Although the range of 3-20 nm is cited as an example range of thickness, other thickness of these layers may be used.

In certain embodiments, it may be desirable to have a small vertical spacing (VSP) between adjacent nanosheet layers in a stack of nanosheets to reduce the parasitic capacitance associated with the HNS-FET, and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack to be subsequently formed in the spaces therebetween. A gate stack generally includes a work function metal (WFM) that sets the threshold voltage (Vt) of the device, a κ gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets.

In FIG. 1B, multiple epitaxial growth processes can be performed to form the first type sacrificial layers 106, the second type sacrificial layers 108, and the active semiconductor layers 110. To achieve a SiGe65 first type sacrificial layer 106 directly on the upper surface of the substrate 102, for example, a SiGe65 layer is first epitaxially grown on an upper surface of the Si substrate or over an initial silicon-on-insulator (SOI) layer (not shown) followed by SiGe condensation. In this manner, a single initial SiGe65 first type sacrificial layer 106 is formed on an upper surface of the substrate 102 as illustrated in FIG. 1B. Subsequent to forming the initial SiGe65 first type sacrificial layer 106, a second type sacrificial layer 108 of SiGe30 is formed on an upper surface of the first type sacrificial layer 106. Then, a first active semiconductor layer 110 is epitaxially grown on an upper surface of the initial second type sacrificial layer 108. Thereafter, additional epitaxial growth processes can be performed to form the multi-layer structure as a nanosheet stack 150 (See, FIG. 2A) including an initial first type sacrificial layer 106, following by an alternating series of second type sacrificial layers 108 and active semiconductor layers 110, followed by a final first type sacrificial layer 106, as illustrated in FIG. 1B.

Referring again to FIG. 1B, following the formation of the nanosheet stack 150 (e.g., all of the layers of 106, 108 and 110), a hardmask cap 112 is formed for nanosheet patterning. The hardmask cap 112 can be composed of various nitride materials including, but not limited to, silicon nitride (SiN). The semiconductor nanosheet device 100 is then subjected to a fin etching process to expose portions of the substrate 102. The fin etching process is achieved, for example, using a lithography patterning process followed by directional reactive ion etch (RIE) process, which is capable of removing portions of the first type sacrificial layers 106, the second type sacrificial layers 108 and the active semiconductor layers 110 not covered by the hardmask cap 112. The RIE can use a boron-based chemistry or a chlorine-based chemistry, for example, which selectively recesses the exposed portions first type sacrificial layers 106, the second type sacrificial layers 108 and the active semiconductor layers 110 without attacking the substrate.

Following the nanosheet patterning process described above, shallow trench isolation (STI), also known as a box isolation technique, is performed on the semiconductor nanosheet device 100. In general, STI is an integrated circuit feature which prevents electric current leakage between adjacent semiconductor device components. STI is generally used on CMOS process technology nodes of 250 nanometers and smaller. In general, the STI process involves etching a pattern of trenches in the silicon substrate 102 and then depositing one or more dielectric materials (such as silicon dioxide) to fill the trenches and form the STI regions 104.

Figure 1D:
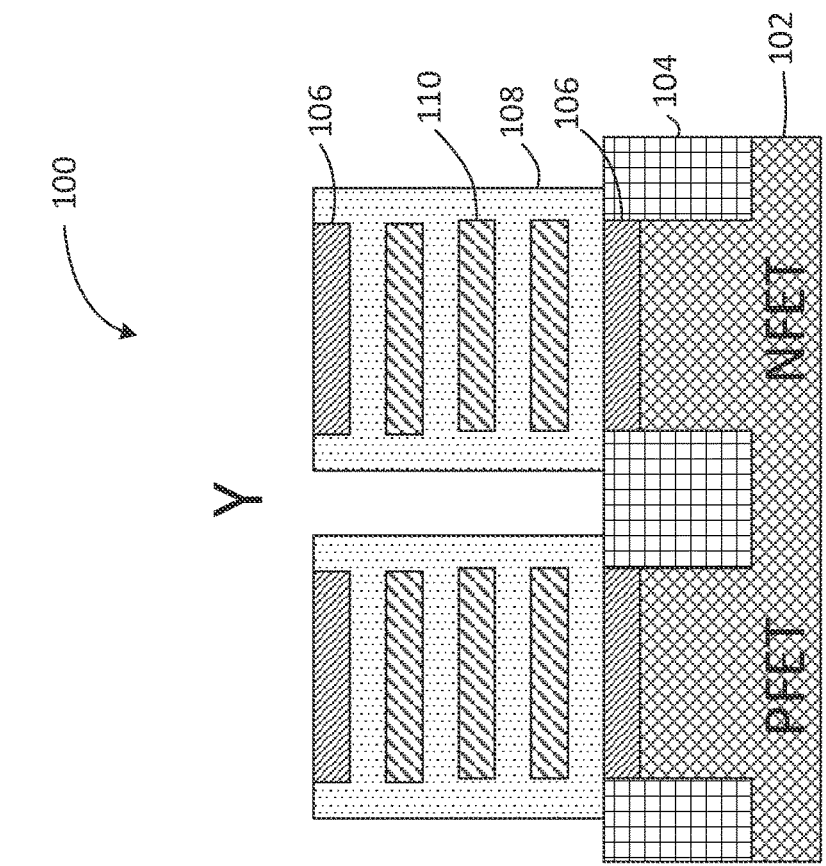
FIG. 1D depicts a cross-sectional view of the semiconductor nanosheet device of FIG. 1C taken along line Y of FIG. 1A after additional fabrication operations, according to embodiments.
Figure 1C:
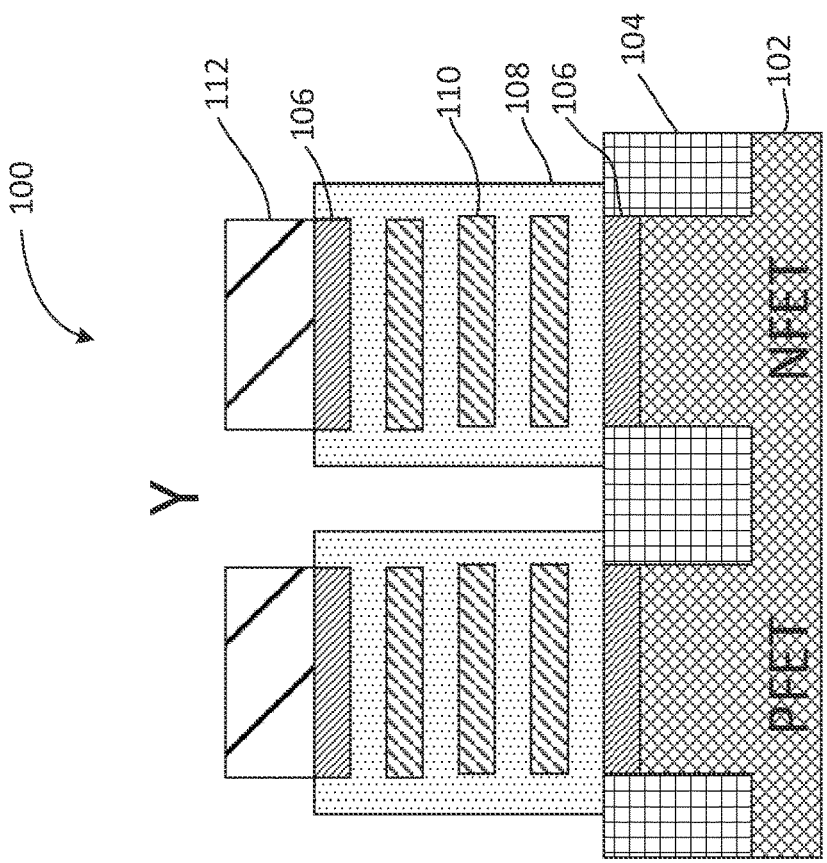
FIG. 1C depicts a cross-sectional view of the semiconductor nanosheet device of FIG. 1B taken along line Y of FIG. 1A after additional fabrication operations, according to embodiments.

Referring now to FIG. 1C, this figure depicts a cross-sectional view of the semiconductor nanosheet device 100 of FIG. 1B taken along line Y of FIG. 1A after additional fabrication operations, according to embodiments. As shown in FIG. 1C, an additional layer of the second type sacrificial layer 108 (e.g., SiGe30) is conformally deposited along the sidewalls of the previously formed second type sacrificial layers 108, the active semiconductor layers 110, and the final (i.e., the uppermost) first type sacrificial layer 106. In certain embodiments, the additional material of the second type sacrificial layer 108 covers a portion of the upper surfaces of STI regions 104. In certain embodiments, anisotropic reactive ion etching (RIE) is performed to remove the layer 108 from the horizontal surfaces.

Referring now to FIG. 1D, this figure depicts a cross-sectional view of semiconductor nanosheet device 100 of FIG. 1C taken along line Y of FIG. 1A after additional fabrication operations, according to embodiments. In particular, in FIG. 1D, the hardmask cap 112 is removed by any suitable method known by one of skill in the art. For example, a first direction RIE process or isotropic wet etch like hot phosphorus can be performed to remove the hardmask cap 112 and expose the underlying nanosheet stack 150.

Figure 2A:
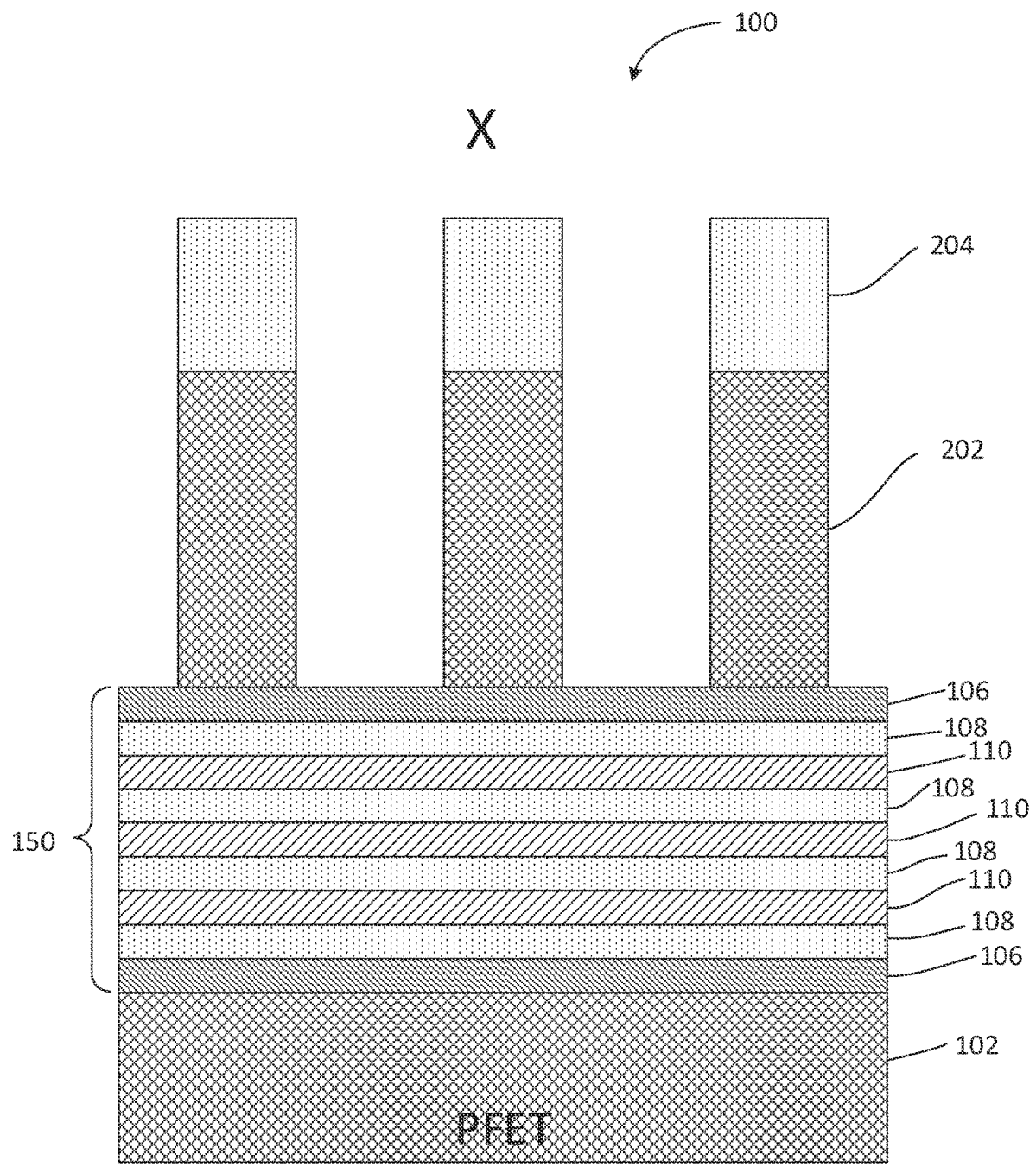
FIG. 2A depicts a cross-sectional view of the semiconductor nanosheet device of FIG. 1D taken along line X of FIG. 1A after additional fabrication operations, according to embodiments.
Figure 2B:
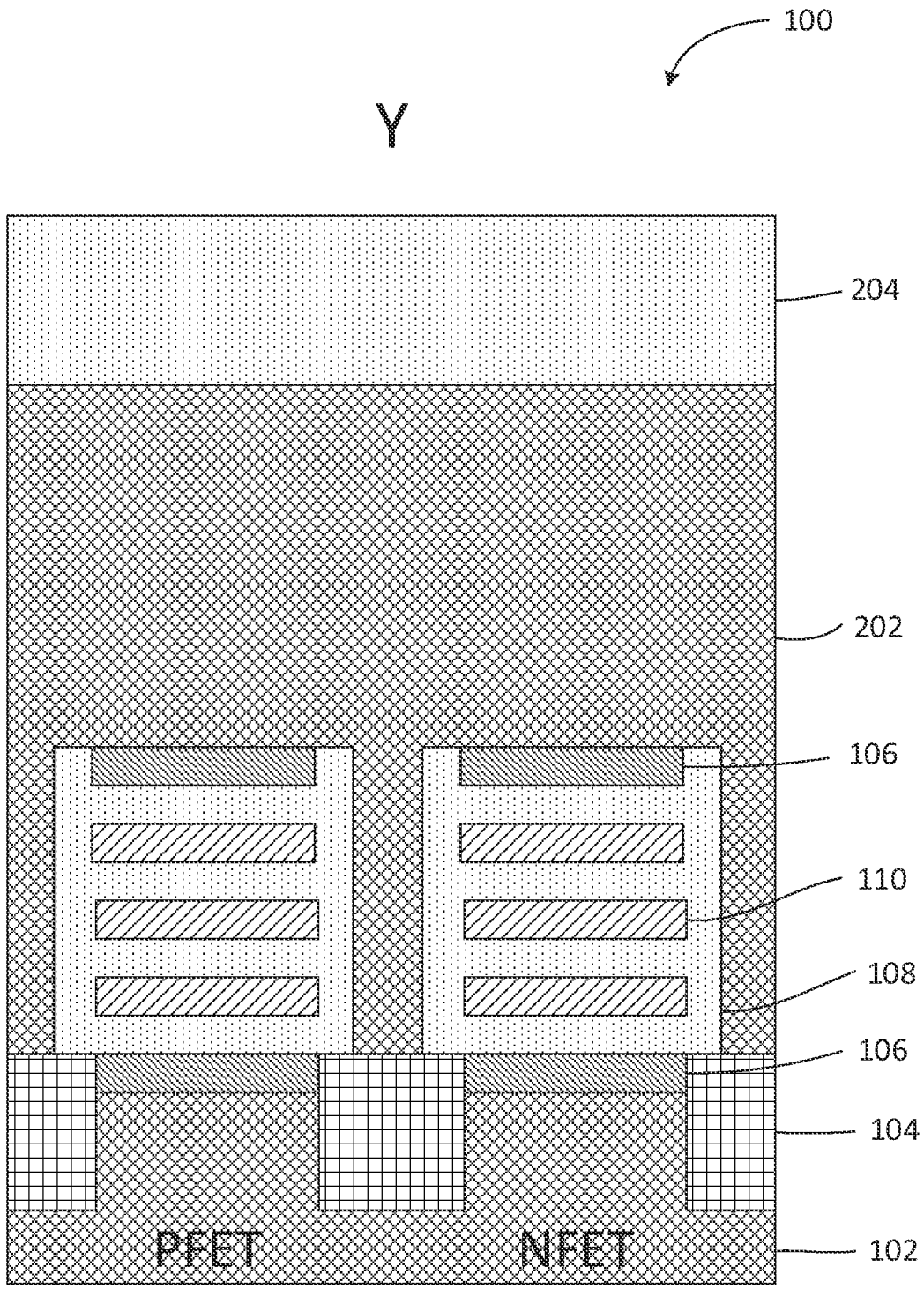
FIG. 2B depicts a cross-sectional view of the semiconductor nanosheet device of FIG. 1D taken along line Y of FIG. 1A after additional fabrication operations, according to embodiments.

Referring now to FIGS. 2A and 2B, these figures depict cross-sectional views of the semiconductor nanosheet device 100 of FIG. 1D taken along lines X and Y respectively, of FIG. 1A after additional fabrication operations, according to embodiments. In FIG. 2A, a dummy gate 202 is formed by any suitable deposition technique known by one of skill in the art. In one example, the dummy gate 202 is formed by depositing a thin $SiO_2$ layer, followed by depositing a layer of amorphous Si (a-Si). The dummy gate 202 is also shown in the top view of FIG. 1A. Following deposition of the dummy gate 202, a hardmask layer 204 is formed. After formation of the hardmask layer 204 pattern, lithography patterning and etching is performed to remove portions of the dummy gate 202 that are not covered by the hardmask layer 204. The removal of the dummy gate 202 is apparent in the cross-sectional view of FIG. 2A, but not in FIG. 2B. The removal of portions of the dummy gate 202 can also be seen in the top down view of FIG. 1A, where the X cut line passes through three portions of the dummy gate 202, and where the Y cut line does not have any portions of the dummy gate removed by the etching process. The dummy gate 202 is later removed, as discussed in detail below.

Figure 2C:
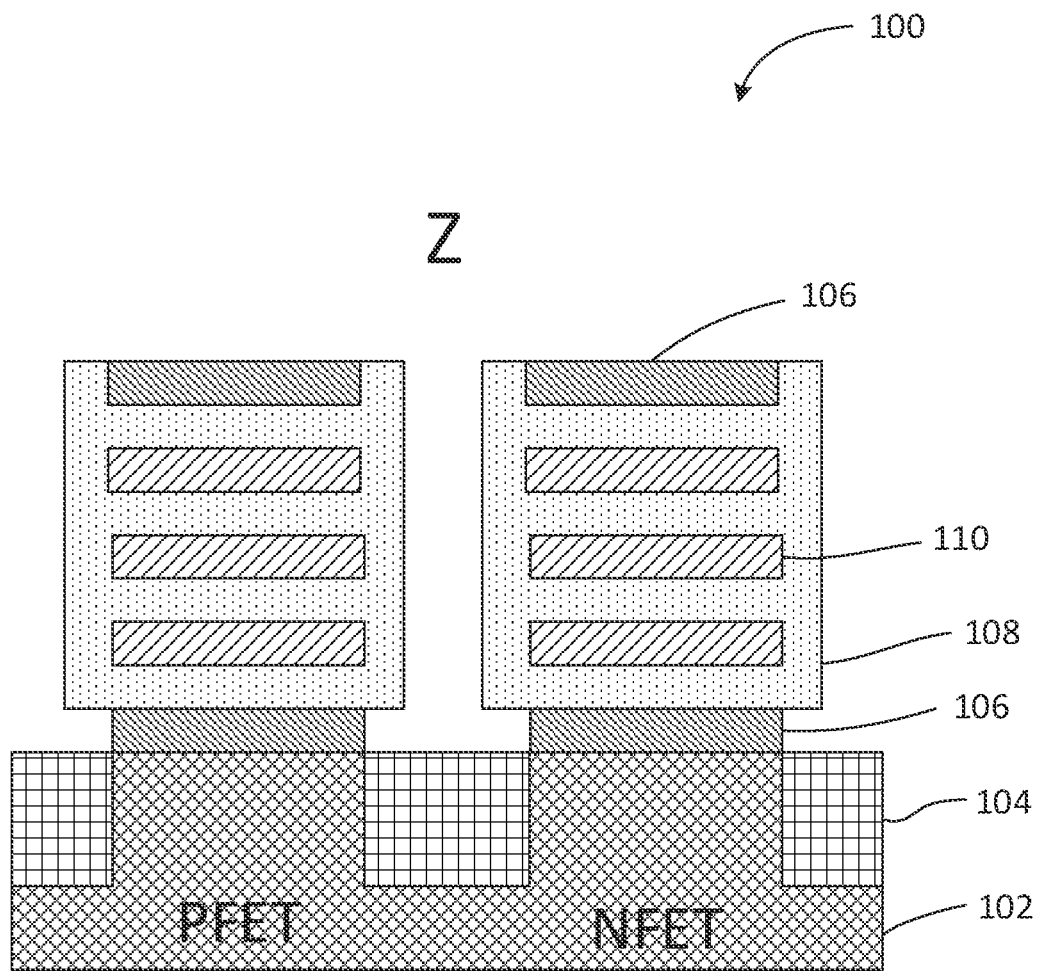
FIG. 2C depicts a cross-sectional view of the semiconductor nanosheet device of FIG. 1D taken along line Z of FIG. 1A after additional fabrication operations, according to embodiments.

Referring now to FIG. 2C, this figure depicts a cross-sectional view of the semiconductor nanosheet device of FIG. 1B taken along line Z of FIG. 1A after additional fabrication operations, according to embodiments. In FIG. 2C, portions of the STI regions 104 are recessed to expose sidewall portions of the lower first type sacrificial layer 106 (e.g., SiGe65). Due to the removal of a portion of the thickness of the STI regions 104, underside portions of the second type sacrificial layer 108 (e.g., SiGe30) are also exposed.

Figure 3A:
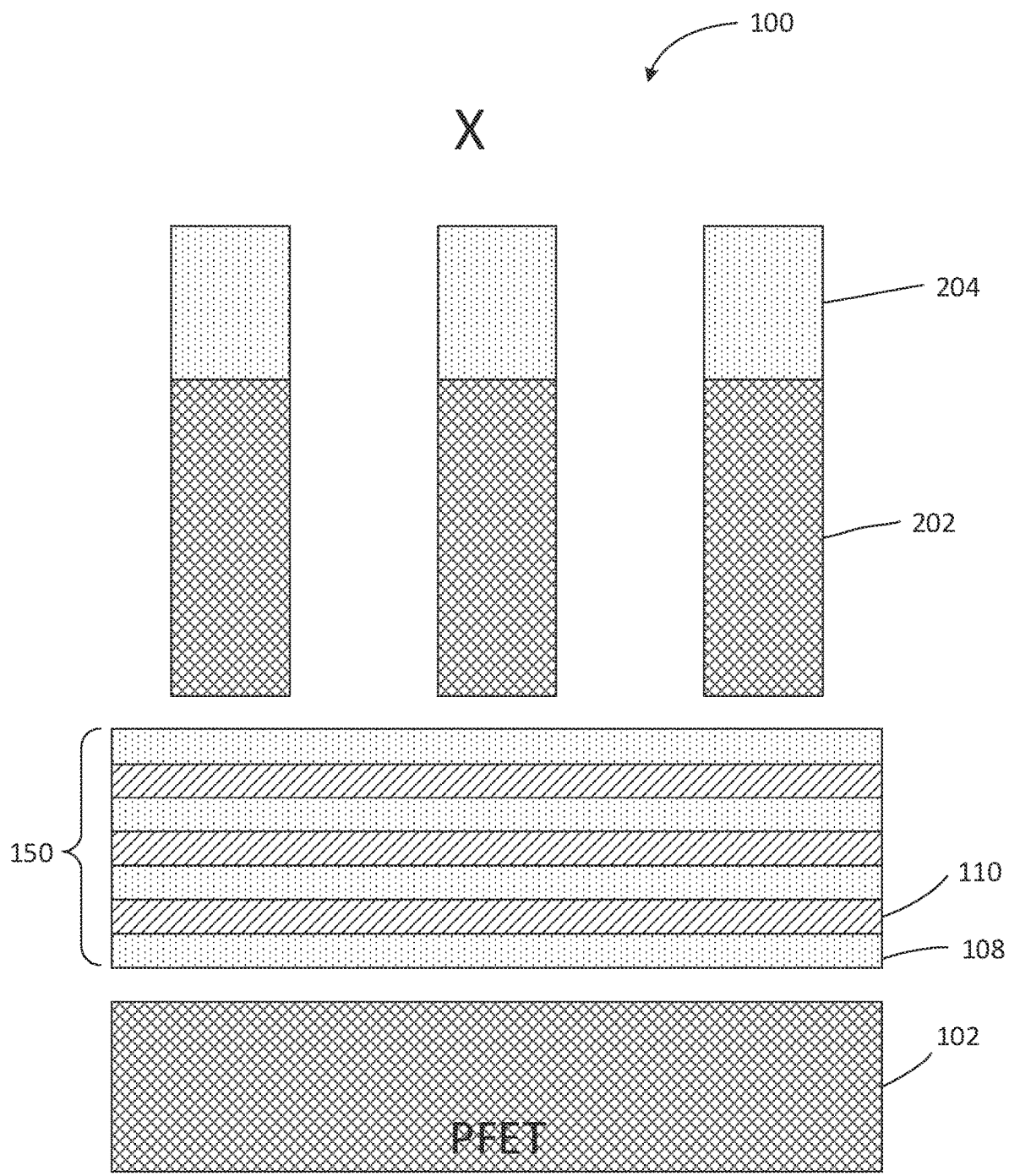
FIG. 3A depicts a cross-sectional view of the semiconductor nanosheet device of FIG. 2A taken along line X of FIG. 1A after additional fabrication operations, according to embodiments.

Referring now to FIG. 3A, this figure depicts a cross-sectional view of the semiconductor nanosheet device of FIG. 2A taken along line X of FIG. 1A after additional fabrication operations, according to embodiments. In particular, in this stage of the manufacturing process, the first type sacrificial layer 106 has been removed. Thus, as shown in FIG. 3A, there is a void space between the substrate 102 and the lowermost second type sacrificial layer 108, and there is also a void space between the uppermost second type sacrificial layer 108 and the dummy gate 202.

Figure 3B:
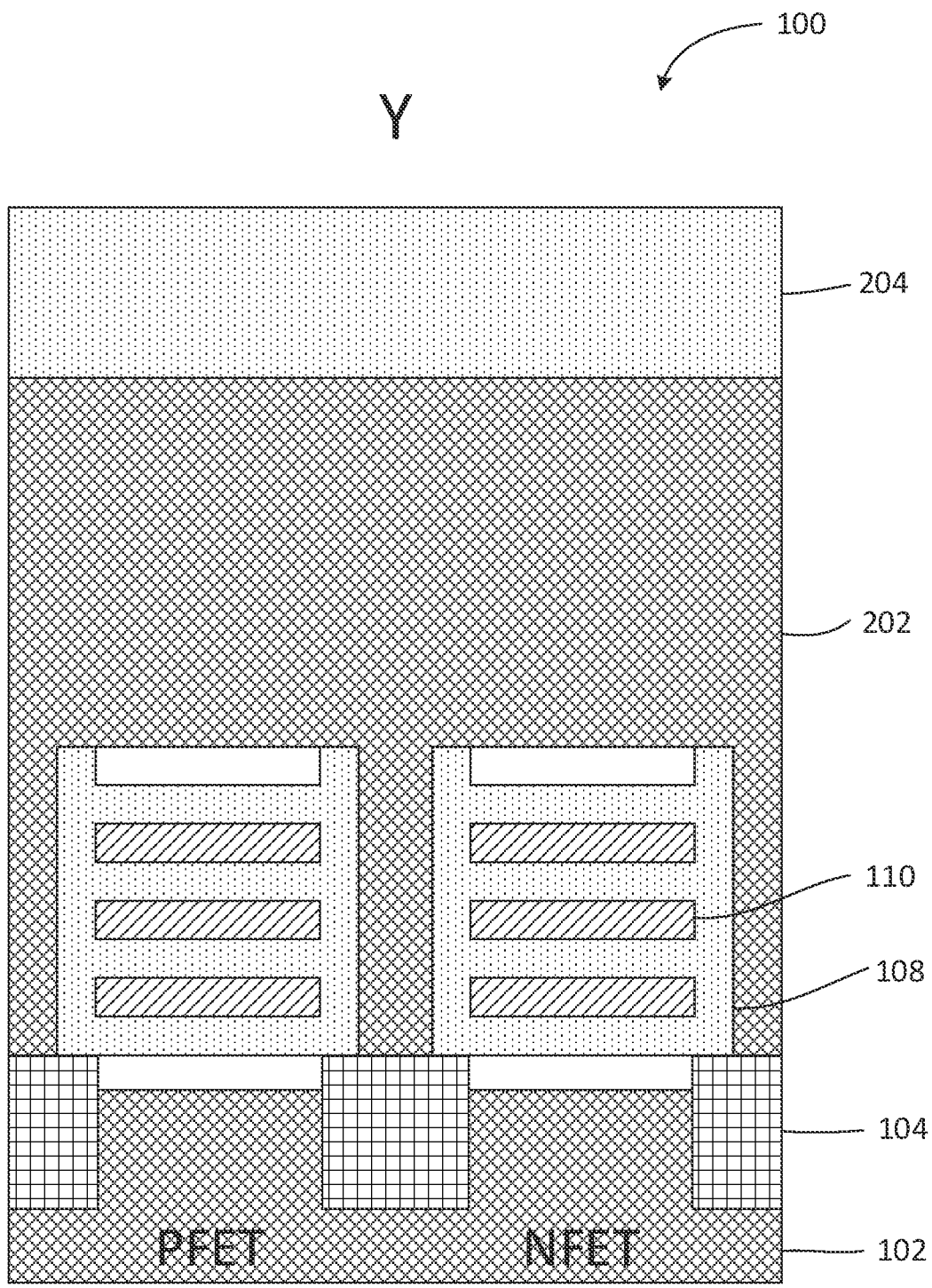
FIG. 3B depicts a cross-sectional view of the semiconductor nanosheet device of FIG. 2B taken along line Y of FIG. 1A after additional fabrication operations, according to embodiments.

Referring now to FIG. 3B, this figure depicts a cross-sectional view of the semiconductor nanosheet device 100 taken along line Y of FIG. 1A at the same manufacturing stage as FIG. 3A. In this view, after the first type sacrificial layer 106 has been removed, there are also void spaces between the substrate 102 and the lowermost second type sacrificial layer 108, and there are also void spaces between the uppermost second type sacrificial layer 108 and dummy gate 202. It should be understood that after removal of the first type sacrificial layer 106, the multi-layer nanosheet stack 150 (see also, FIG. 3A) is physically supported by the STI region 104 and the dummy gate 202 (i.e., despite the void spaces that have been created through removal of the first type sacrificial layer 106).

Figure 3C:
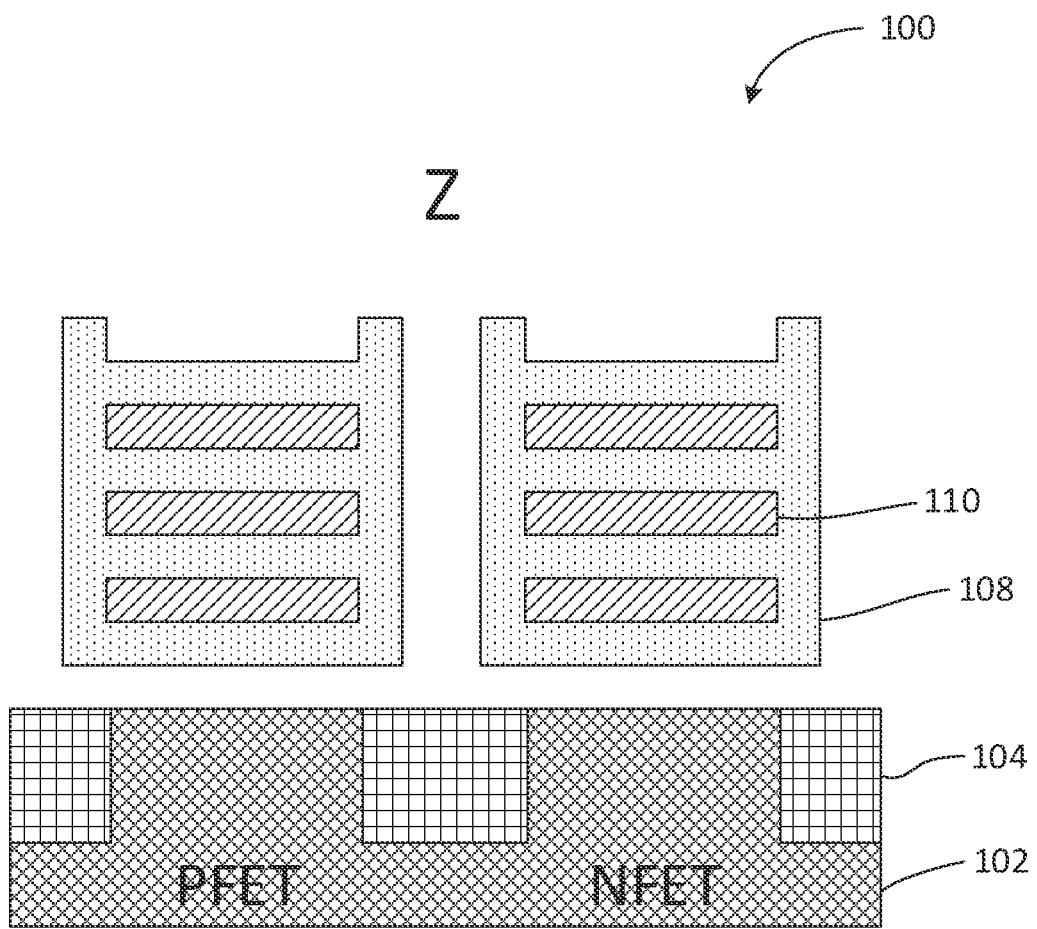
FIG. 3C depicts a cross-sectional view of the semiconductor nanosheet device of FIG. 2C taken along line Z of FIG. 1A after additional fabrication operations, according to embodiments.

Referring now to FIG. 3C, this figure depicts a cross-sectional view of the semiconductor nanosheet device 100 taken along line Z of FIG. 1A at the same manufacturing stage as in FIGS. 3A and 3B. As discussed above, at this stage of the manufacturing process the first type sacrificial layer 106 has been removed. Thus, as shown in FIG. 3C, there is a void space between the substrate 102 and the lowermost second type sacrificial layer 108, and there is also a void space between the adjacent nanosheet stacks 150 (see also, FIG. 2A).

Figure 4A:
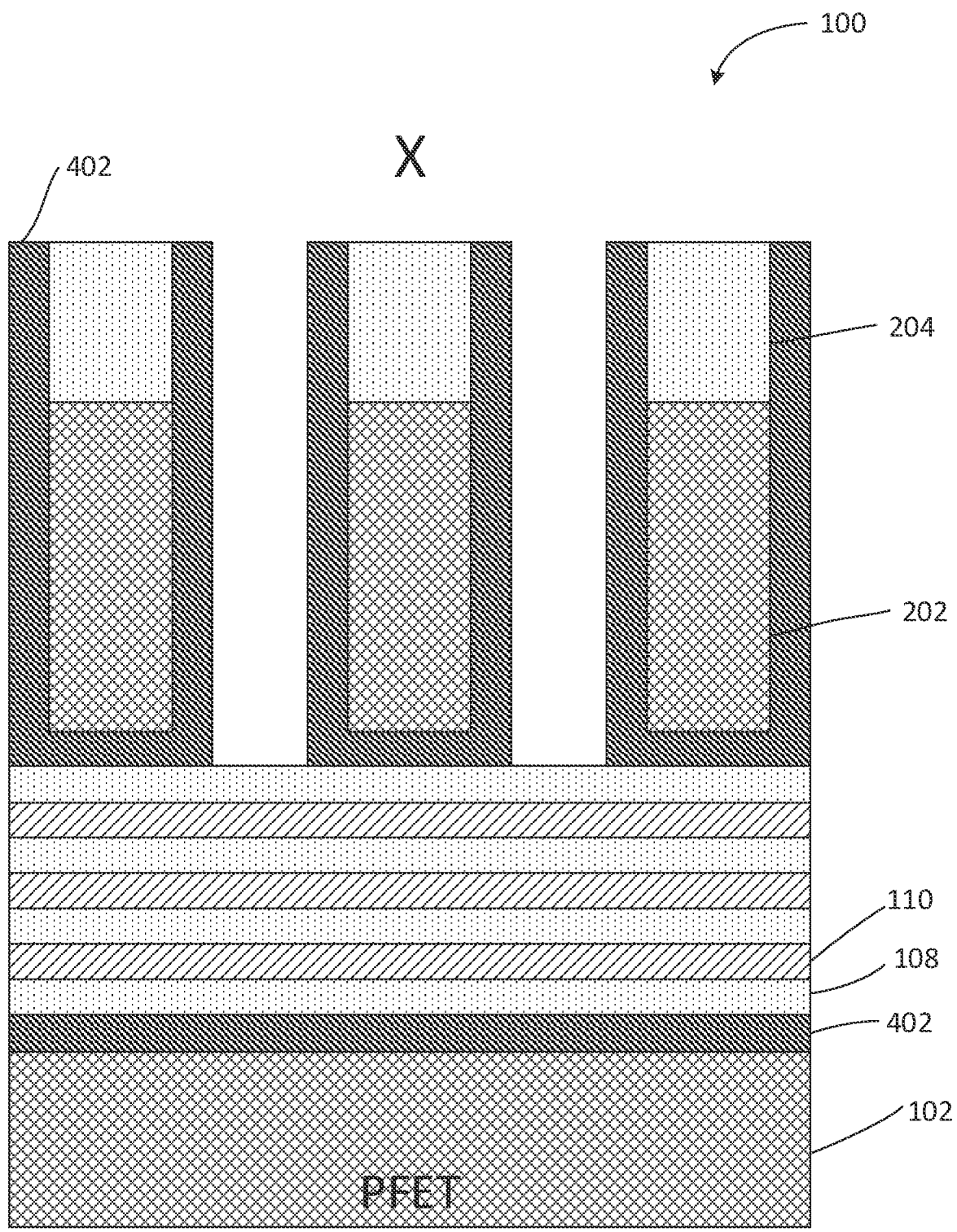
FIG. 4A depicts a cross-sectional view of the semiconductor nanosheet device of FIG. 3A taken along line X of FIG. 1A after additional fabrication operations, according to embodiments.
Figure 4B:
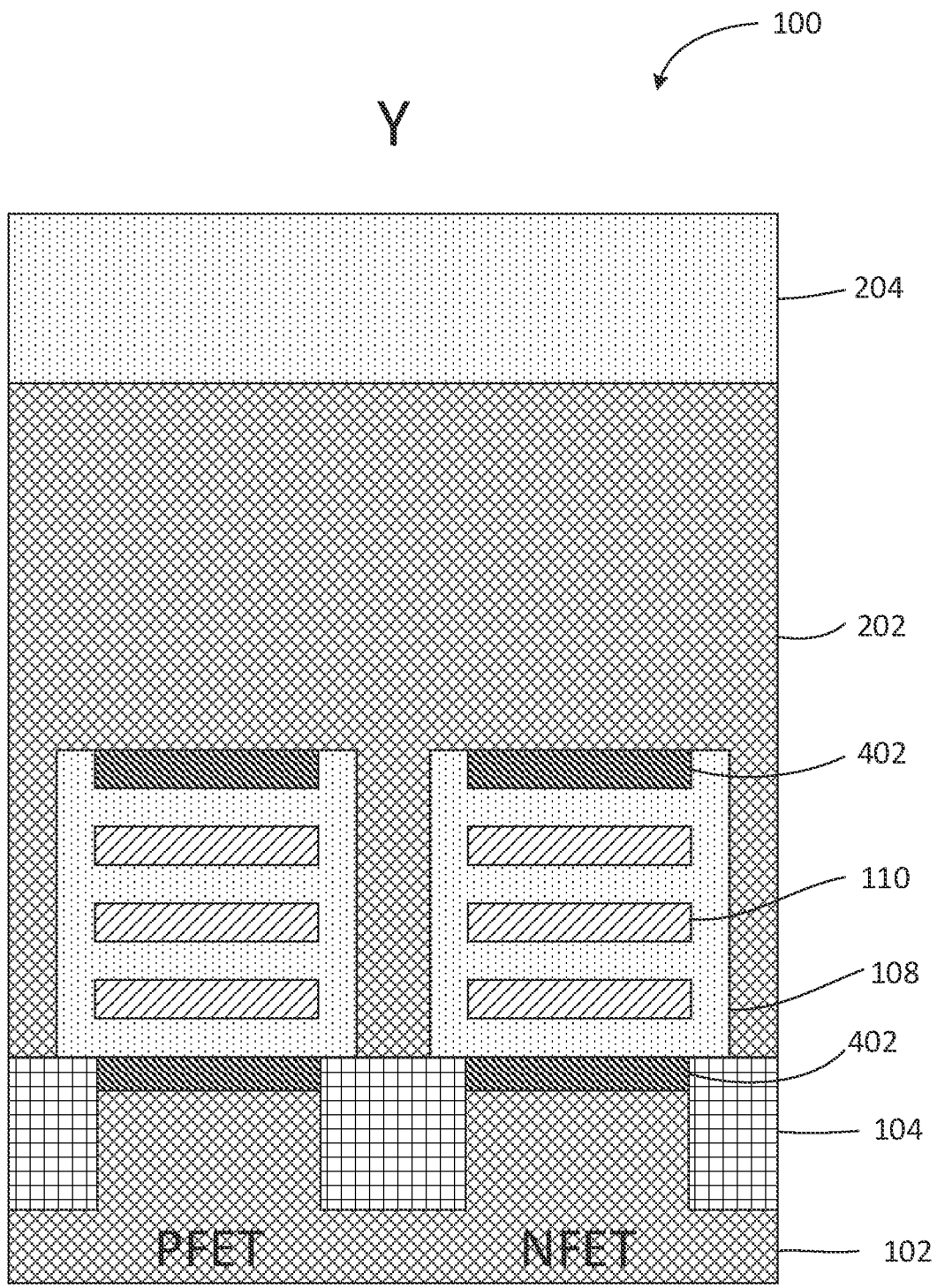
FIG. 4B depicts a cross-sectional view of the semiconductor nanosheet device of FIG. 3B taken along line Y of FIG. 1A after additional fabrication operations, according to embodiments.
Figure 4C:
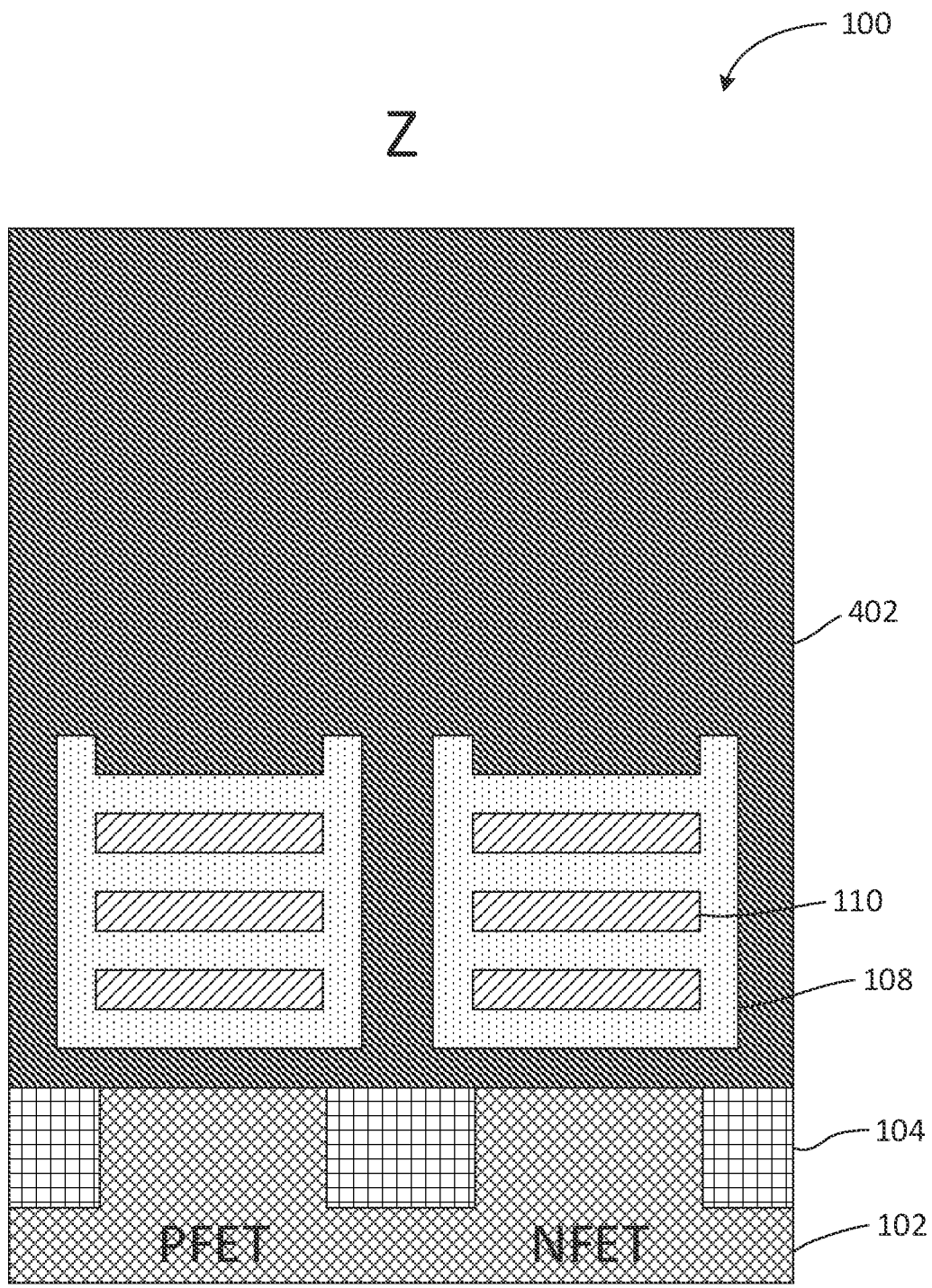
FIG. 4C depicts a cross-sectional view of the semiconductor nanosheet device of FIG. 3C taken along line Z of FIG. 1A after additional fabrication operations, according to embodiments.

Referring now to FIGS. 4A, 4B and 4C, these figures depict cross-sectional views of the semiconductor nanosheet device 100 of FIGS. 3A, 3B and 3C taken along cut lines X, Y and Z of FIG. 1A, respectively, after additional fabrication operations, according to embodiments. In particular, a spacer 402 is formed (see also, FIG. 1A). The spacer 402 has dual functions. In certain locations it simply functions as a spacer to allow for subsequent semiconductor processing steps. In other locations the spacer 402 layer also functions as an isolation layer to prevent electrical contact between the semiconductor material of the second type sacrificial layer 108 and the silicon material of the substrate 102. Prior to the removal of the first type sacrificial layer 106, there was an issue in that the semiconductor material in the first type sacrificial layer 106 directly contacted both the semiconductor material of the substrate 102 and the semiconductor material of the second type sacrificial layer 108. This spacer 402 fills in the previously created void spaces caused by the removal of the first type sacrificial layer 106, and thus prevents electrical contact of the gate electrode and the nanosheet stack 150 with the substrate 102 by replacing the semiconductor material of the first type sacrificial layer 106 with an insulating material (i.e., dielectric material). In certain embodiments, the material of the spacer 402 is a dielectric material such as SiN, SiO, SiBCN, SiOCN, SiCO, etc. After the spacer 402 liner is conformally deposited, an anisotropic etch is applied to remove the spacer from the exposed horizontal surfaces.

Figure 5A:
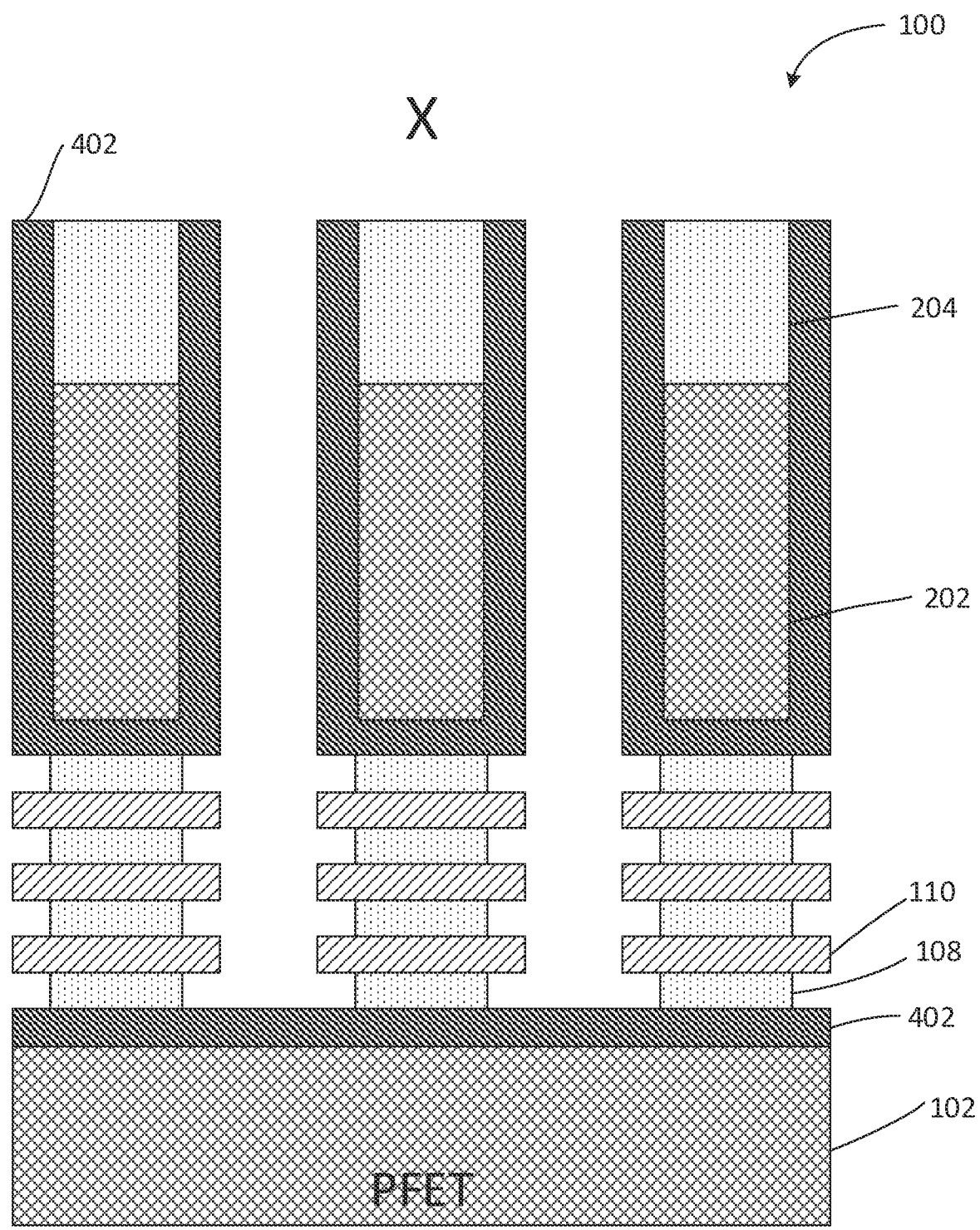
FIG. 5A depicts a cross-sectional view of the semiconductor nanosheet device of FIG. 4A taken along line X of FIG. 1A after additional fabrication operations, according to embodiments.
Figure 5B:
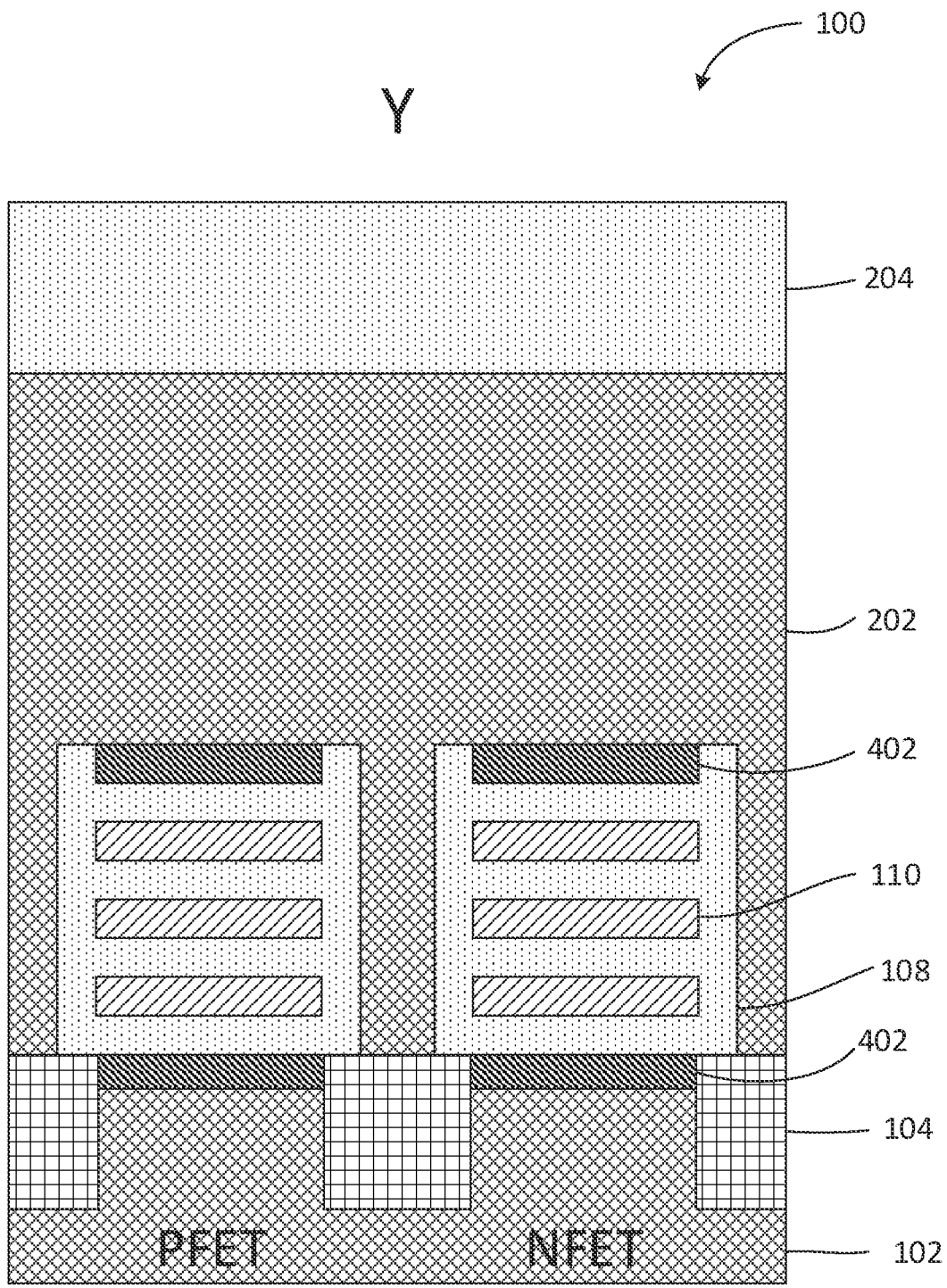
FIG. 5B depicts a cross-sectional view of the semiconductor nanosheet device of FIG. 4B taken along line Y of FIG. 1A after additional fabrication operations, according to embodiments.
Figure 5C:
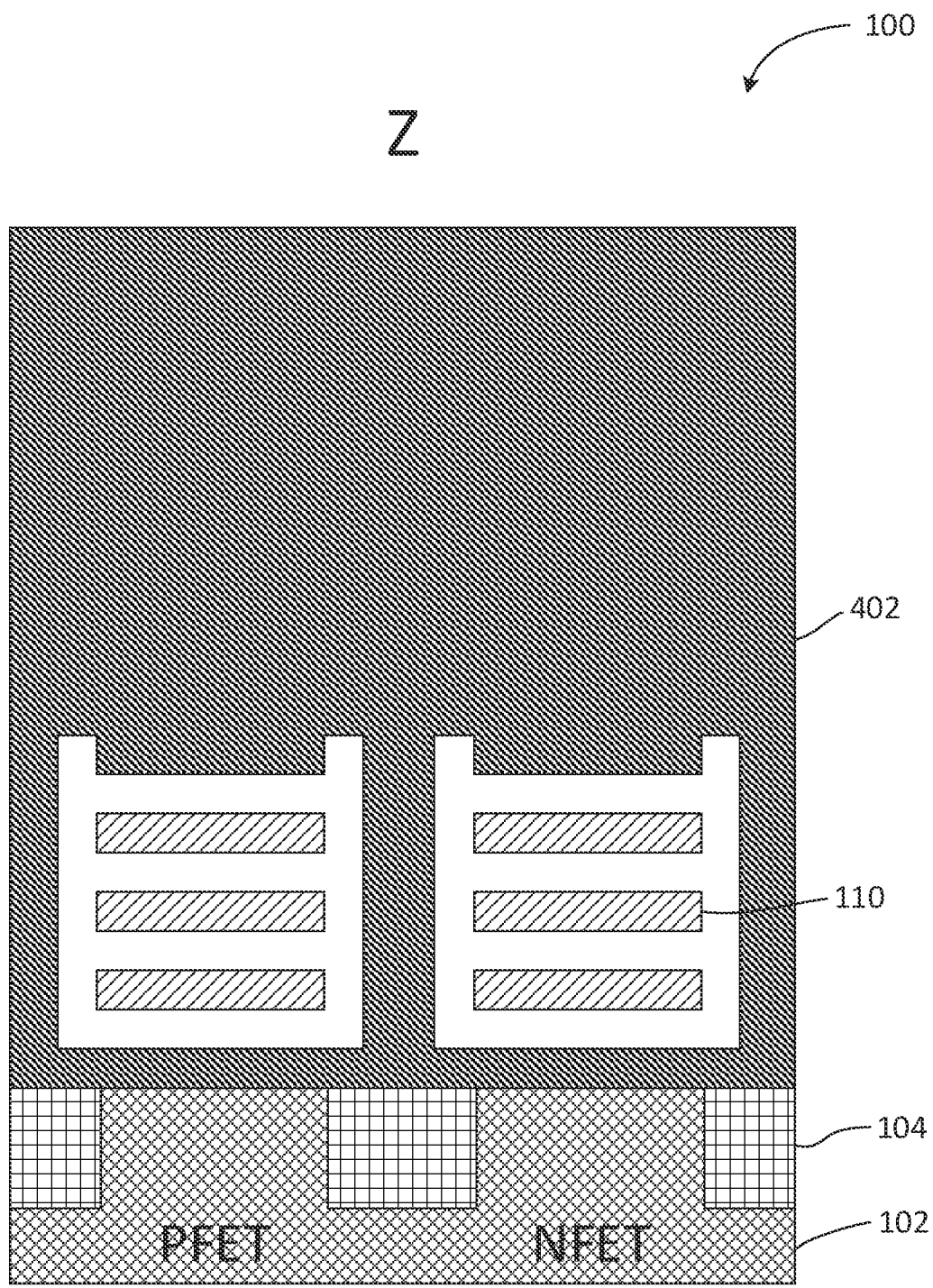
FIG. 5C depicts a cross-sectional view of the semiconductor nanosheet device of FIG. 4C taken along line Z of FIG. 1A after additional fabrication operations, according to embodiments.

Referring now to FIGS. 5A, 5B and 5C, these figures depict cross-sectional views of the semiconductor nanosheet device 100 of FIGS. 4A, 4B and 4B taken along cut lines X, Y and Z of FIG. 1A, respectively, after additional fabrication operations, according to embodiments. First, as shown in FIG. 5A, portions of the nanosheet stack 150 between the spacer 402 have been etched away (i.e., recessed) to expose sidewalls of the nanosheet stack 150 that initially corresponded to the sidewalls of spacer 402.

In a subsequent manufacturing step, as shown in FIGS. 5A and 5C, portions of the second type sacrificial layer 108 have been selectively etched back. In FIG. 5C, at this location, all of the second type sacrificial layer 108 material has been removed. In FIG. 5B, at this location, none of the second type sacrificial layer 108 material has been removed. However, as shown in FIG. 5A, only portions of the second type sacrificial layer 108 material have been removed, thus leaving indentations in the second type sacrificial layer 108. Thus, as shown in FIG. 5A the widths of the second type sacrificial layers 108 are less than the widths of the active semiconductor layers 110. Thus, selective etching is performed to remove a portion of the SiGe30 material of the second type sacrificial layers 108, while preventing or minimizing removal of the Si material of the active semiconductor layers 110 shown in FIG. 5A and the amorphous Si (a-Si) of the dummy gate 202 shown in FIG. 5B. In one example, the selective etching is performed with HCl.

Figure 6A:
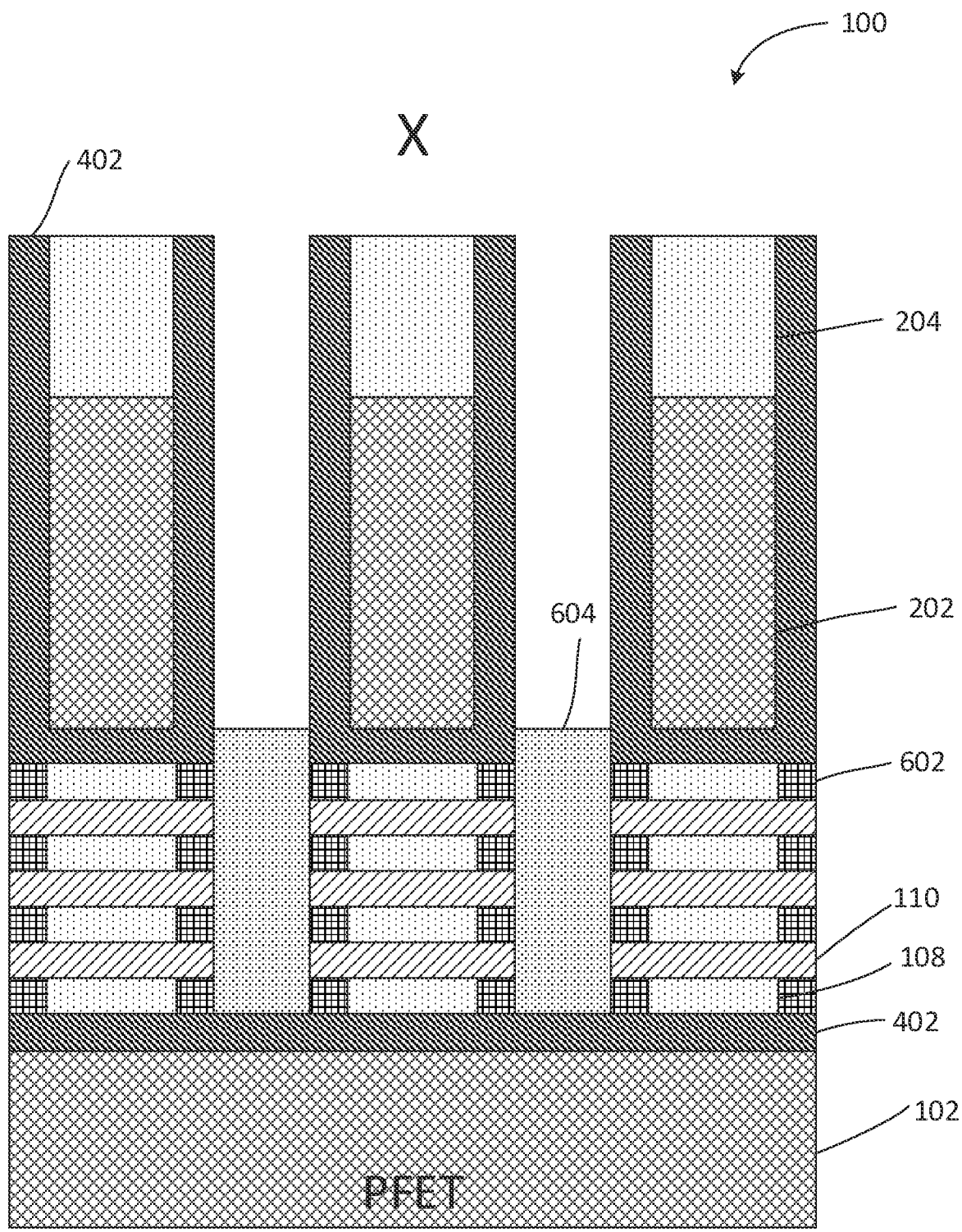
FIG. 6A depicts a cross-sectional view of the semiconductor nanosheet device of FIG. 5A taken along line X of FIG. 1A after additional fabrication operations, according to embodiments.
Figure 6B:
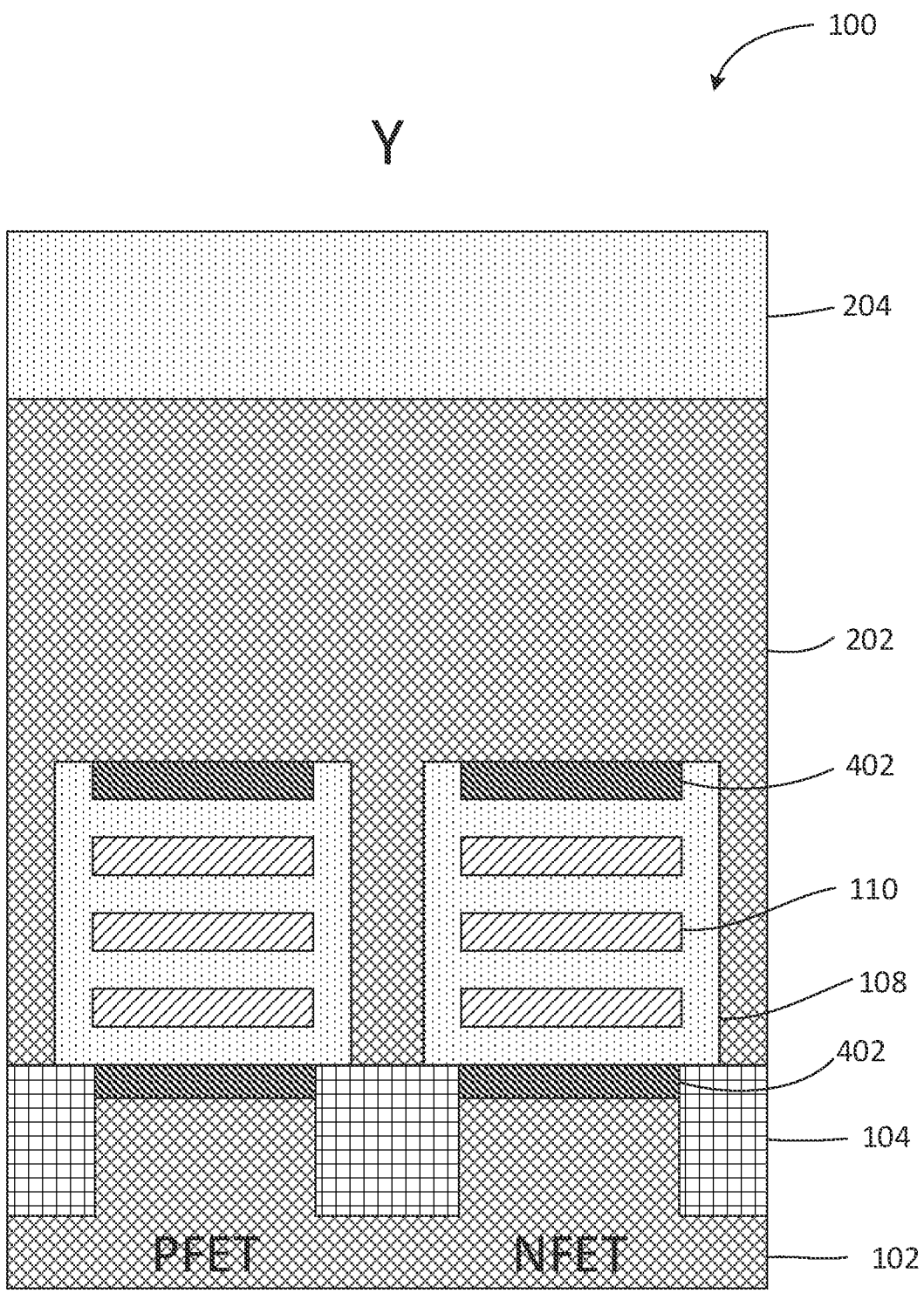
FIG. 6B depicts a cross-sectional view of the semiconductor nanosheet device of FIG. 5B taken along line Y of FIG. 1A after additional fabrication operations, according to embodiments.
Figure 6C:
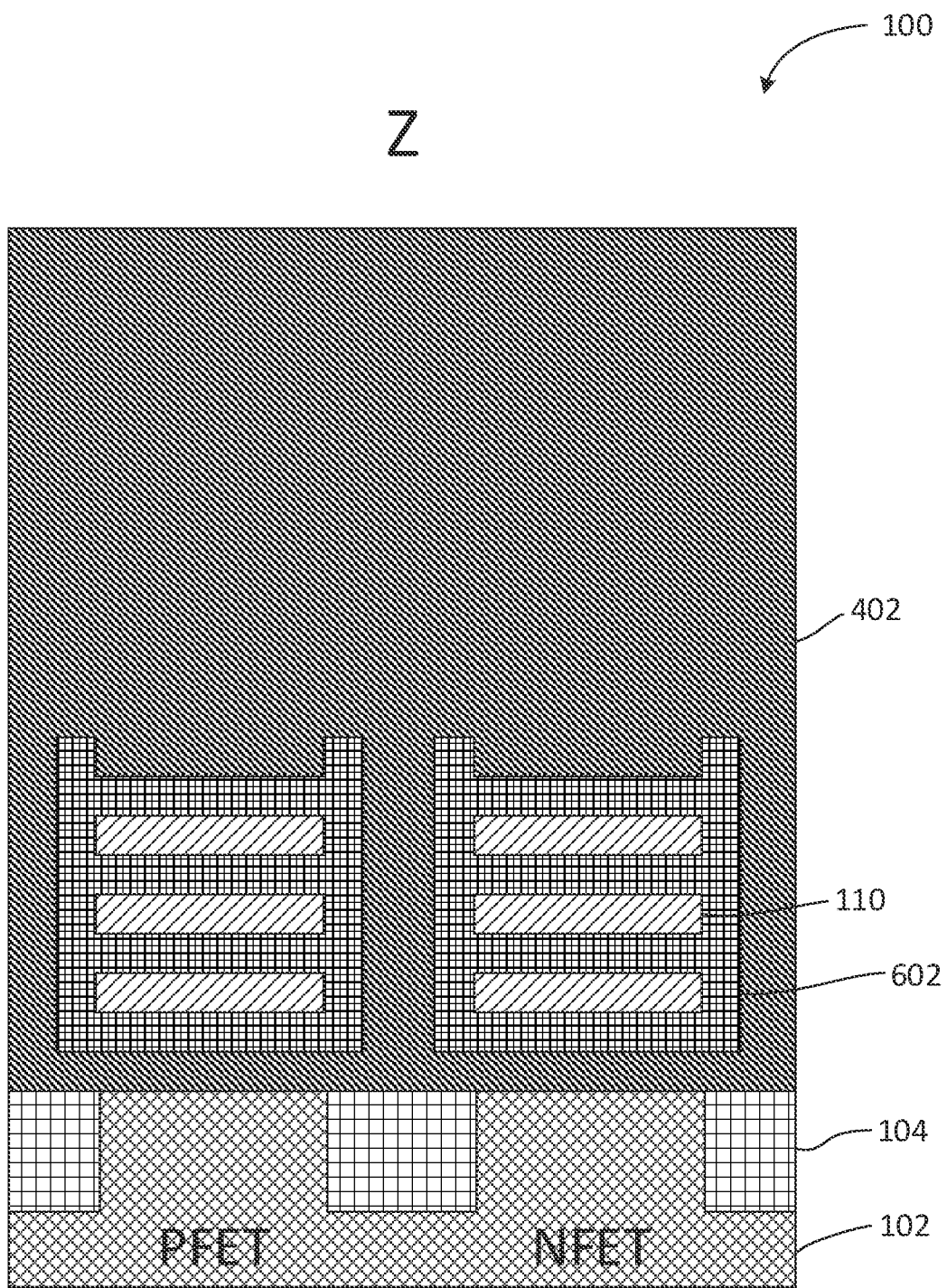
FIG. 6C depicts a cross-sectional view of the semiconductor nanosheet device of FIG. 5C taken along line Z of FIG. 1A after additional fabrication operations, according to embodiments.

Referring now to FIGS. 6A, 6B and 6C, these figures depict cross-sectional views of the semiconductor nanosheet device 100 of FIGS. 5A, 5B and 5C taken along cut lines X, Y and Z of FIG. 1A, respectively, after additional fabrication operations, according to embodiments. In a first manufacturing step, an inner spacer 602 is formed to fill the indentations that were formed during the removal of the SiGe30 material of the second type sacrificial layers 108, discussed above with respect to FIG. 5A. The inner spacer 602 is formed of a suitable dielectric material. It can also be seen in FIG. 6C that the inner spacer 602 is formed to completely surround the active semiconductor layers 110. FIG. 6B remains unchanged with respect to FIG. 5B. In certain embodiments, an isotropic etching process is performed on the newly formed sidewalls of the inner spacer 602 to remove the inner spacer liner everywhere except for in the indentation region.

In a further manufacturing step, as shown in FIG. 6A, the semiconductor nanosheet device 100 is illustrated following an epitaxy process. Various well-known epitaxy processes can be used to grow a highly-conductive material such as Si, SiGe, or germanium (Ge), for example, from the side surfaces of the active semiconductor layers 110, the upper surfaces of the spacer 402, and the side surfaces of the inner spacer 602. The epitaxy process used to grow a S/D epitaxial structure 604 can be carried out using various epitaxy techniques including, but not limited to, vapor phase epitaxy (VPE), molecular beam epitaxy (MBE) or liquid phase epitaxy (LPE) with a gaseous or liquid precursor, such as, for example, silicon tetrachloride. The S/D epitaxial structure 604 can also be doped. For example, when fabricating a p-type semiconductor device (e.g., a PFET), the epitaxial grown material can be composed of a SiGe material doped with boron (B). When fabricating an n-type semiconductor device (e.g., a NFET), the epitaxial grown material can be composed of a Si material doped with phosphorus (P) or arsenic (As).

In certain embodiments, the epitaxy process can be performed so that the upper surface of the S/D epitaxial structure 604 is flush (i.e., co-planar) with respect to the interface between the lower surface of the dummy gate 202 and the spacer 402, as shown in FIG. 6A. In other embodiments, the upper surface of the S/D epitaxial structure 604 can extend beyond the interface between the lower surface of the dummy gate 202 and the spacer 402. In one or more embodiments, an anneal process can be performed to activate any dopants implanted in the S/D epitaxial structure 604.

Figure 7A:
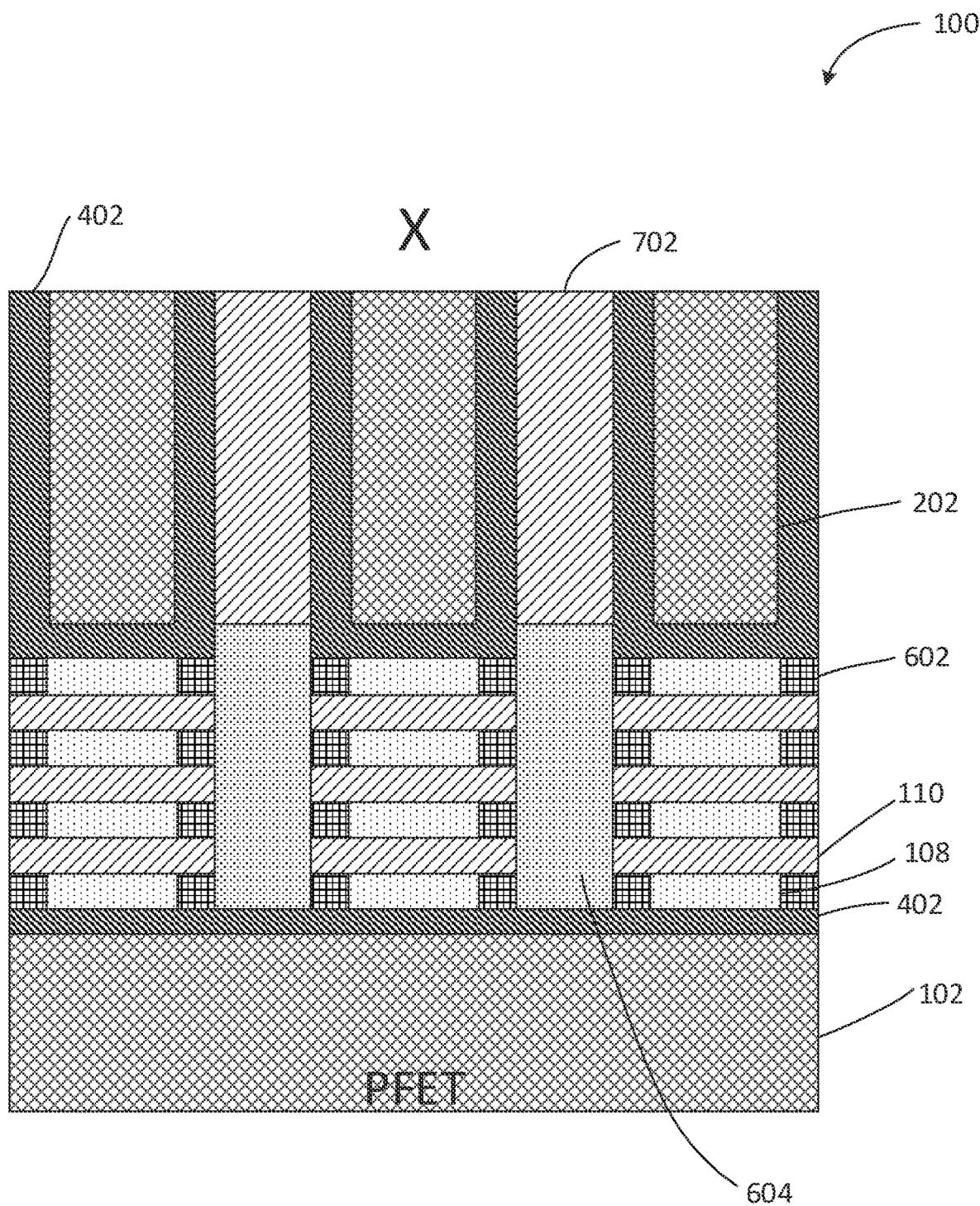
FIG. 7A depicts a cross-sectional view of the semiconductor nanosheet device of FIG. 6A taken along line X of FIG. 1A after additional fabrication operations, according to embodiments.
Figure 7B:
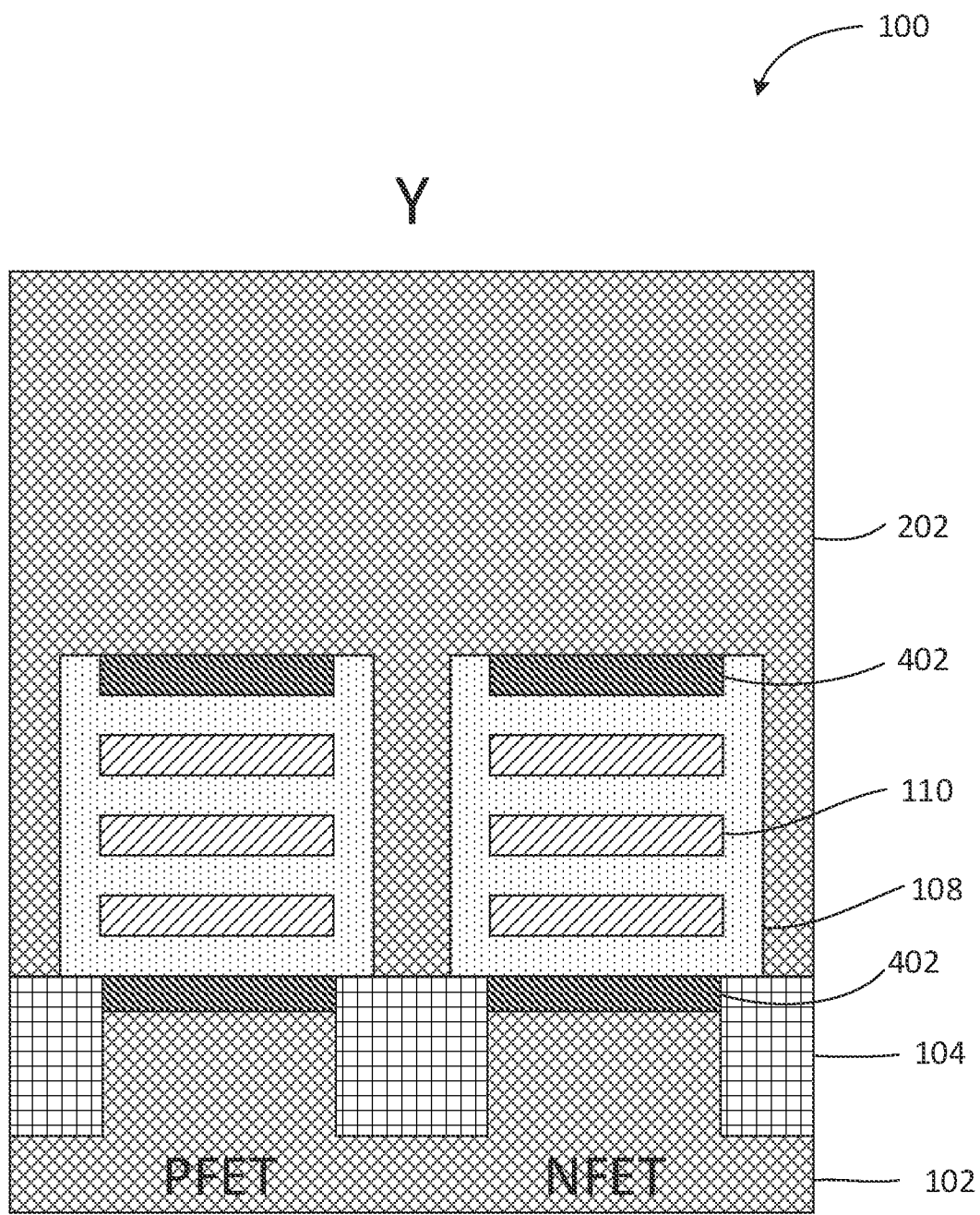
FIG. 7B depicts a cross-sectional view of the semiconductor nanosheet device of FIG. 6B taken along line Y of FIG. 1A after additional fabrication operations, according to embodiments.
Figure 7C:
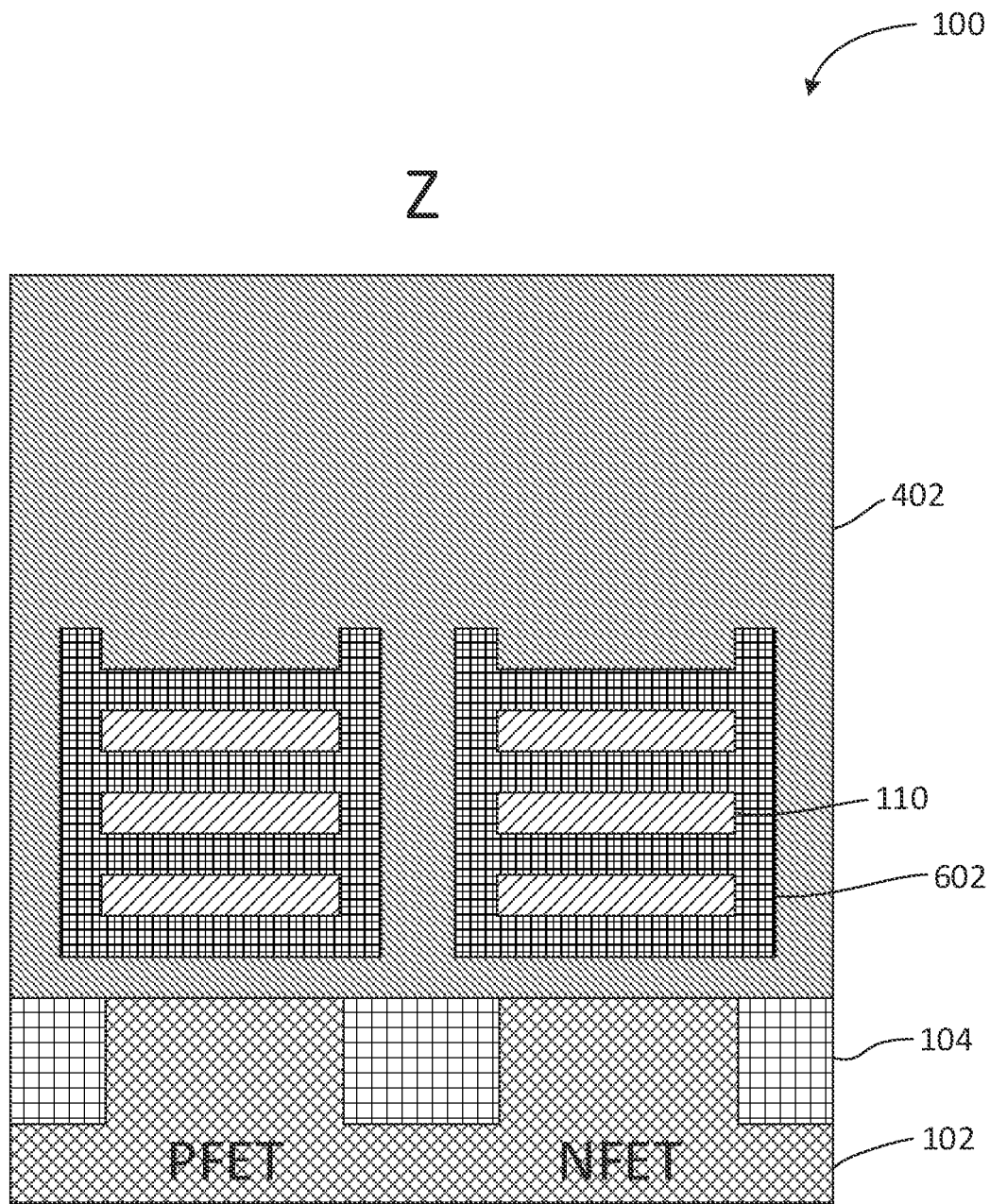
FIG. 7C depicts a cross-sectional view of the semiconductor nanosheet device of FIG. 6C taken along line Z of FIG. 1A after additional fabrication operations, according to embodiments.

Referring now to FIGS. 7A, 7B and 7C, these figures depict cross-sectional views of the semiconductor nanosheet device 100 of FIGS. 6A, 6B and 6C taken along cut lines X, Y and Z of FIG. 1A, respectively, after additional fabrication operations, according to embodiments. As shown in FIG. 7A, an interlayer dielectric (ILD) layer 702 is deposited between the spacer 402 and on top of the S/D epitaxial structure 604. Following the formation of the interlayer dielectric layer 702, poly open chemical mechanical polishing (POC) is utilized to planarize the semiconductor nanosheet device 100 and remove certain layers of materials. The POC removes all layers down to the level of the top surface of the dummy gate 202. In particular, as shown in FIGS. 7A and 7B, the hardmask 202 that was formed in FIG. 2A is removed by the POC process. As shown in FIGS. 7A and 7C, the POC process also removes an upper portion of the spacer 402 down to the level of the top surface of the dummy gate 202.

Figure 8A:
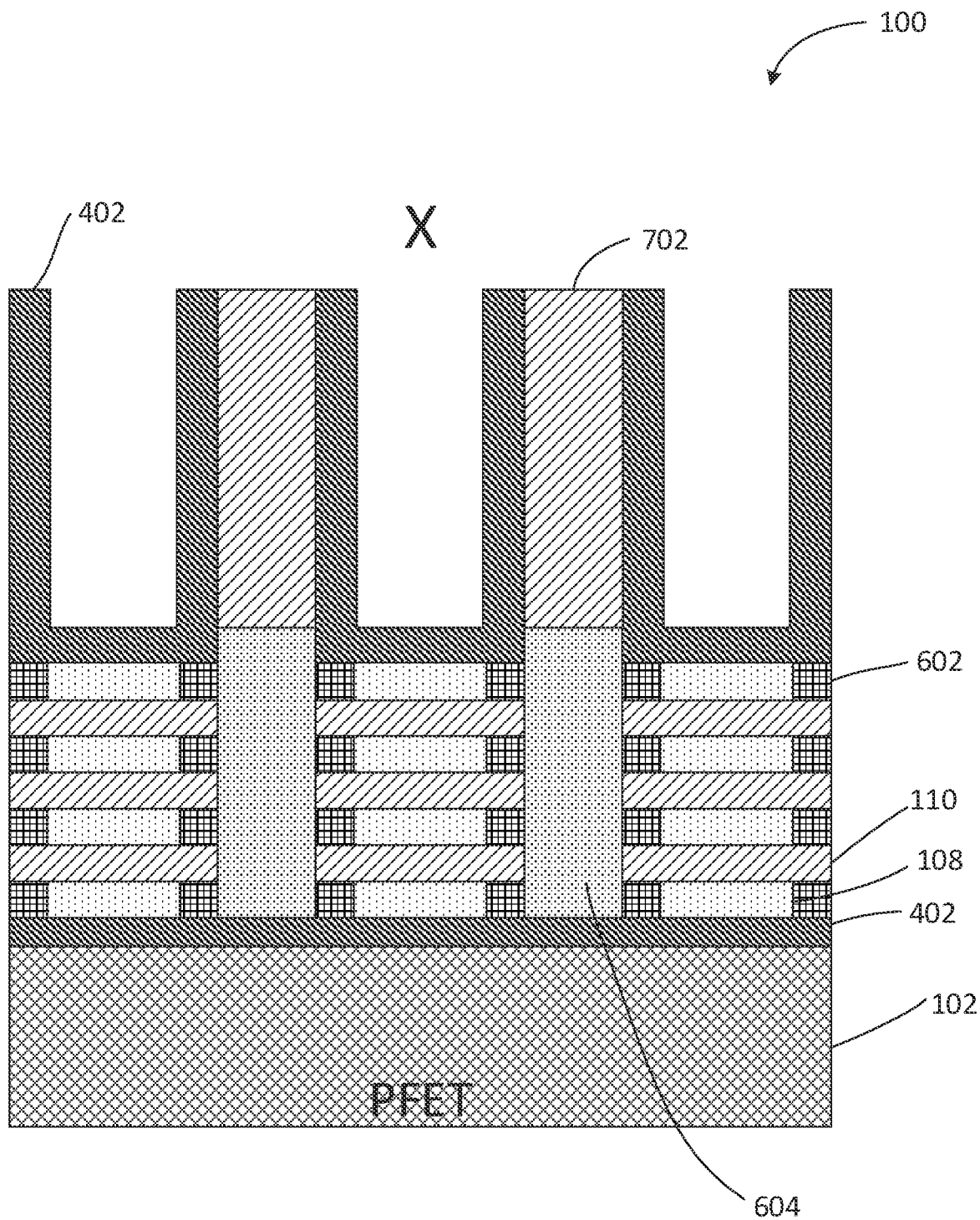
FIG. 8A depicts a cross-sectional view of the semiconductor nanosheet device of FIG. 7A taken along line X of FIG. 1A after additional fabrication operations, according to embodiments.
Figure 8B:
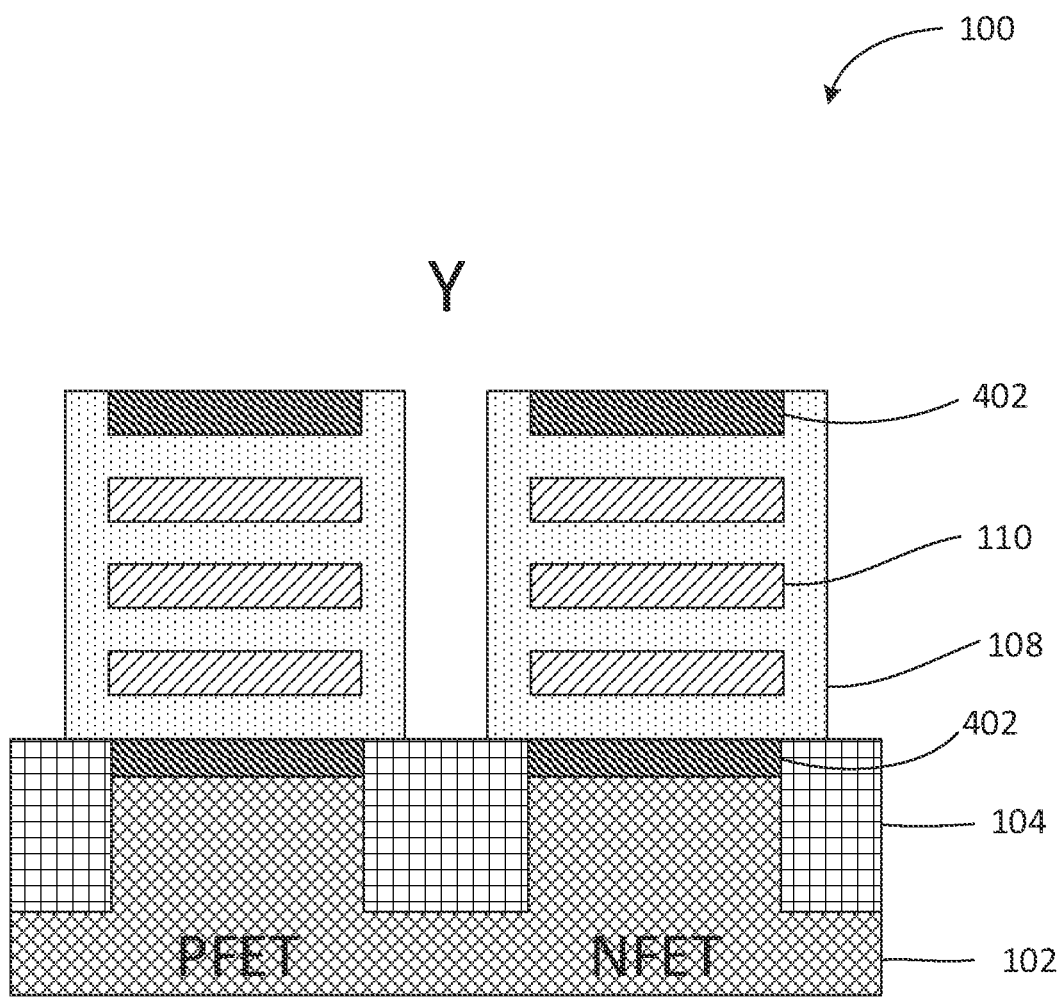
FIG. 8B depicts a cross-sectional view of the semiconductor nanosheet device of FIG. 7B taken along line Y of FIG. 1A after additional fabrication operations, according to embodiments.
Figure 8C:
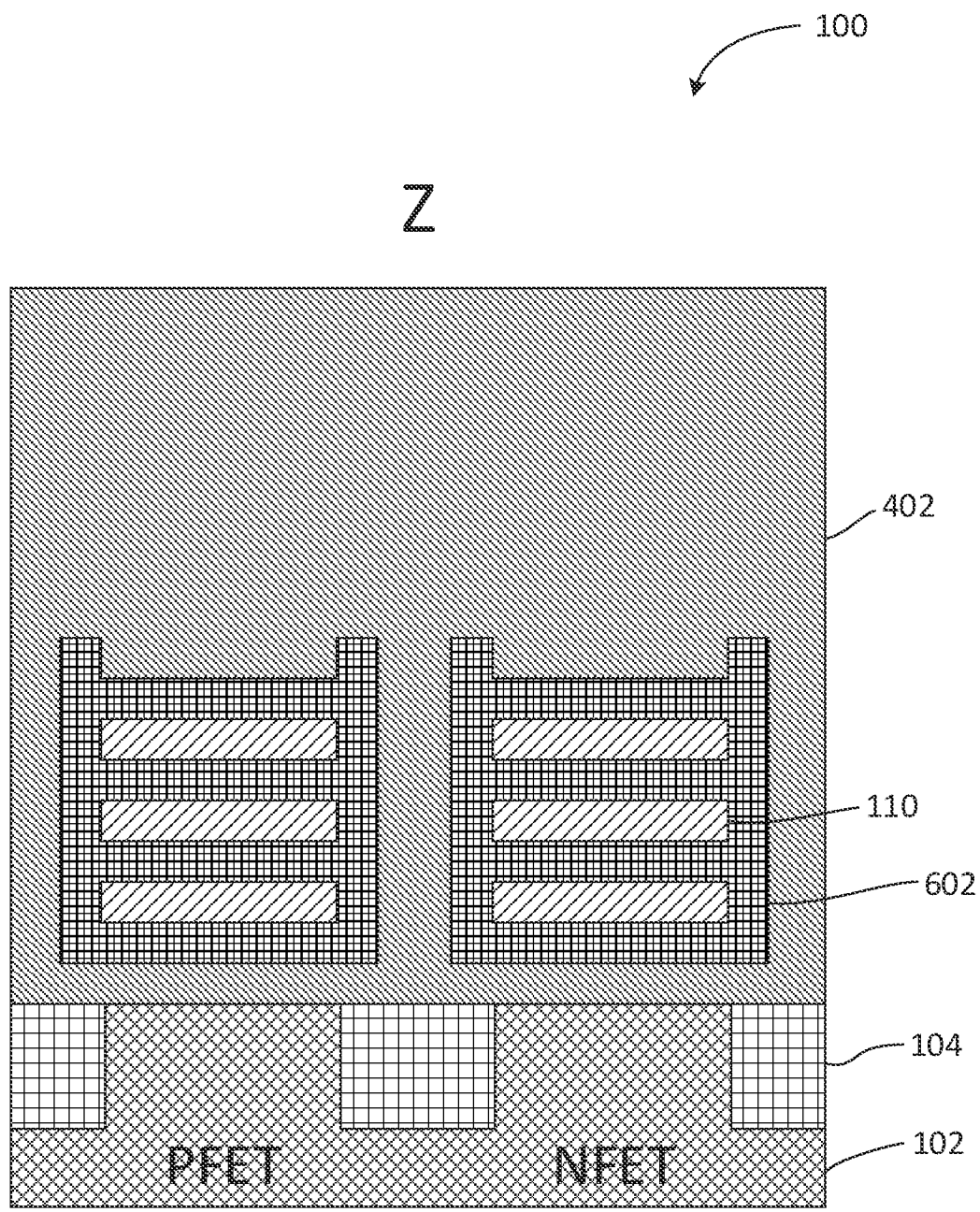
FIG. 8C depicts a cross-sectional view of the semiconductor nanosheet device of FIG. 7C taken along line Z of FIG. 1A after additional fabrication operations, according to embodiments.

Referring now to FIGS. 8A, 8B and 8C, these figures depict cross-sectional views of the semiconductor nanosheet device 100 of FIGS. 7A, 7B and 7C taken along cut lines X, Y and Z of FIG. 1A, respectively, after additional fabrication operations, according to embodiments. Specifically, FIGS. 8A and 8B depict a semiconductor nanosheet structure that results from removal of portions of the remaining dummy gate 202 from the semiconductor nanosheet device 100 shown in FIGS. 7A and 7B. In one embodiment, a selective etching is applied to remove the dummy gate 202. For example, a wet chemical etchant with a high selectivity for dummy gate removal to other surrounding materials can be hot ammonia, or a tetramethylammonium hydroxide (TMAH) wet etch process.

Figure 9A:
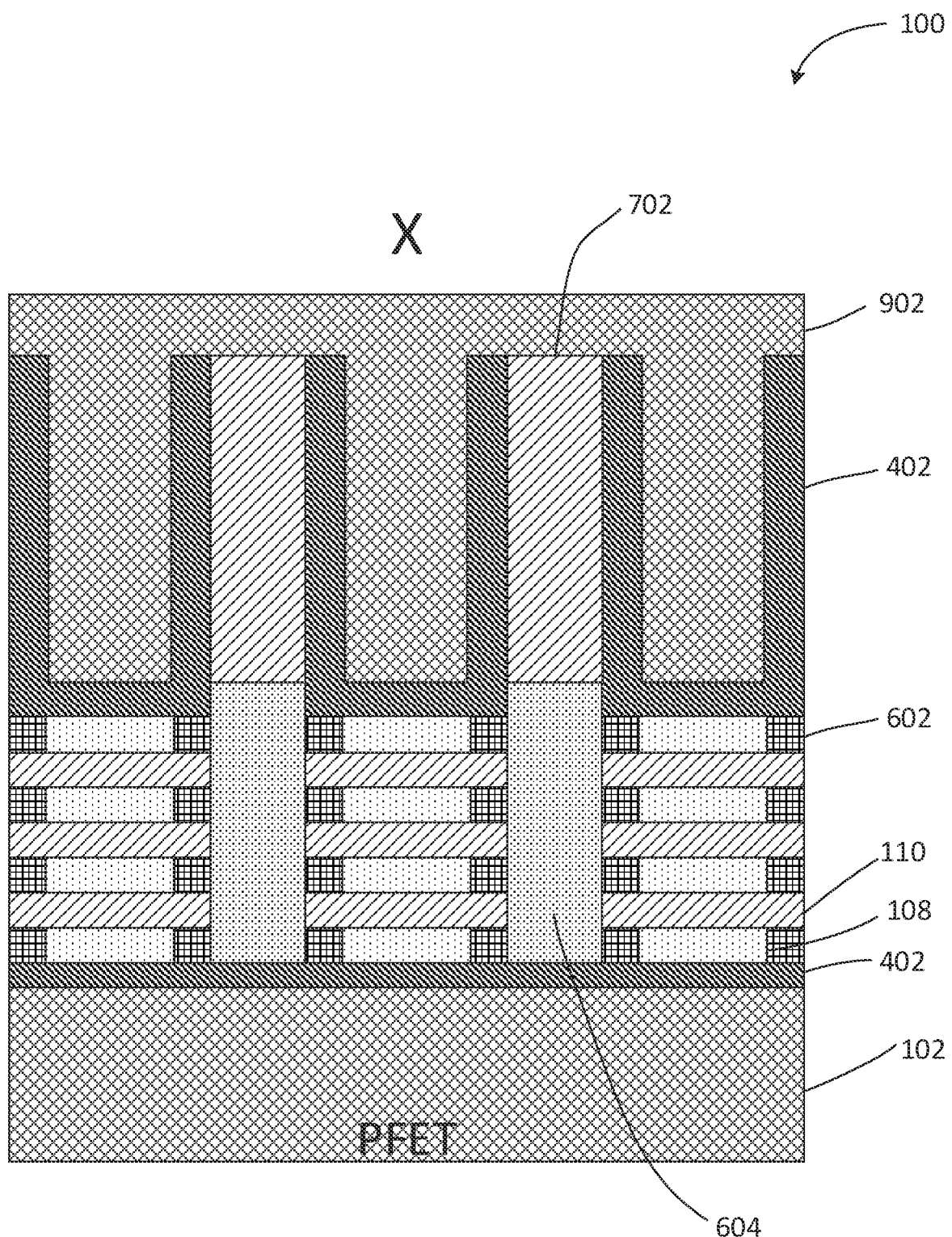
FIG. 9A depicts a cross-sectional view of the semiconductor nanosheet device of FIG. 8A taken along line X of FIG. 1A after additional fabrication operations, according to embodiments.
Figure 9B:
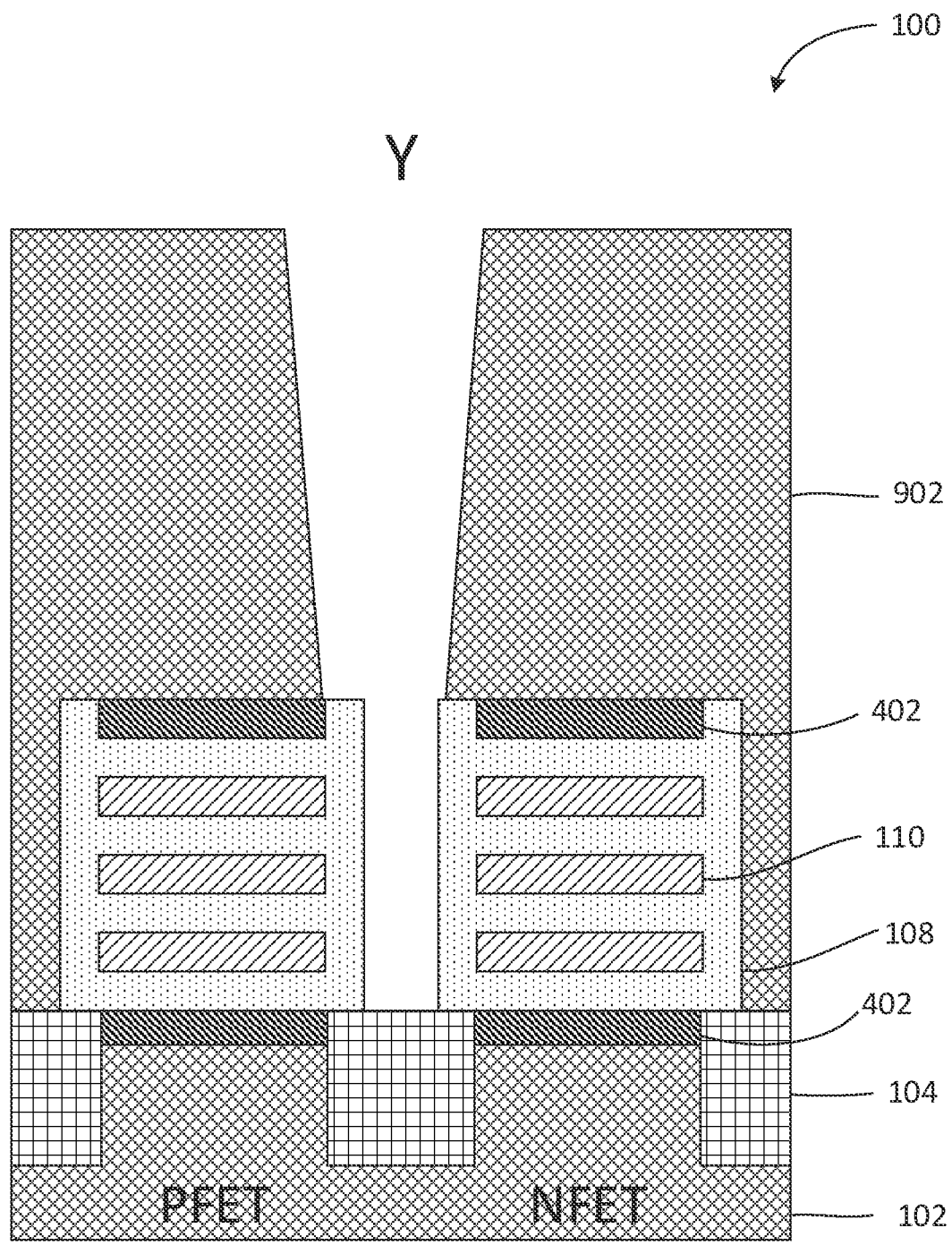
FIG. 9B depicts a cross-sectional view of the semiconductor nanosheet device of FIG. 8B taken along line Y of FIG. 1A after additional fabrication operations, according to embodiments.
Figure 9C:
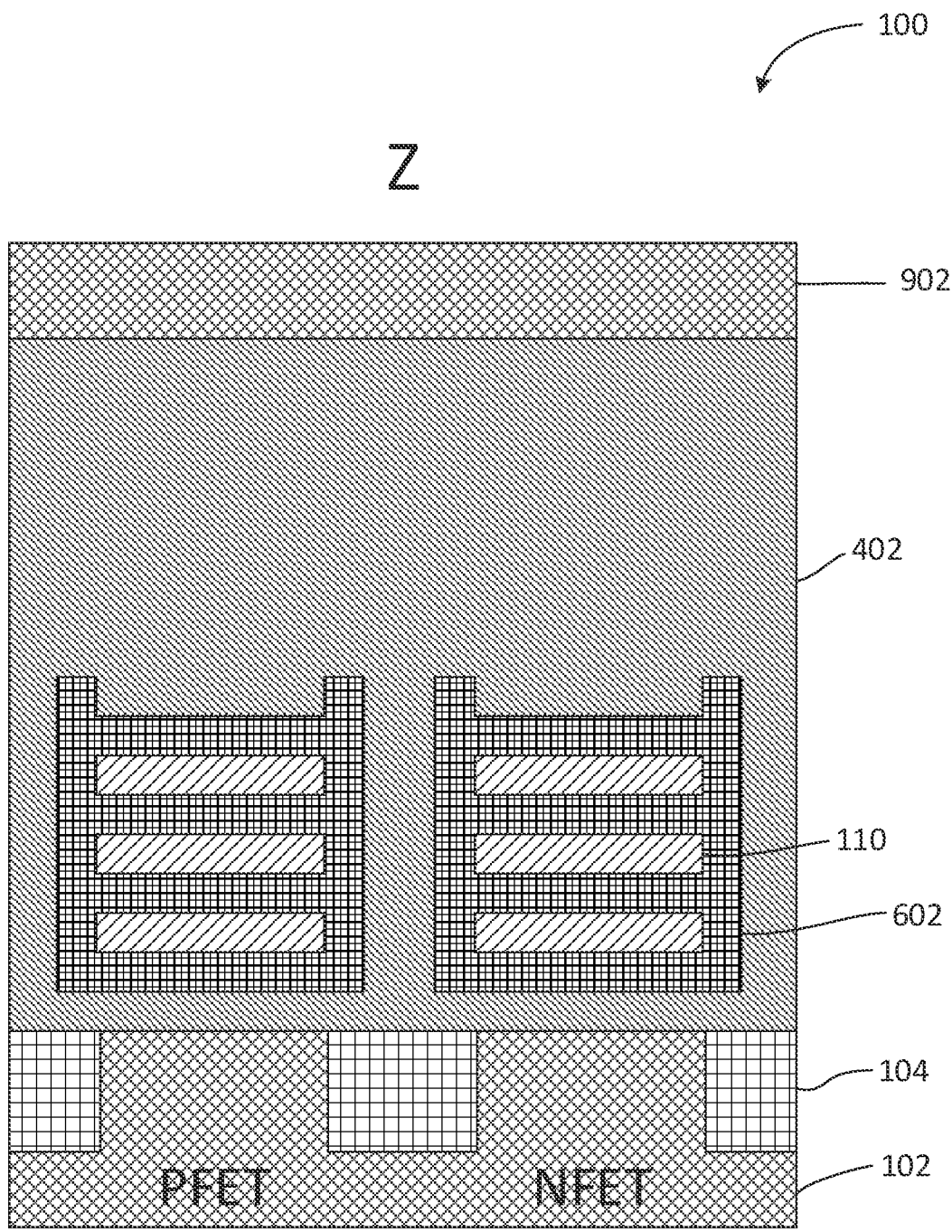
FIG. 9C depicts a cross-sectional view of the semiconductor nanosheet device of FIG. 8C taken along line Z of FIG. 1A after additional fabrication operations, according to embodiments.

Referring now to FIGS. 9A, 9B and 9C, these figures depict cross-sectional views of the semiconductor nanosheet device 100 of FIGS. 8A, 8B and 8C taken along cut lines X, Y and Z of FIG. 1A, respectively, after additional fabrication operations, according to embodiments. In these figures, an organic planarization layer (OPL) 902 is formed on the top of the semiconductor nanosheet device 100. Following the formation of the organic planarization layer 902, a self-aligned gate cut patterning processes is performed to remove the OPL material between adjacent nanosheet stacks 150, as shown in FIG. 9B. The OPL material is removed all the way down to the STI region 104. The OPL etching process is selective to other surrounding materials such as SiN, SiGe, SiO2, etc, so the opening between the PFET and NFET region is purely defined by the initial separation between the two, and it does not rely on the alignment or critical dimension of the cut opening shown in FIG. 9B. Thus, the gate cut position between the NFET and PFET is self-aligned, and it is not impacted by the variation in lithography process. In FIG. 9B, there appears to be a slight angle on the cut away portion of the OPL layer 902, however it should be appreciated that this may be a vertical surface as opposed to an angular surface. In the example where there is an angle on the cut away portion of the OPL layer 902, there is a larger circular diameter (CD) region at the top portion of the cut away, and a smaller CD region at the bottom. In certain embodiments, the CD region at the top can be misaligned, but the CD region at the bottom is always perfectly aligned in the middle between the nanosheet stacks 150.

Figure 10A:
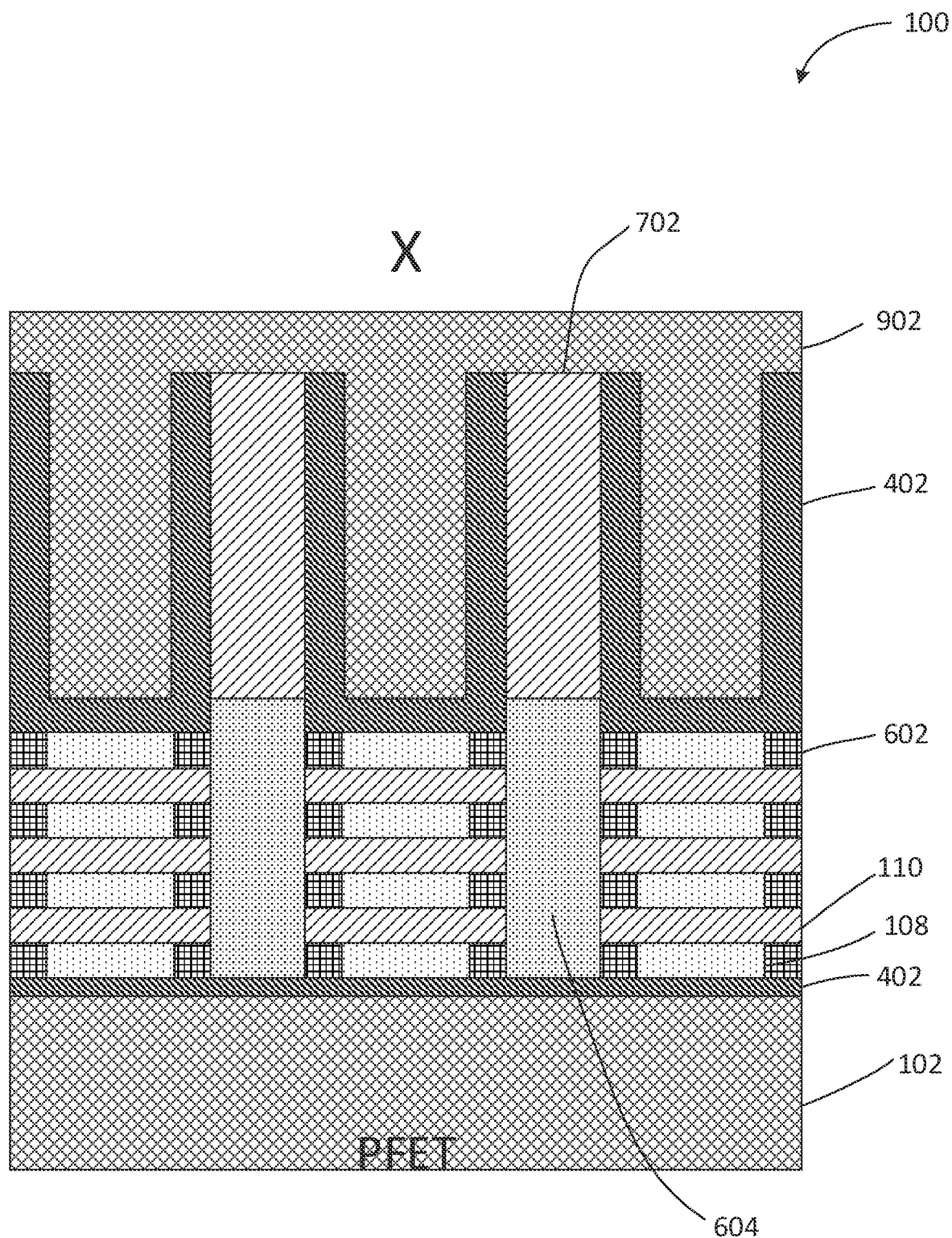
FIG. 10A depicts a cross-sectional view of the semiconductor nanosheet device of FIG. 9A taken along line X of FIG. 1A after additional fabrication operations, according to embodiments.
Figure 10B:
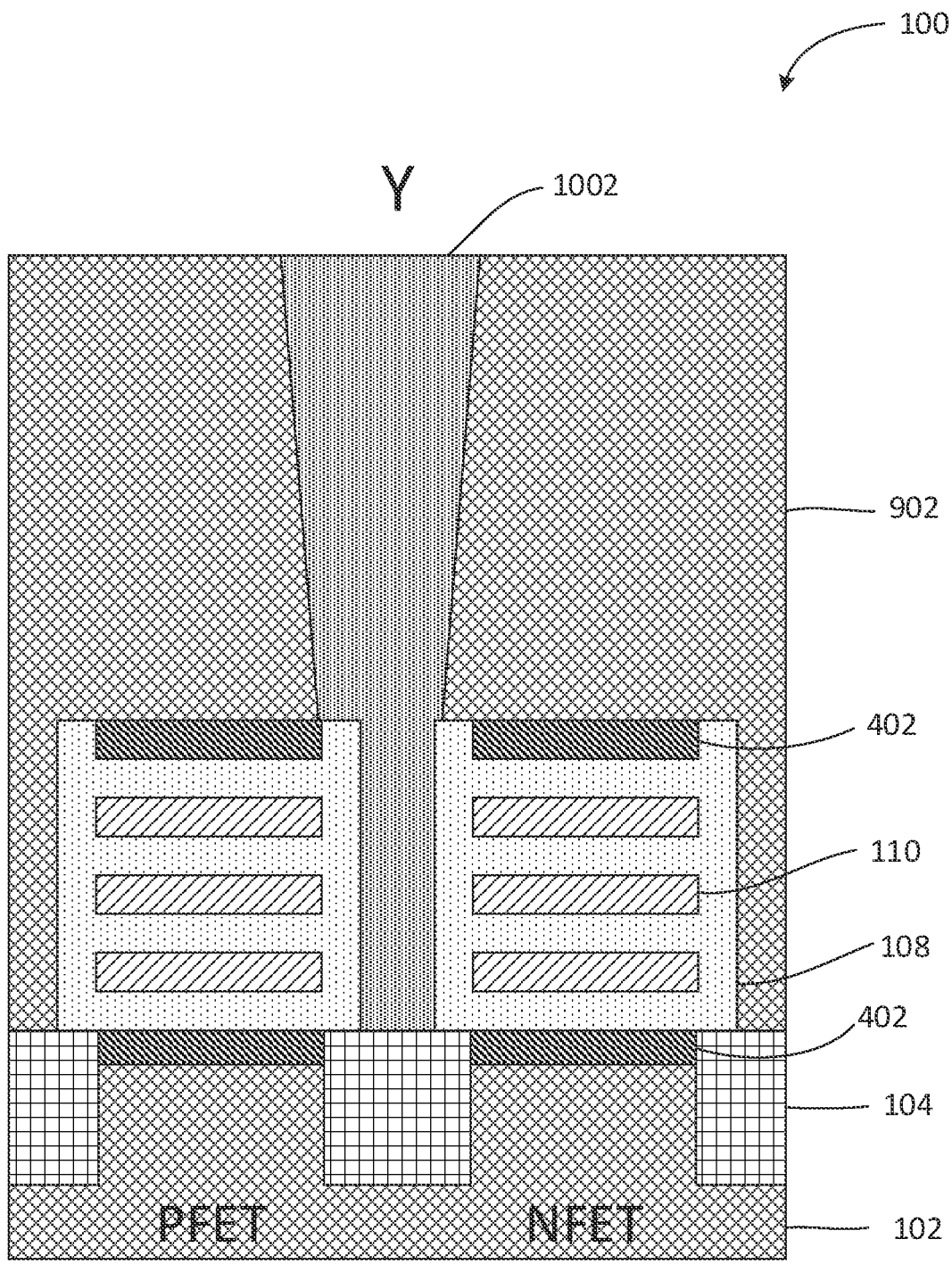
FIG. 10B depicts a cross-sectional view of the semiconductor nanosheet device of FIG. 9B taken along line Y of FIG. 1A after additional fabrication operations, according to embodiments.
Figure 10C:
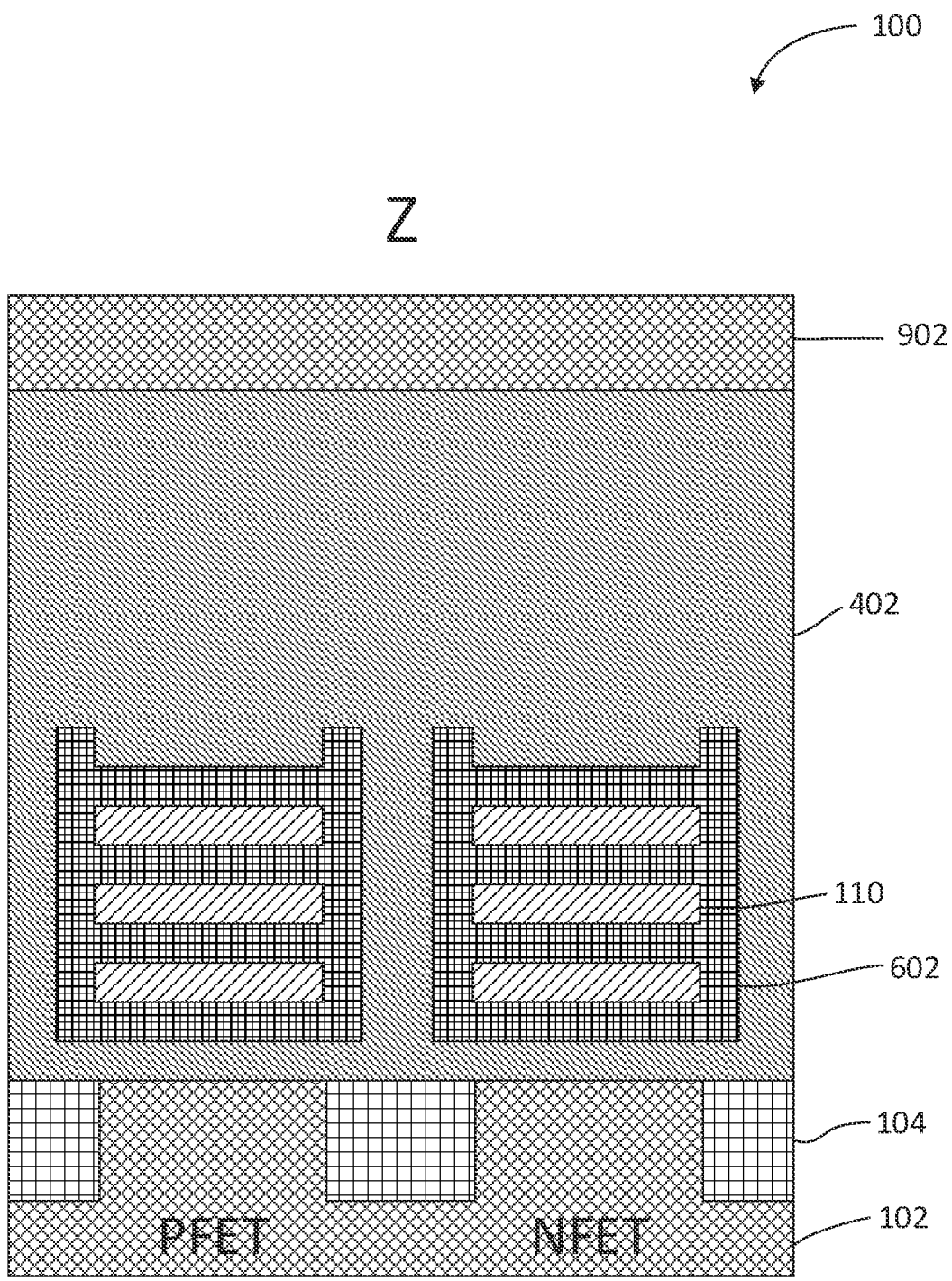
FIG. 10C depicts a cross-sectional view of the semiconductor nanosheet device of FIG. 9C taken along line Z of FIG. 1A after additional fabrication operations, according to embodiments.

Referring now to FIGS. 10A, 10B and 10C, these figures depict cross-sectional views of the semiconductor nanosheet device 100 of FIGS. 9A, 9B and 9C taken along cut lines X, Y and Z of FIG. 1A, respectively, after additional fabrication operations, according to embodiments. As shown in FIG. 10B, a dielectric fill layer 1002 is formed in the space previously cut away between the adjacent nanosheet stacks 150. This dielectric fill layer 1002 (i.e., dielectric pillar) functions as an isolation layer that will later allow for formation of separate PFET work function metal (PWFM) and NFET work function metal (NWFM) structures on the right and left sides of the pillar, as discussed in further detail below. As shown in FIG. 10B, the dielectric fill layer 1002 has a portion (near the left PFET side nanosheet stack) that is formed on top of the second type sacrificial layer 108 and extends to the top surface side of the spacer 402. This is due to a slight misalignment during the cut away process described above with regard to FIGS. 10A, 10B and 10C.

Figure 11A:
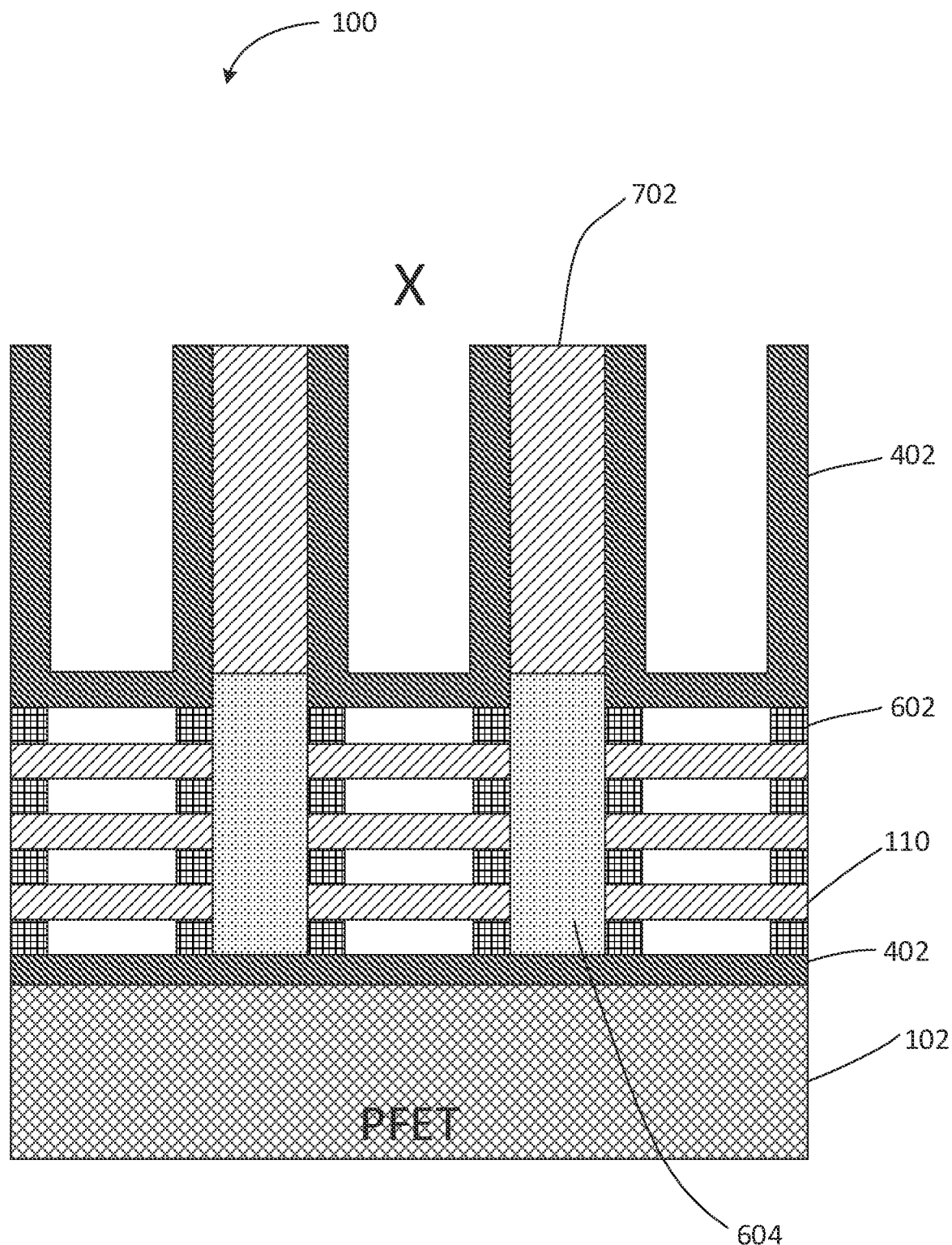
FIG. 11A depicts a cross-sectional view of the semiconductor nanosheet device of FIG. 10A taken along line X of FIG. 1A after additional fabrication operations, according to embodiments.
Figure 11B:
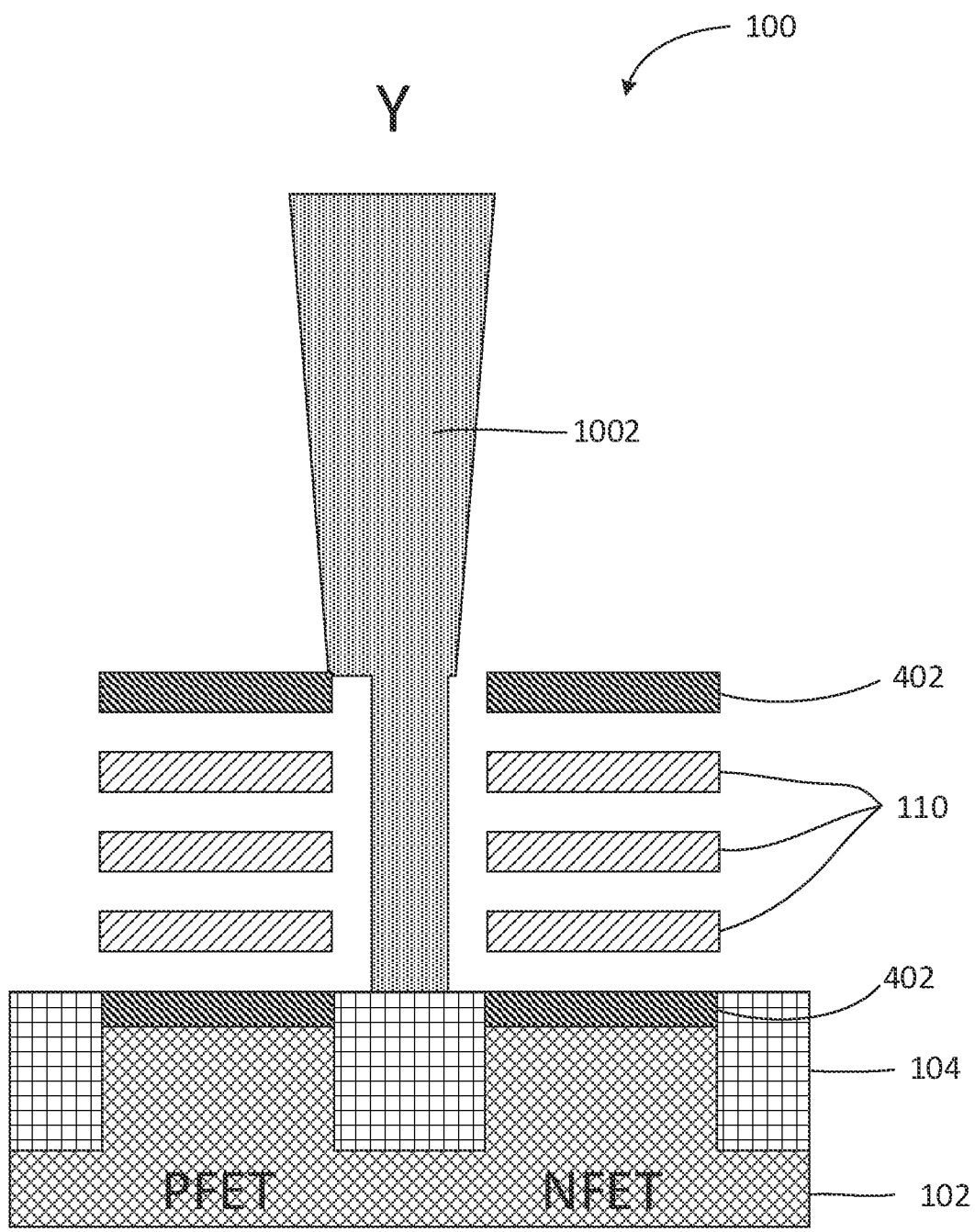
FIG. 11B depicts a cross-sectional view of the semiconductor nanosheet device of FIG. 10B taken along line Y of FIG. 1A after additional fabrication operations, according to embodiments.
Figure 11C:
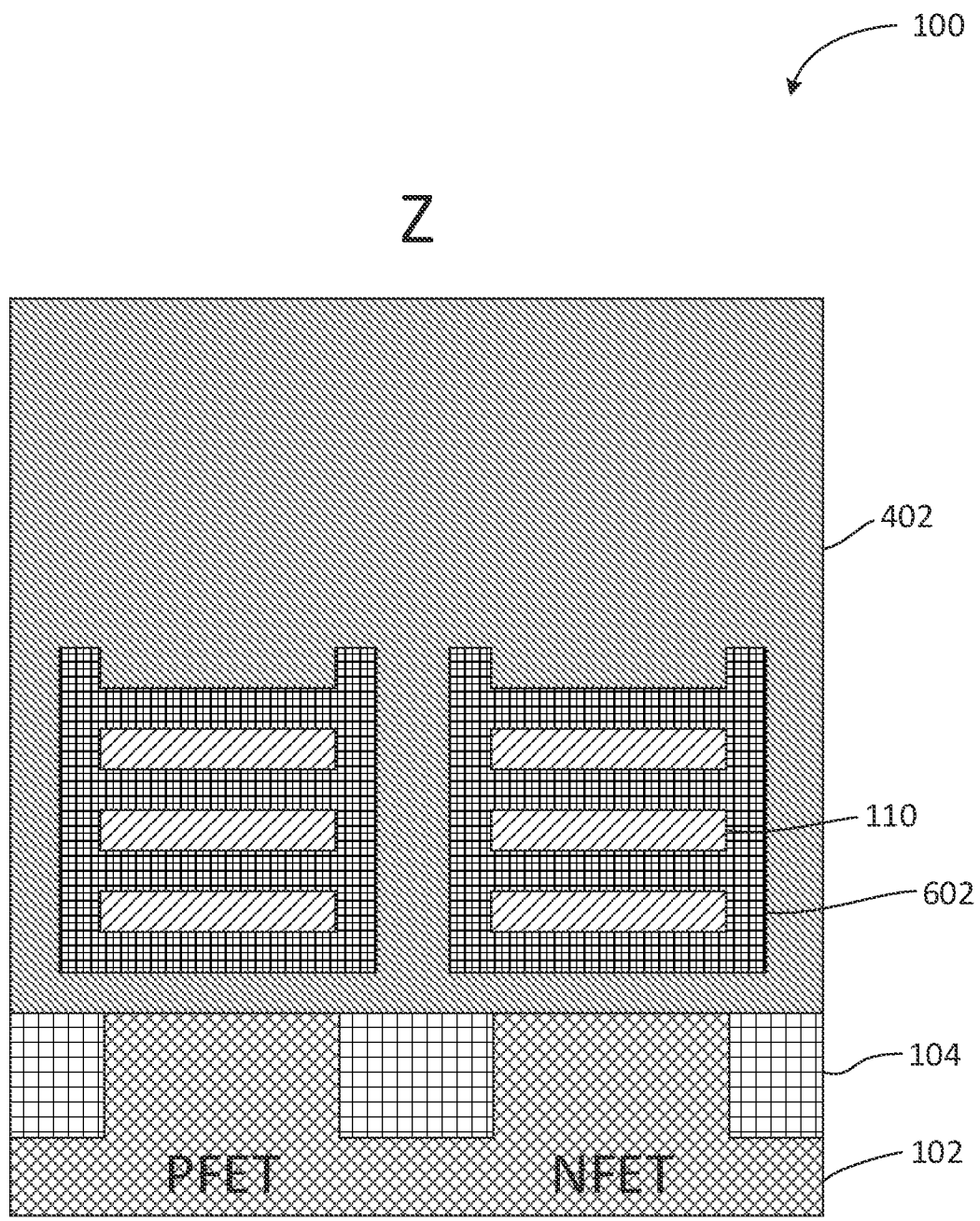
FIG. 11C depicts a cross-sectional view of the semiconductor nanosheet device of FIG. 10C taken along line Z of FIG. 1A after additional fabrication operations, according to embodiments.

Referring now to FIGS. 11A, 11B and 11C, these figures depict cross-sectional views of the semiconductor nanosheet device 100 of FIGS. 10A, 10B and 10C taken along cut lines X, Y and Z of FIG. 1A, respectively, after additional fabrication operations, according to embodiments. As shown in FIGS. 11A, 11B and 11C, because the OPL layer 902 is an organic layer, it can be removed with an ashing process utilizing $CO_2$, for example. Next, the SiGe30 material of the second type sacrificial layer 108 is removed with a wet etching technique using HCl for example. Thus, all of the SiGe30 material has been removed at this stage of the manufacturing process. As shown in FIG. 11B, the left middle corner of the dielectric fill layer 1002 contacts (or slightly overlaps with) the top corner of the spacer 402 on the PFET side of the semiconductor nanosheet device 100. As also shown in FIG. 11B, on the right and left sides of the lower part of the dielectric fill layer 1002, there are spaces between the dielectric fill layer 1002 and the active semiconductor layers 110. There are also spaces between the right and left sides of the lower part of the dielectric fill layer 1002 and the spacer 402. This is due to the previous formation of the sidewalls of the second type sacrificial layer 108, as shown and described with respect to FIG. 1C.

Figure 12A:
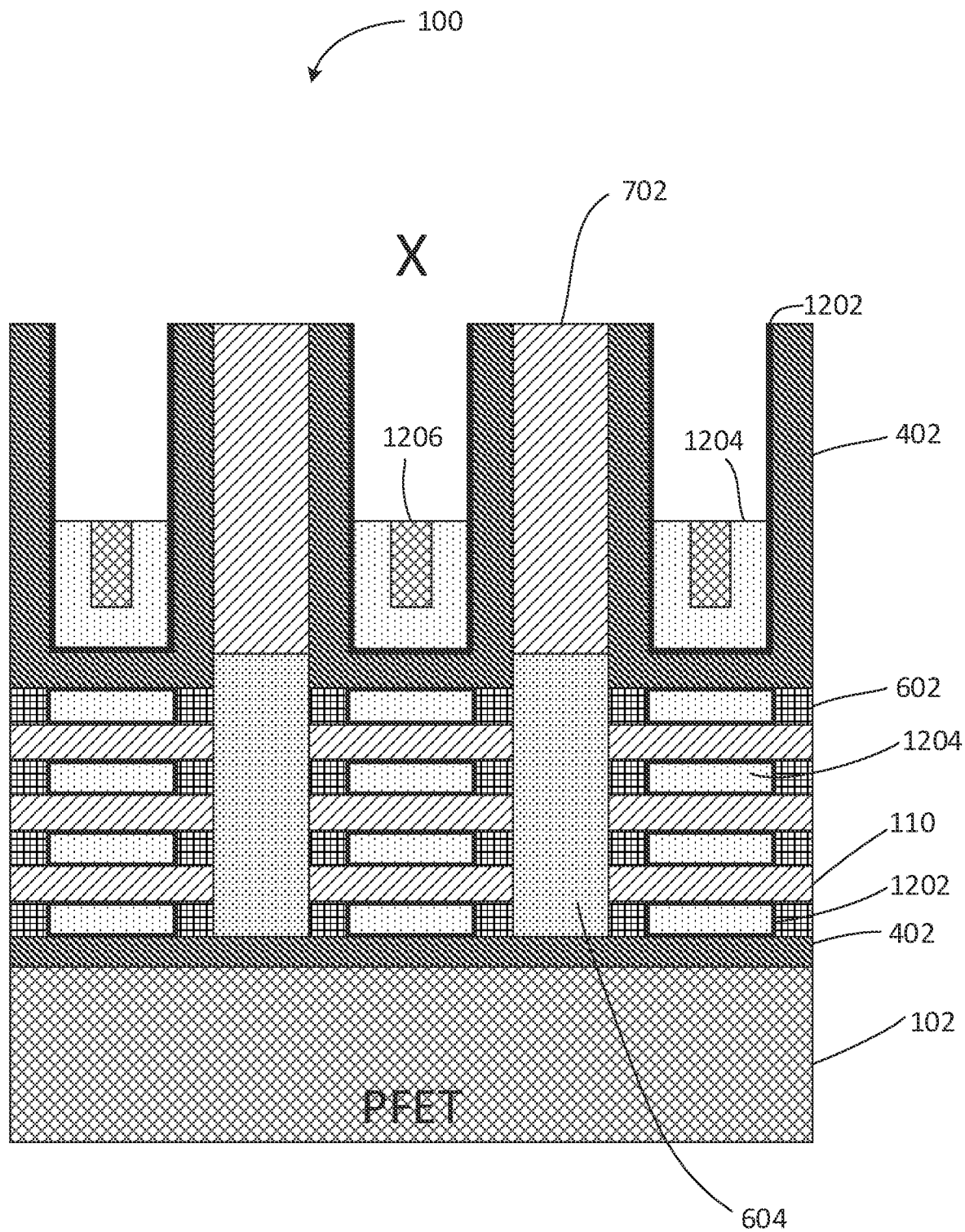
FIG. 12A depicts a cross-sectional view of the semiconductor nanosheet device of FIG. 11A taken along line X of FIG. 1A after additional fabrication operations, according to embodiments.
Figure 12B:
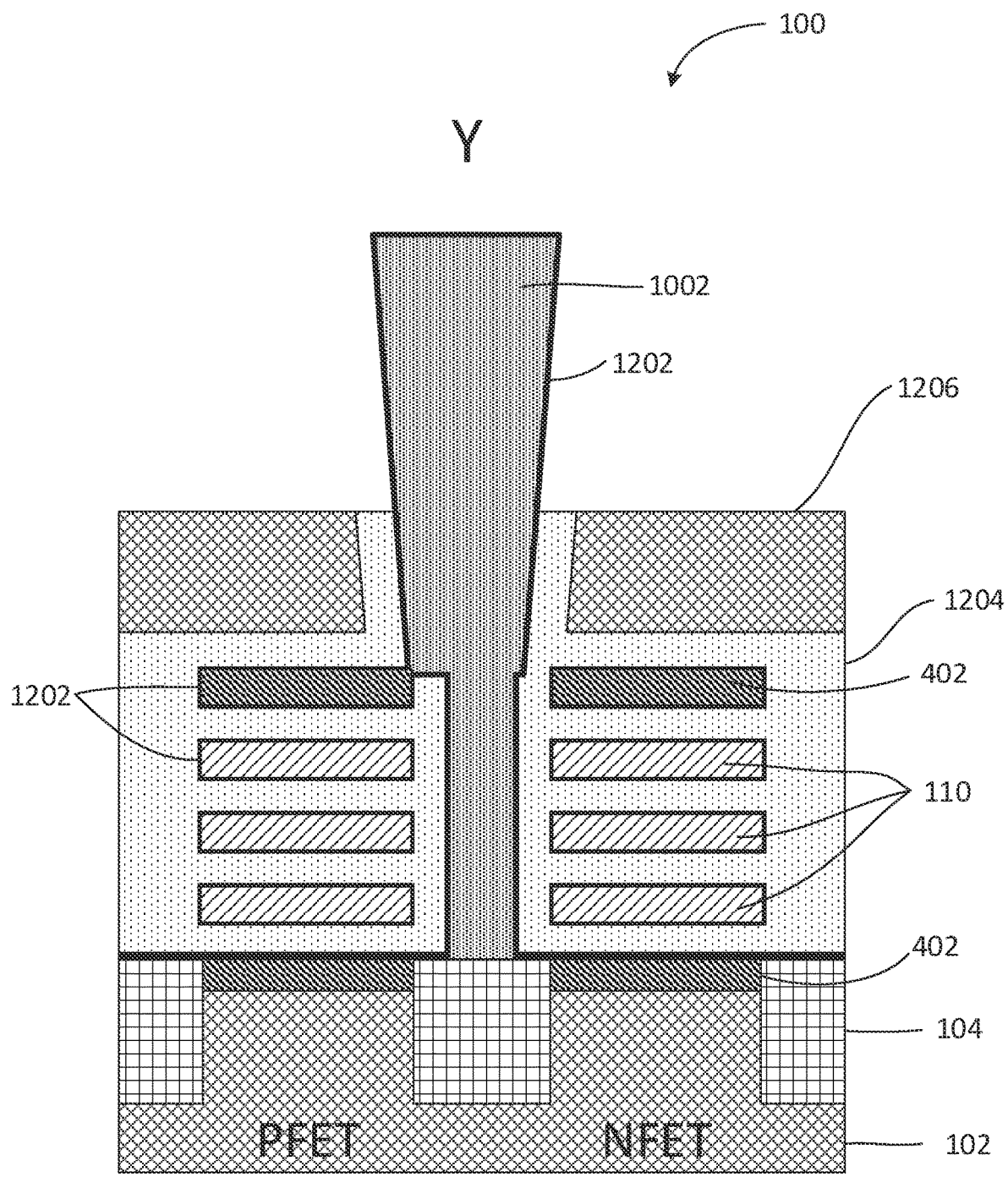
FIG. 12B depicts a cross-sectional view of the semiconductor nanosheet device of FIG. 11B taken along line Y of FIG. 1A after additional fabrication operations, according to embodiments.
Figure 12C:
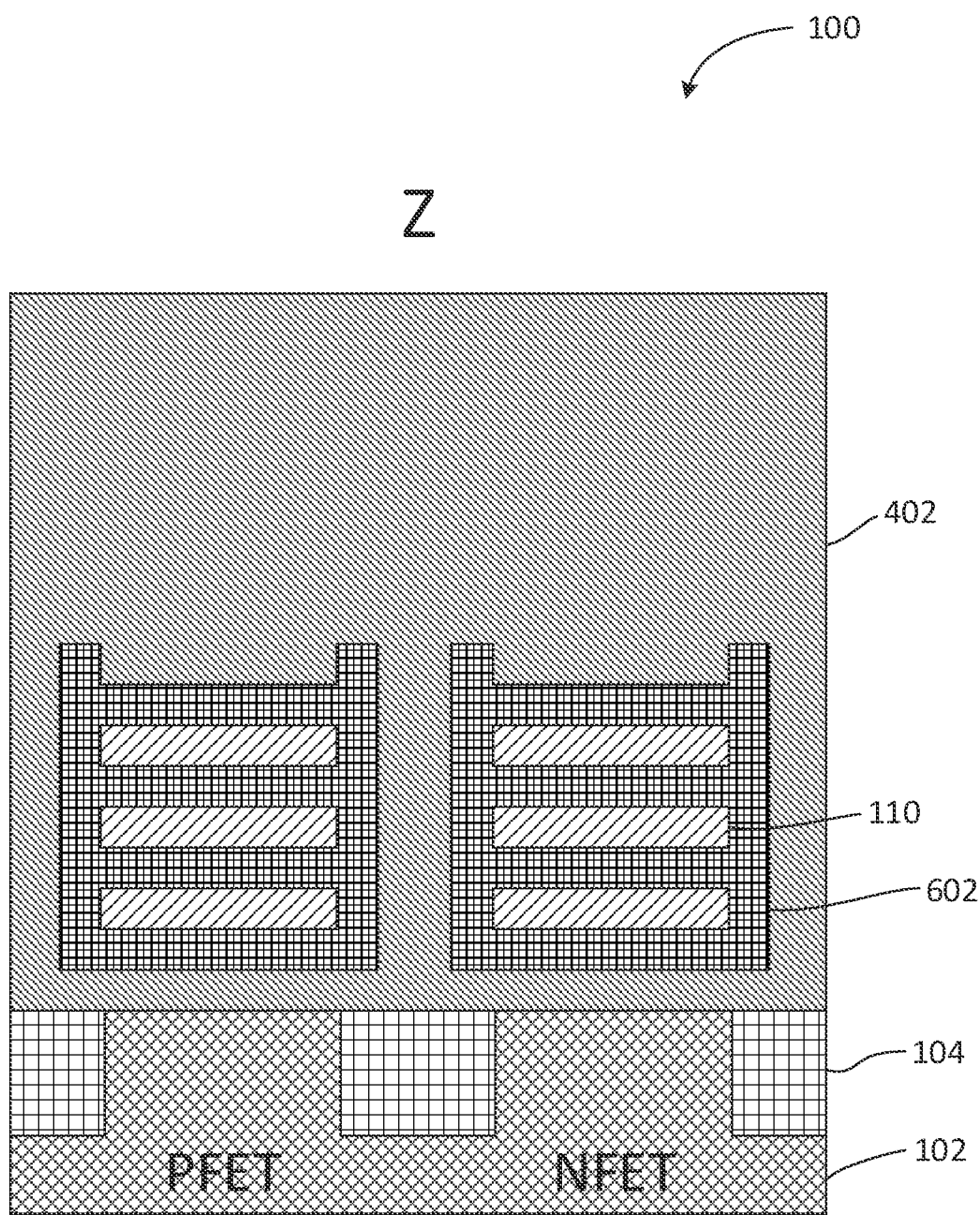
FIG. 12C depicts a cross-sectional view of the semiconductor nanosheet device of FIG. 11C taken along line Z of FIG. 1A after additional fabrication operations, according to embodiments.

Referring now to FIGS. 12A, 12B and 12C, these figures depict cross-sectional views of the semiconductor nanosheet device 100 of FIGS. 11A, 11B and 11C taken along cut lines X, Y and Z of FIG. 1A, respectively, after additional fabrication operations, according to embodiments. First, a conformal κ dielectric layer 1202 is deposited around all exposed surfaces of the active semiconductor material layer 110, on all exposed surfaces of the inner spacer 602, on all exposed surfaces of the spacer 402, and on exposed surfaces of the STI regions 104. This is shown as a thick black line on these surfaces, as shown in FIGS. 12A and 12B. The conformal κ dielectric layer 1202 comprises a κ gate dielectric material. In general, the term κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. Thus, the term κ as used herein refers to a material having a relative dielectric constant κ which is much higher than that of silicon dioxide (e.g., a dielectric constant κ=25 for hafnium oxide ($HfO_2$) rather than 4 for silicon dioxide). Examples of suitable κ gate dielectric materials include, but are not limited to, $HfO_2$ and/or lanthanum oxide ($La_2O_3$).

Second, as also shown in FIGS. 12A and 12B, a PFET work function metal 1204 (PWFM) is formed on the conformal κ dielectric layer 1202. In certain embodiments, the depositing of the WFM layer may be conducted by utilizing atomic layer deposition (ALD). Specifically, the PWFM layer 1204 is formed in the inner spaces between the spacer 402 and the active semiconductor layer 110 in the vertical direction, and between the inner spacers 602 in the horizontal direction. Also, as shown in FIG. 12A, the PWFM layer 1204 is formed between the sidewalls of the upper portion of the spacer 402 above the active semiconductor layers 110. As shown in FIG. 12B, the PWFM layer 1204 is formed all around the surfaces of the active semiconductor layers 110 and the spacer 402. Although the PWFM layer 1204 is formed on both the PFET and NFET sides of the semiconductor nanosheet device 100, the PWFM on the NFET side will later be removed in favor of NWFM material.

For n-channel field-effect transistors (nFETs), the WFM layers may include one or more WFM layers for the nFETs, such as TiAlC, TiC, TiN/TiAlC, etc. For p-channel field-effect transistors (pFETs), the WFM layers may include TiN, TaN, TiN/TiAlC, or any other suitable transition metal for which Vt can be modulated by a change in the thickness of the WFM layer.

In certain embodiments, the PWFM layer is recessed by a process known as WFM chamfering (or more generally chamfering). As shown in FIG. 12A, the upper portion of the PWFM layer 1204 that is formed between the spacer 402 is only formed to partially fill the space between the spacer. However, initially in the WFM chamfering process, the PWFM layer 1204 is formed all the way up to the top of the semiconductor nanosheet device 100 on the sidewalls of the κ dielectric layer 1202 (not shown in FIG. 12A). Then, a sacrificial material of an organic planarization layer 1206 (OPL) is formed to fill all the space between the κ dielectric layer 1202 all the way up to the top of the semiconductor nanosheet device 100 (also not shown in FIG. 12A). Then, the OPL layer 1206 is recessed down to the level shown in FIGS. 12A and 12B, leaving the PWFM layer 1204 still formed all of the way up the sidewalls to the top of the semiconductor nanosheet device 100 (also not shown in FIG. 12A). Finally, a portion of the PWFM layer 1204 is removed down to the level of the recessed OPL layer 1206 such that the top of the PWFM layer 1204 is generally at the same level as the top surface of the OPL layer 1206, as shown in FIG. 12A. The same WFM chamfering process is used on the PWFM layer 1204 and OPL layer 1206 to result in the layering shown in FIG. 12B. In FIG. 12B, the top surfaces of the PWFM layer 1204 and OPL layer 1206 are partially up the side surfaces of the κ dielectric layer 1202 and the dielectric fill layer 1002. The cross-sectional view of FIG. 12C remains unchanged relative to FIG. 11C.

Figure 13A:
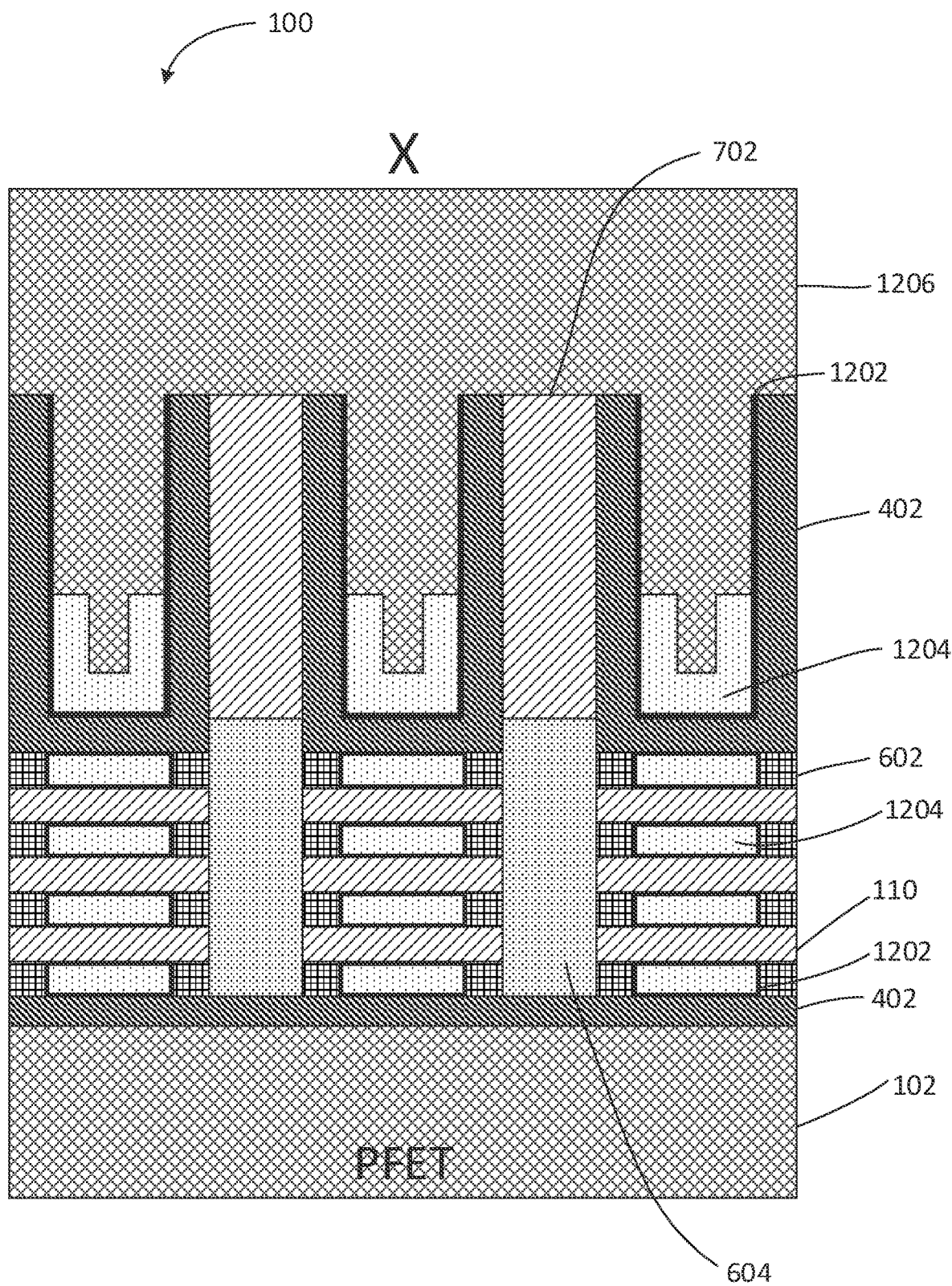
FIG. 13A depicts a cross-sectional view of the semiconductor nanosheet device of FIG. 12A taken along line X of FIG. 1A after additional fabrication operations, according to embodiments.
Figure 13B:
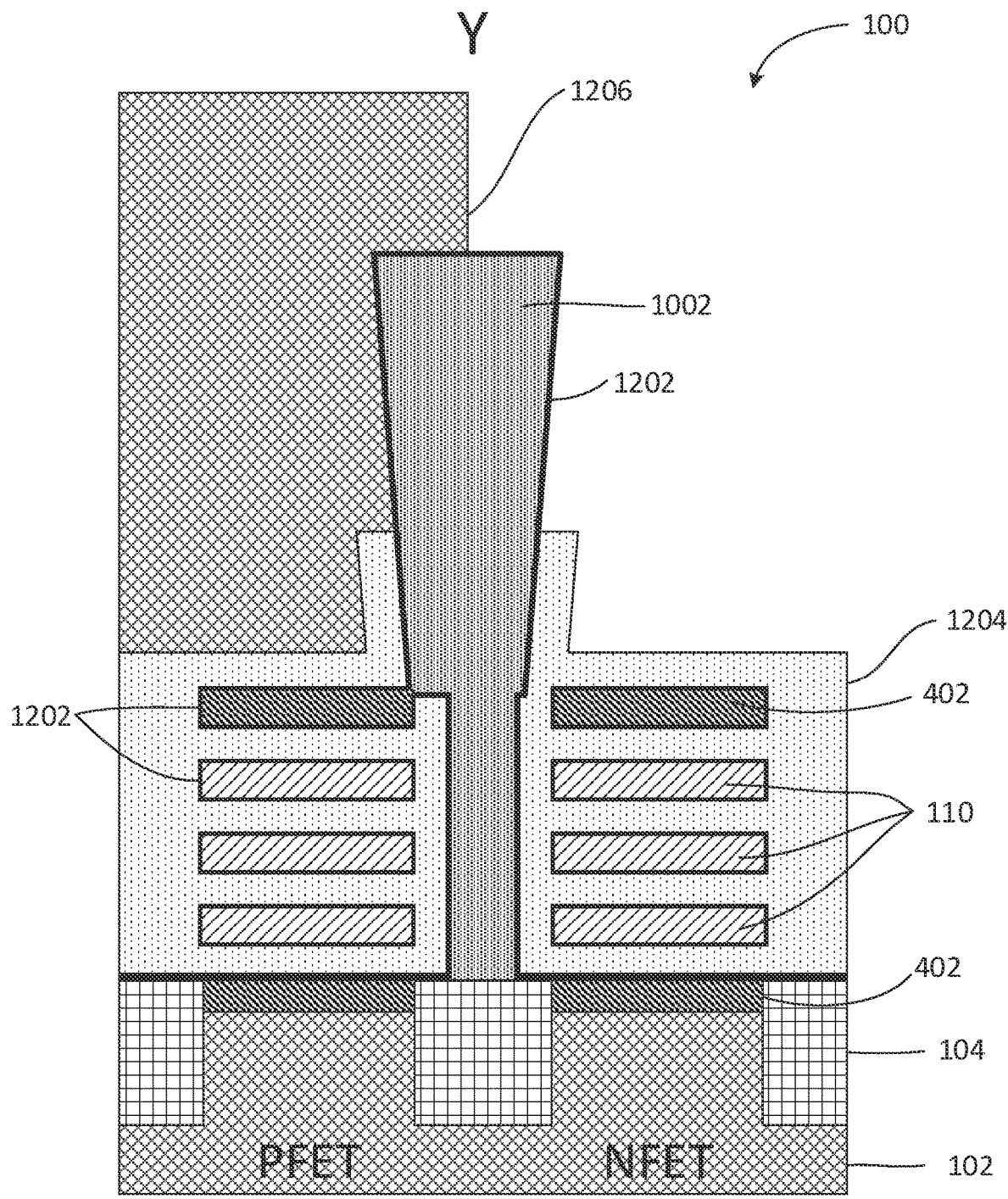
FIG. 13B depicts a cross-sectional view of the semiconductor nanosheet device of FIG. 12B taken along line Y of FIG. 1A after additional fabrication operations, according to embodiments.
Figure 13C:
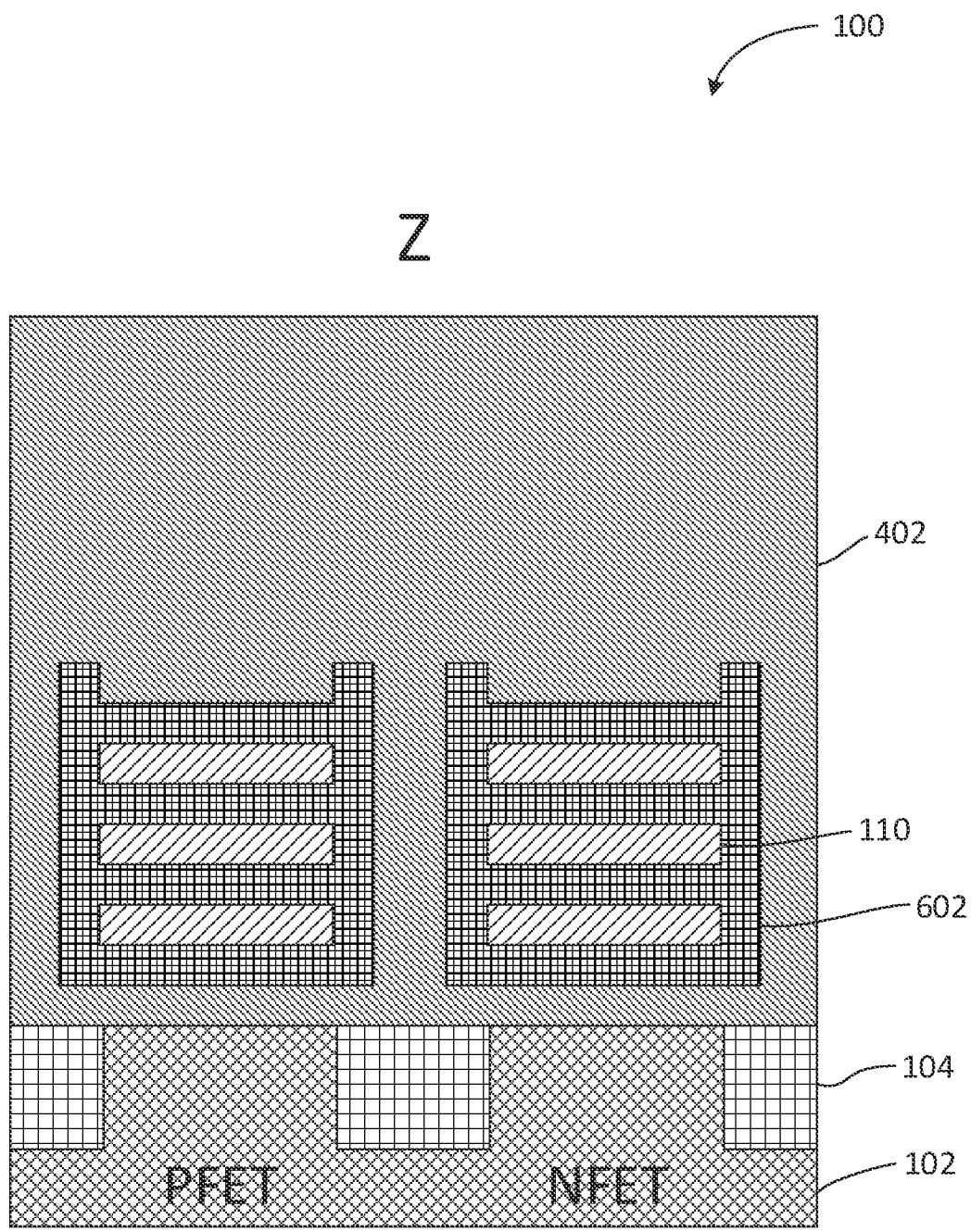
FIG. 13C depicts a cross-sectional view of the semiconductor nanosheet device of FIG. 12C taken along line Z of FIG. 1A after additional fabrication operations, according to embodiments.

Referring now to FIGS. 13A, 13B and 13C, these figures depict cross-sectional views of the semiconductor nanosheet device 100 of FIGS. 12A, 12B and 12C taken along cut lines X, Y and Z of FIG. 1A, respectively, after additional fabrication operations, according to embodiments. First, as shown in FIGS. 13A and 13B, the previous OPL used for WFM chamfering is removed, additional OPL material 1206 is deposited to a level that is above the upper surfaces of the κ dielectric layer 1202, the interlayer dielectric layer 702, and the spacer 402. Second, as shown in FIG. 13B, WFM patterning and reactive ion etching (RIE) is performed on a portion of the OPL layer 1206, to remove the portions of the OPL layer 1206 on the NFET side of the semiconductor nanosheet device 100. The removal of these portions of the OPL layer 1206 exposes the PWFM layer 1204 on the NFET side of the device, and also exposes right side portions and a portion of the top surface of the dielectric fill layer 1002 pillar and the κ dielectric layer 1202 covering the dielectric fill layer 1002. The OPL layer 1206 that remains temporarily protects the PWFM layer 1204 on the PFET side of the semiconductor nanosheet device from being removed in the subsequent processing steps, but at the same time allows the PWFM layer 1204 on the NFET side of the device 100 to be removed. The pillar of the dielectric fill layer 1002 also protects the PWFM layer 1204 on the PFET side of the semiconductor nanosheet device 100 from being removed in the subsequent processing steps, as described in further detail below. The cross-sectional view of FIG. 13C remains unchanged relative to FIG. 12C.

Figure 14A:
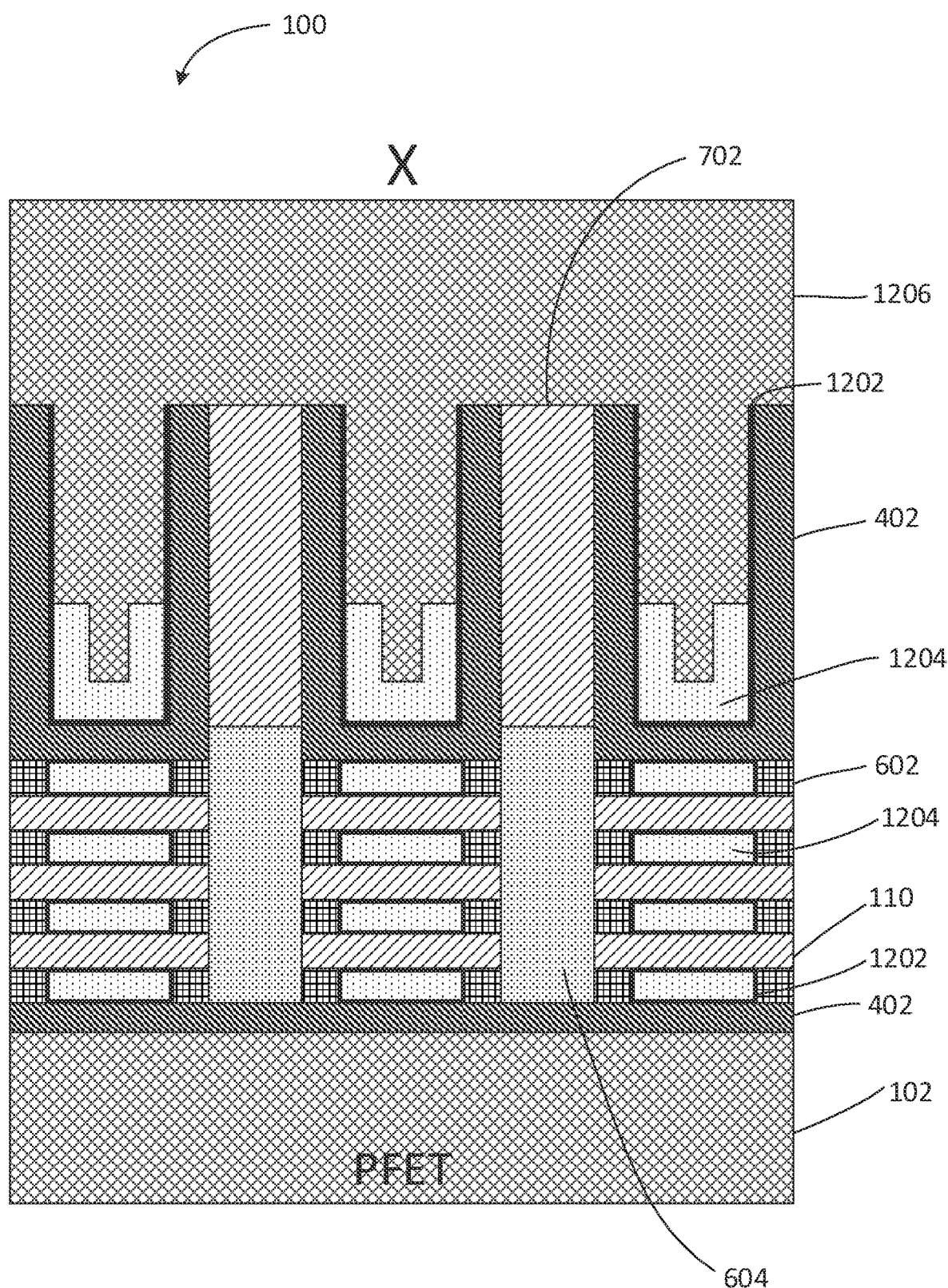
FIG. 14A depicts a cross-sectional view of the semiconductor nanosheet device of FIG. 13A taken along line X of FIG. 1A after additional fabrication operations, according to embodiments.
Figure 14B:
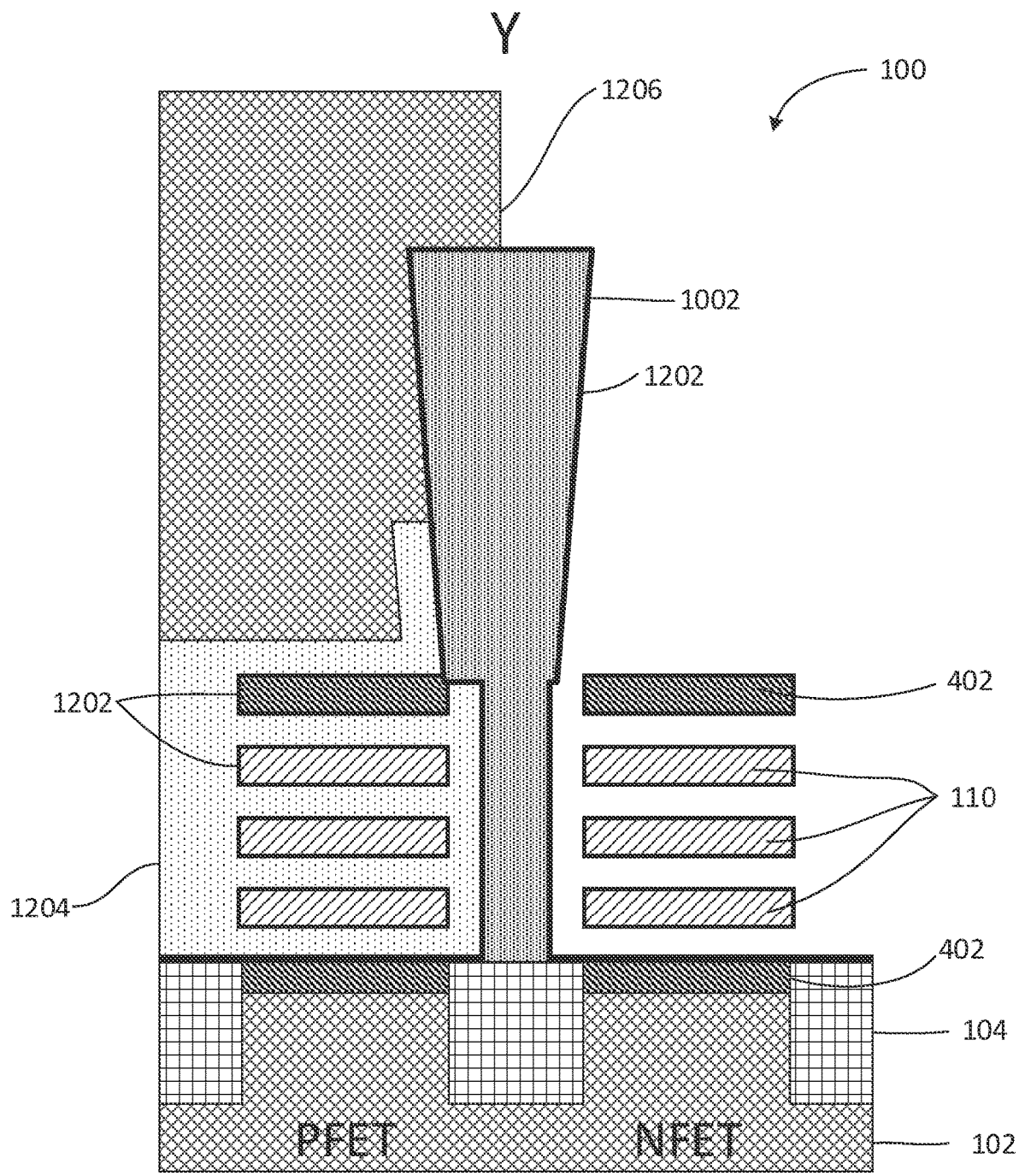
FIG. 14B depicts a cross-sectional view of the semiconductor nanosheet device of FIG. 13B taken along line Y of FIG. 1A after additional fabrication operations, according to embodiments.
Figure 14C:
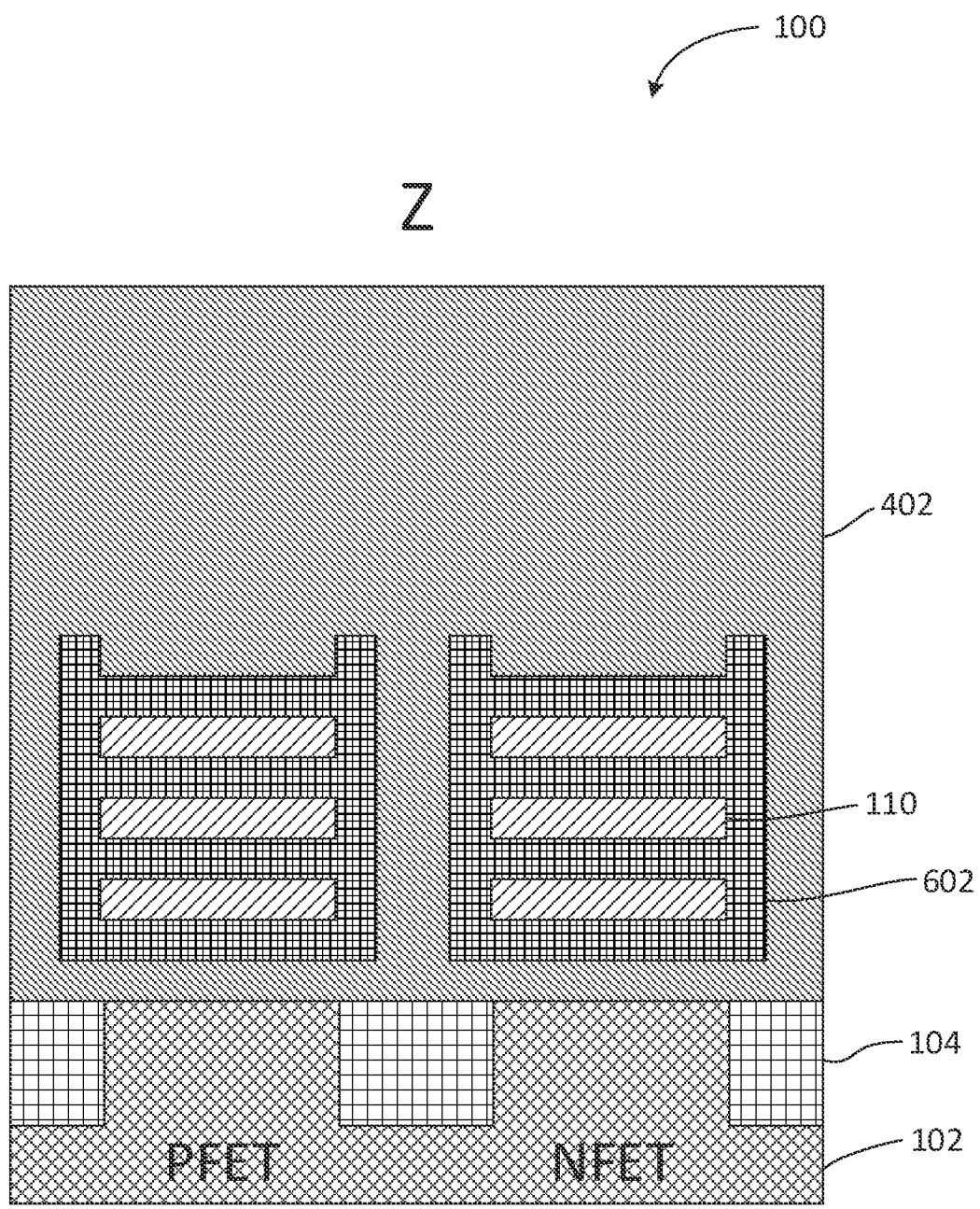
FIG. 14C depicts a cross-sectional view of the semiconductor nanosheet device of FIG. 13C taken along line Z of FIG. 1A after additional fabrication operations, according to embodiments.

Referring now to FIGS. 14A, 14B and 14C, these figures depict cross-sectional views of the semiconductor nanosheet device 100 of FIGS. 13A, 13B and 13C taken along cut lines X, Y and Z of FIG. 1A, respectively, after additional fabrication operations, according to embodiments. First, as shown in FIG. 14B, the PWFM layer 1204 is removed through an isotropic etching process from the NFET side (i.e., the right side in FIG. 14B) of the semiconductor nanosheet device 100. In these embodiments, the presence of the dielectric fill layer 1002 pillar ensures that there is no part of the PWFM layer 1204 on the PFET side of the semiconductor nanosheet device 100 that is undercut by the etching process. In other words, if the dielectric fill layer 1002 was not there, there would be potential for undercutting (i.e., removal) of lateral edge portions of the PWFM layer 1204 that would otherwise be exposed on the PFET side of the device. As such, the dielectric fill layer 1002 protects the PWFM layer 1204 on the PFET side during this stage of the manufacture of the device. FIGS. 14A and 14C remain unchanged relative to FIGS. 13A and 13C.

Figure 15A:
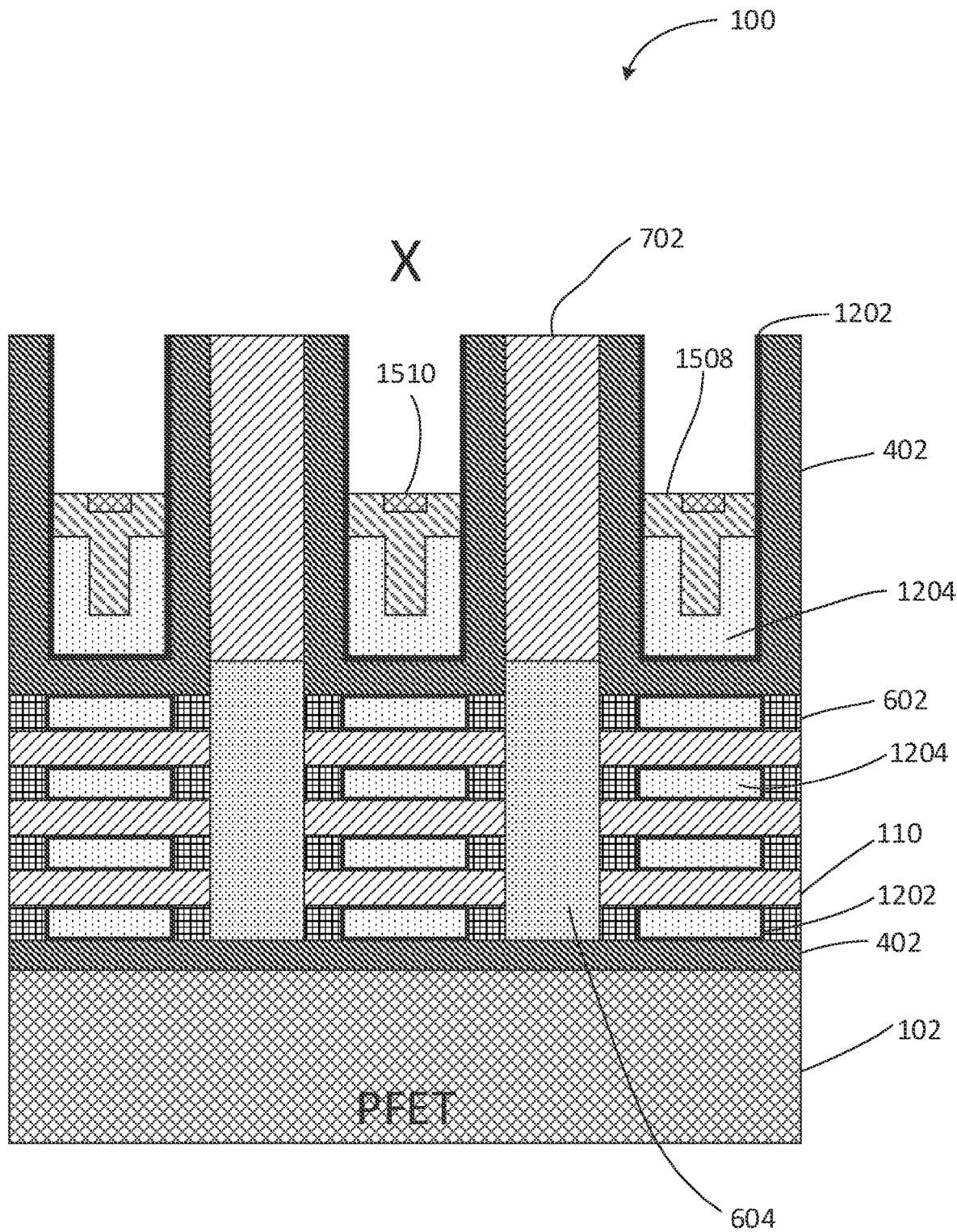
FIG. 15A depicts a cross-sectional view of the semiconductor nanosheet device of FIG. 14A taken along line X of FIG. 1A after additional fabrication operations, according to embodiments.
Figure 15B:
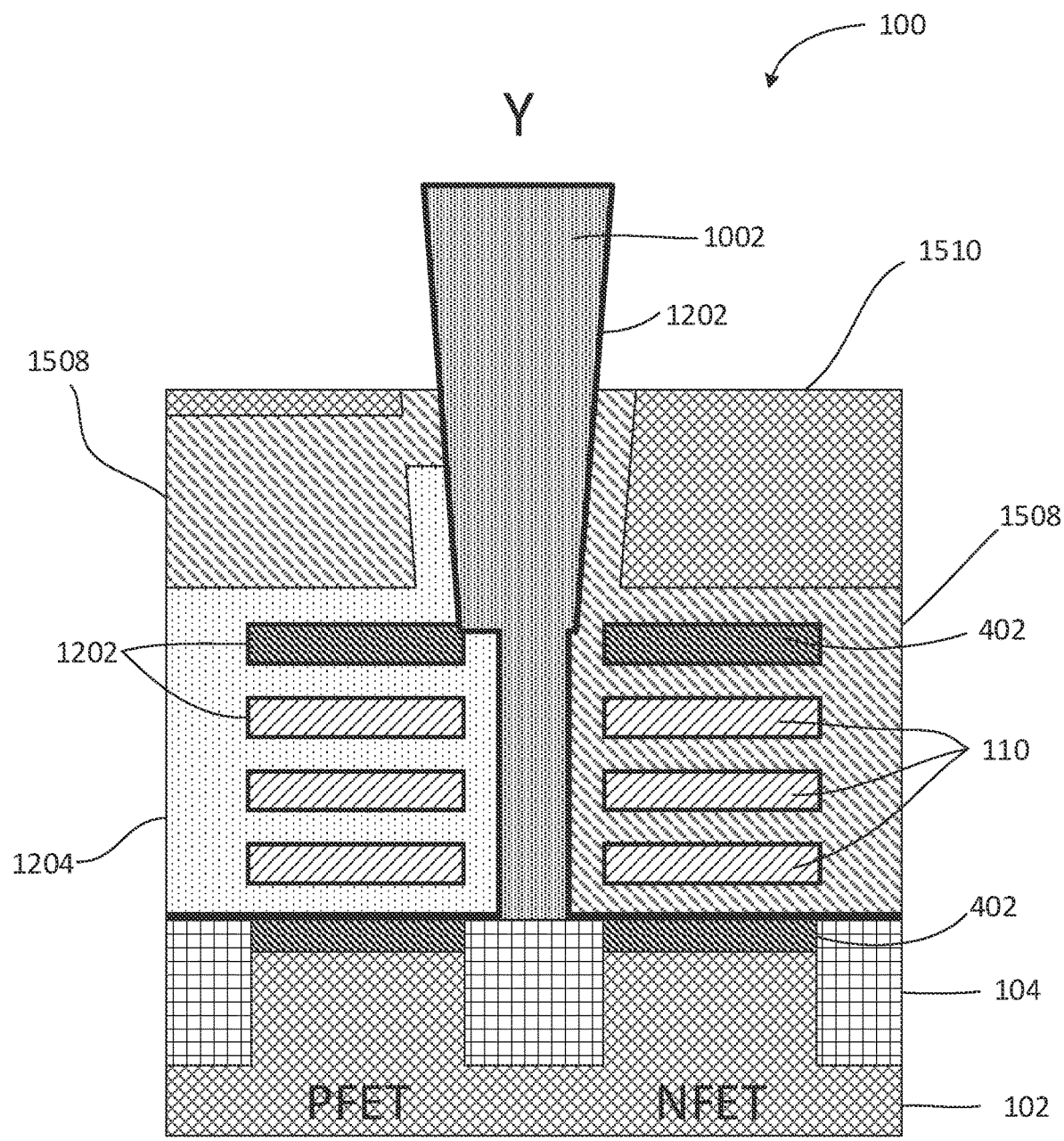
FIG. 15B depicts a cross-sectional view of the semiconductor nanosheet device of FIG. 14B taken along line Y of FIG. 1A after additional fabrication operations, according to embodiments.
Figure 15C:
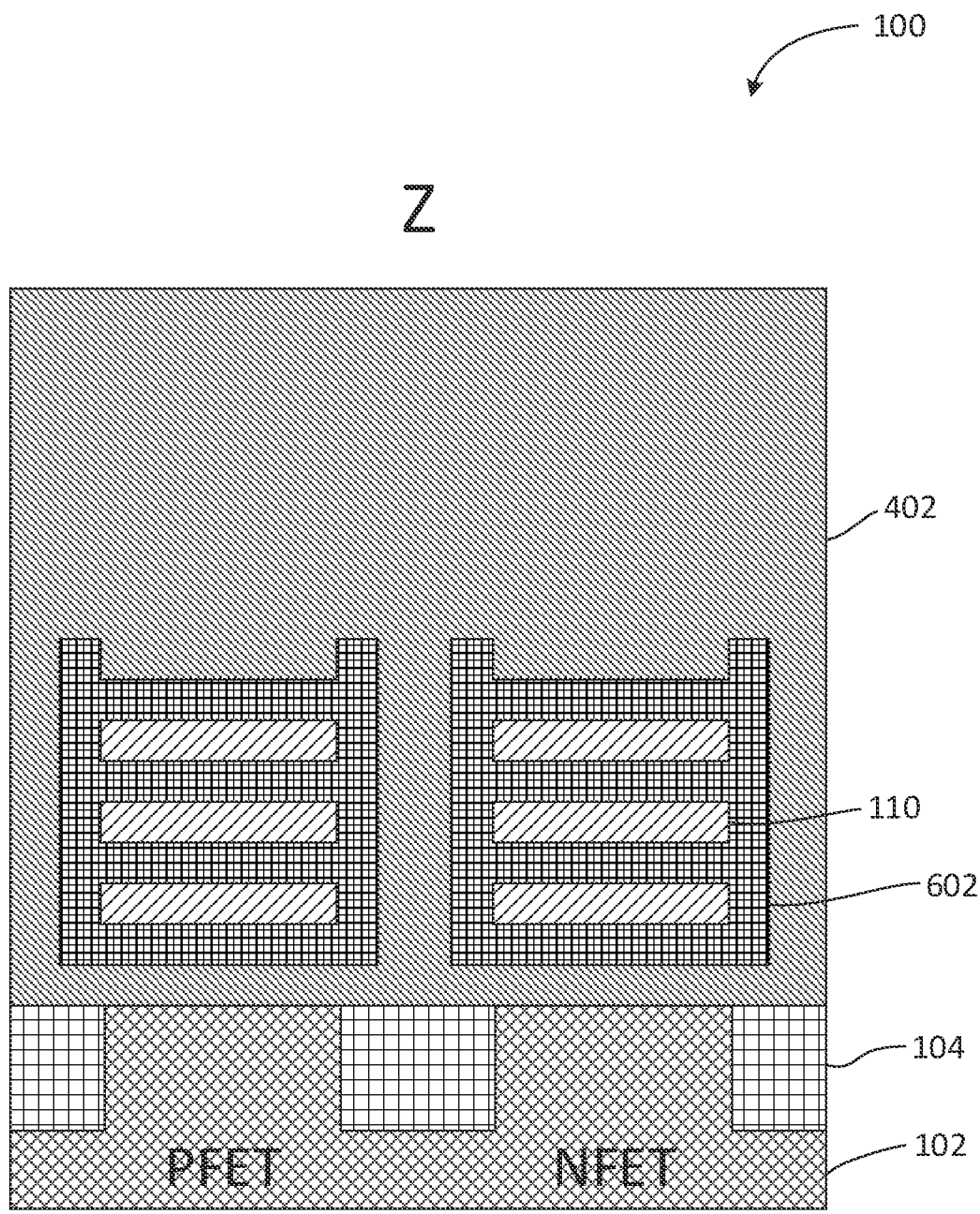
FIG. 15C depicts a cross-sectional view of the semiconductor nanosheet device of FIG. 14C taken along line Z of FIG. 1A after additional fabrication operations, according to embodiments.

Referring now to FIGS. 15A, 15B and 15C, these figures depict cross-sectional views of the semiconductor nanosheet device 100 of FIGS. 14A, 14B and 14C taken along cut lines X, Y and Z of FIG. 1A, respectively, after additional fabrication operations, according to embodiments. Although not shown in FIGS. 15A and 15B, the PWFM layer 1204 that was previously formed is first stripped away to allow for formation of a negative work function metal (NWFM) layer 1508 described below. As shown in FIG. 15B, the NWFM layer 1508 is formed on the conformal κ dielectric layer 1202 on the NFET side of the semiconductor nanosheet device 100. Specifically, the NWFM layer 1508 is formed in the inner spaces between the spacer 402 and the active semiconductor layer 110 in the vertical direction, and between the inner spacers 602 in the horizontal direction. Thus, the NWFM layer 1508 is formed on the NFET side of the semiconductor nanosheet device 100 in a similar manner to how the PWFM layer 1204 was previously formed on this same side of the device. However, the PWFM layer 1204 on the PFET side of the device is not affected by the formation of this NWFM layer 1508 due to the presence of the dielectric fill layer 1002. As shown in FIG. 15B, the NWFM layer 1508 is formed all around the surfaces of the active semiconductor layers 110 and the spacer 402. Also, as shown in FIG. 15A, the NWFM layer 1508 is formed between the sidewalls of the upper portion of the spacer 402 above the active semiconductor layers 110.

In certain embodiments, the NWFM layer 1508 is formed by WFM chamfering, similar to the formation of the PWFM layer 1204 discussed above. As shown in FIG. 15A, the upper portion of the NWFM layer 1508 that is formed between the spacer 402 is only formed to partially fill the space between the spacer. However, initially in the WFM chamfering process, the NWFM layer 1508 is formed all the way up to the top of the semiconductor nanosheet device 100 on the sidewalls of the κ dielectric layer 1202 (not shown in FIG. 15A). Then, a sacrificial material of an organic planarization layer 1510 (OPL) is formed to fill all the space between the κ dielectric layer 1202 all the way up to the top of the semiconductor nanosheet device 100 (also not shown in FIG. 15A). Then, the OPL layer 1510 is recessed down to the level shown in FIGS. 15A and 15B, leaving the NWFM layer 1508 still formed all of the way up the sidewalls to the top of the semiconductor nanosheet device 100 (also not shown in FIG. 15A). Finally, a portion of the NWFM layer 1508 is removed down to the level of the recessed OPL layer 1510 such that the top of the NWFM layer 1508 is generally at the same level as the top surface of the OPL layer 1510, as shown in FIGS. 15A and 15B. This WFM chamfering process is used on the NWFM layer 1508 and OPL layer 1510 to result in the layering shown in FIGS. 15A and 15B. In FIG. 15B, the top surfaces of the NWFM layer 1508 and OPL layer 1510 are partially up the side surfaces of the κ dielectric layer 1202 and the dielectric fill layer 1002. The cross-sectional view of FIG. 15C remains unchanged relative to FIG. 14C.

Figure 16A:
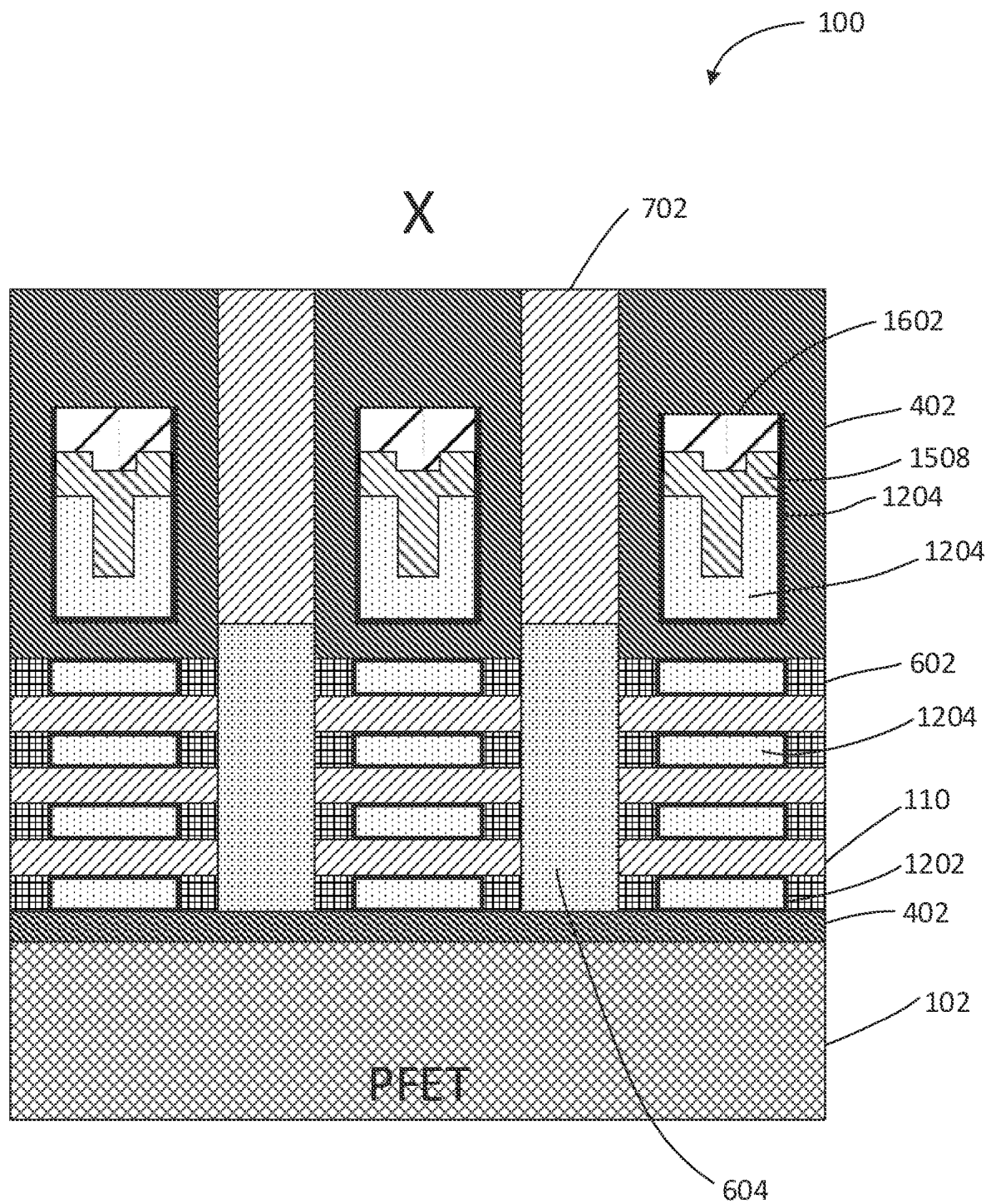
FIG. 16A depicts a cross-sectional view of the semiconductor nanosheet device of FIG. 15A taken along line X of FIG. 1A after additional fabrication operations, according to embodiments.
Figure 16B:
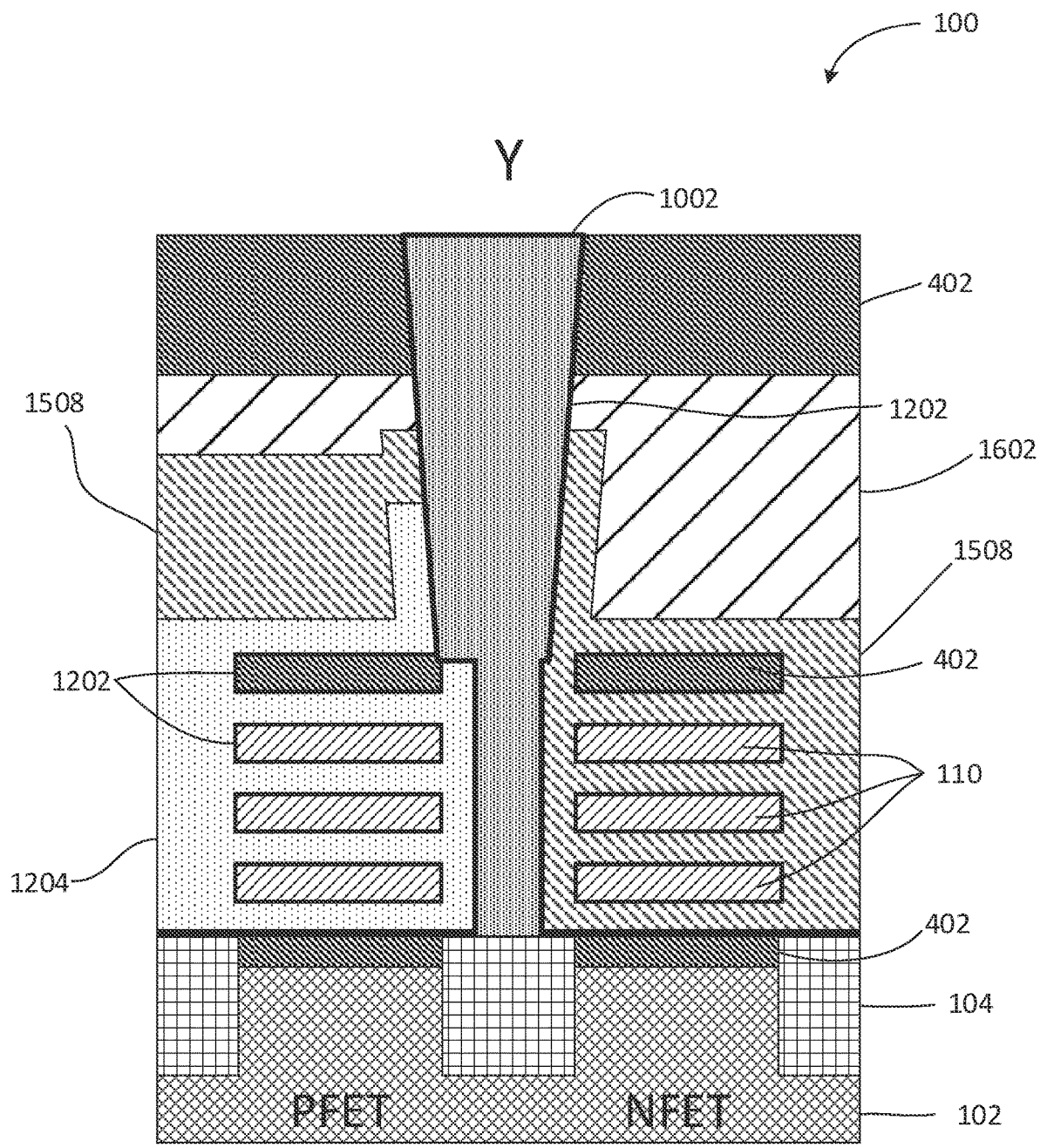
FIG. 16B depicts a cross-sectional view of the semiconductor nanosheet device of FIG. 15B taken along line Y of FIG. 1A after additional fabrication operations, according to embodiments.
Figure 16C:
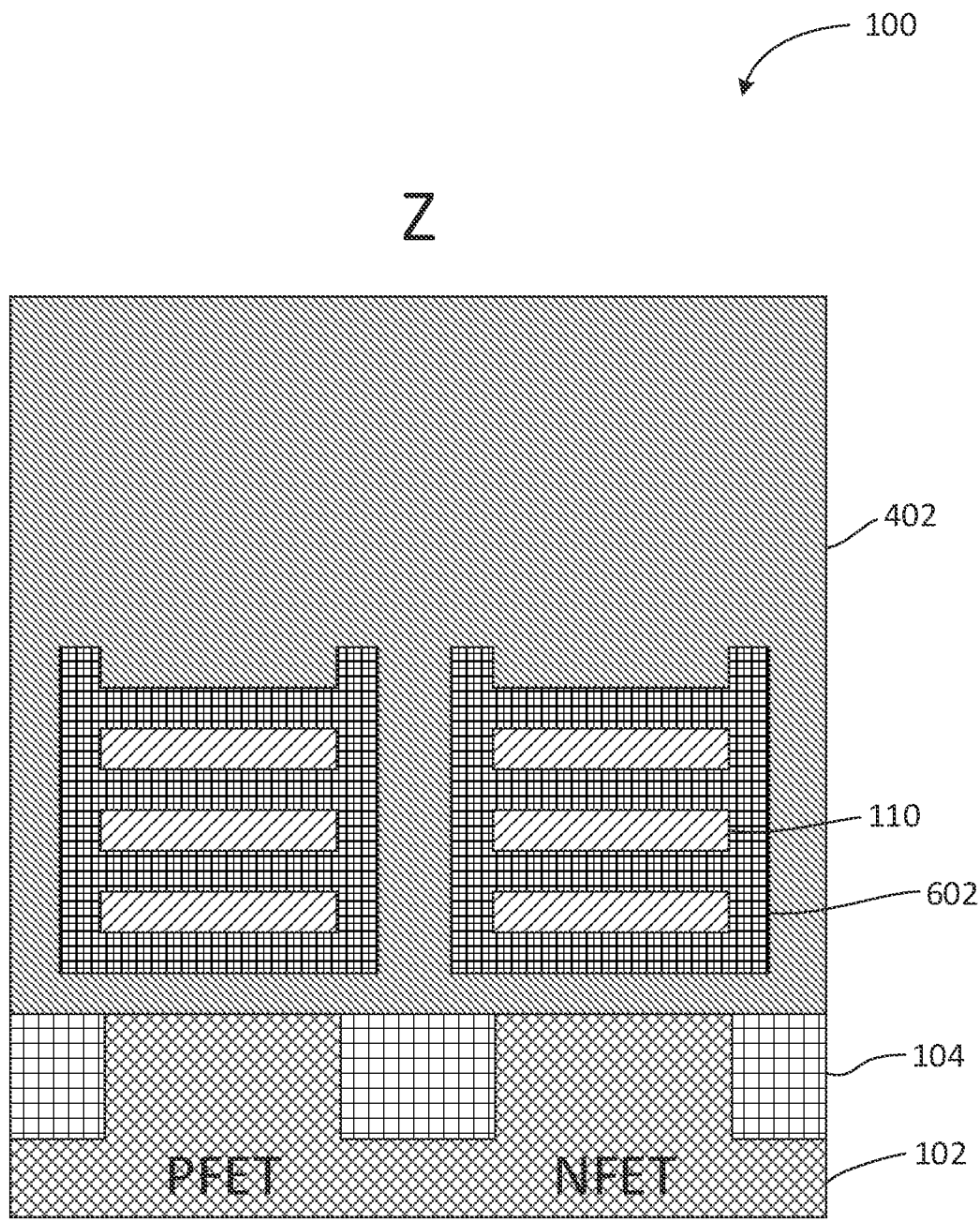
FIG. 16C depicts a cross-sectional view of the semiconductor nanosheet device of FIG. 15C taken along line Z of FIG. 1A after additional fabrication operations, according to embodiments.

Referring now to FIGS. 16A, 16B and 16C, these figures depict cross-sectional views of the semiconductor nanosheet device 100 of FIGS. 15A, 15B and 15C taken along cut lines X, Y and Z of FIG. 1A, respectively, after additional fabrication operations, according to embodiments. First, the OPL layer 1510 that was formed in FIGS. 15A and 15B is removed. Then, a metal layer 1602 is deposited. In certain examples, the metal layer 1602 is composed of tungsten (W). However, it should be appreciated that other suitable metal or metal alloys may be used for the metal layer 1602. Although not shown in FIGS. 16A and 16B, the metal layer 1602 is initially deposited at or above the level of the top surface of the interlayer dielectric (ILD) layer 702. Then, the semiconductor nanosheet device 100 is subjected to a CMP process to remove upper portions of the metal layer 1602 down to the level of the top surface of the interlayer dielectric (ILD) layer 702 (this intermediate step is also not shown in FIGS. 16A and 16B). Then, as shown in FIGS. 16A and 16B, the metal layer 1602 is recessed down to a level that is below the top surface of the interlayer dielectric (ILD) layer 702. In the same process, or in a later process, an upper portion of the κ dielectric layer 1202 is also removed down to the same level as the top surface of the metal layer 1602, as shown in FIG. 16A. Finally, a self-aligned contact (SAC) cap layer (this is shown as an extension of spacer 402) is formed on top of the metal layer 1602 and the existing spacer 402. In certain embodiments, the SAC cap layer is composed of the same material as the spacer layer 402 and can be considered to simply be an extension of that layer. For example, this SAC cap layer can be composed of SiN, the same material that is discussed above with regard to FIGS. 4A, 4B and 4C and the formation of the spacer 402. This SAC cap is useful to protect the gate when the ILD layer 702 is later removed in a subsequent processing step.

As described in detail above, there are several structural features shown in FIG. 16B that allow for an improved NFET to PFET (N-2-P) boundary for the semiconductor nanosheet device 100. For example, as shown in FIG. 16B, the PWFM layer 1204 not only includes material between the active semiconductor layers 110, but also includes material on the sidewalls of the active semiconductor layers 110. This is also true for the NWFM layer 1508, as also shown in FIG. 16B. In another example, as shown in FIG. 16B, the dielectric fill layer 1002 (i.e., dielectric pillar) is formed between the sidewalls of the PWFM layer 1204 and NWFM layer 1508 and helps to create a blocking feature between the PWFM layer 1204 and NWFM layer 1508 during formation of the device. This dielectric fill layer 1002 is formed in a self-aligned manner, such that the lower CD is smaller at the bottom and is always perfectly aligned in the middle between the nanosheet stacks 150. Another structural feature, as descried above with respect to FIG. 6C is that the inner spacer 602 is formed to completely surround the active semiconductor layers 110.

Figure 17A:
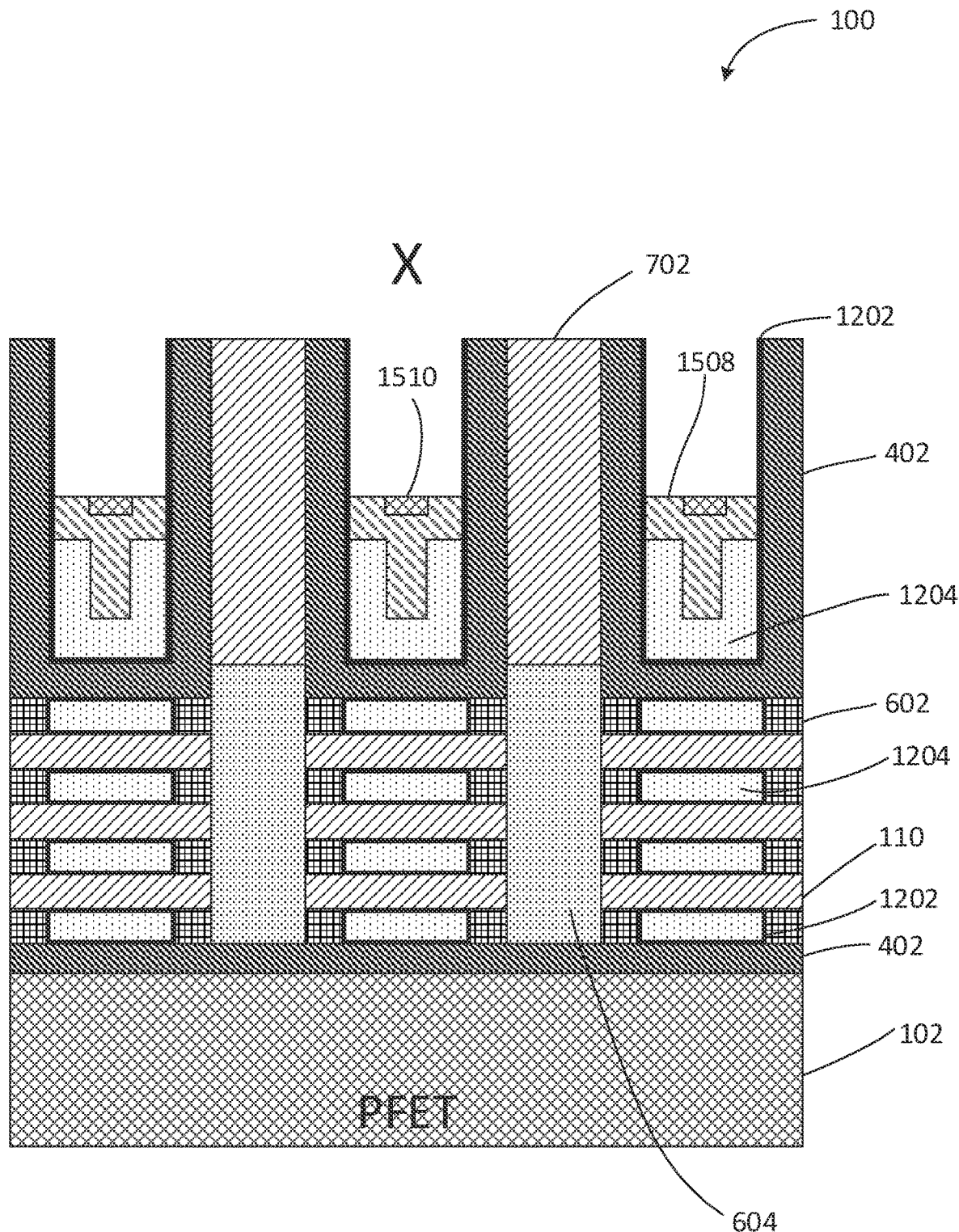
FIG. 17A depicts a cross-sectional view of the semiconductor nanosheet device of FIG. 15A taken along line X of FIG. 1A after additional fabrication operations, according to embodiments.
Figure 17B:
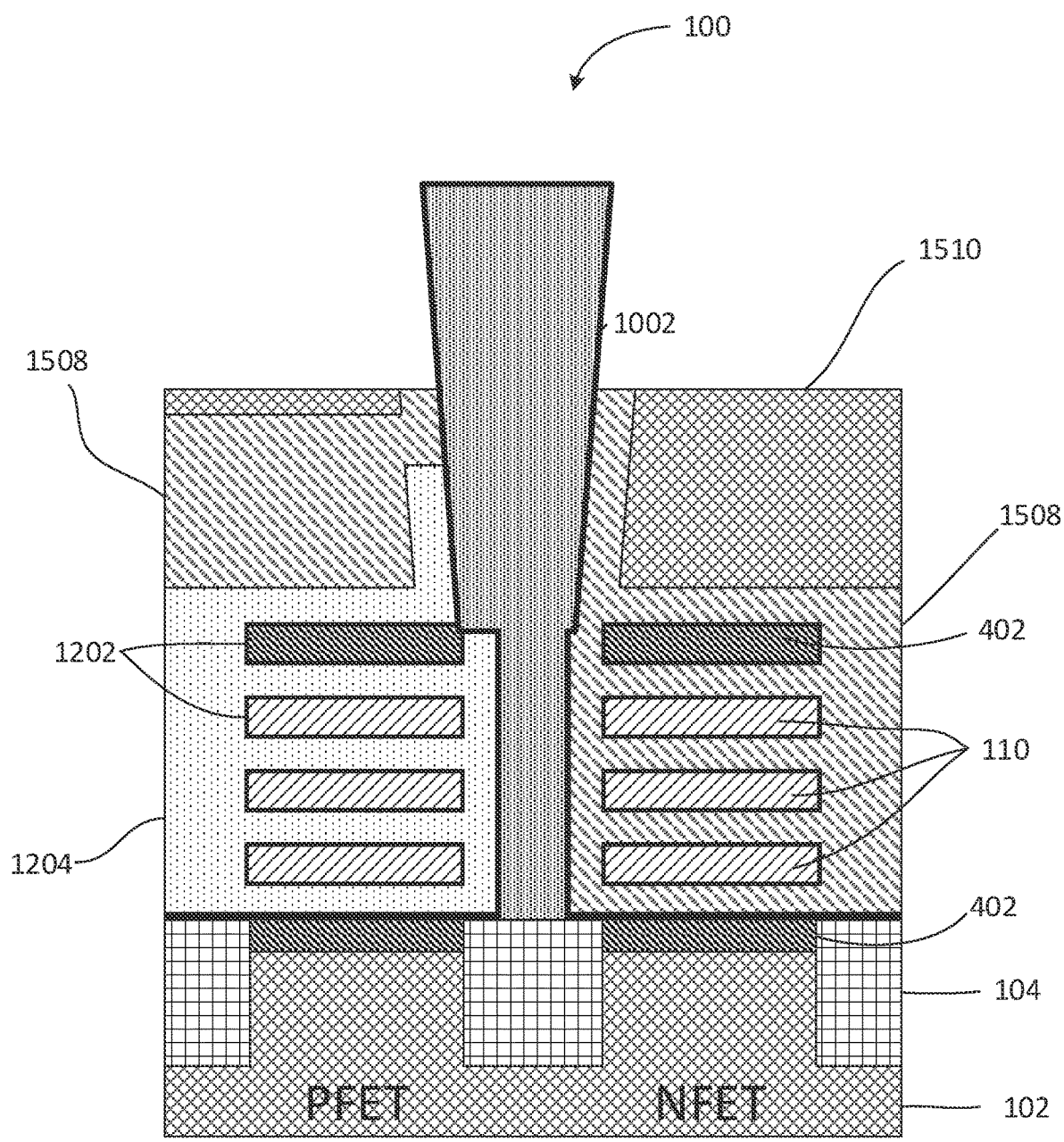
FIG. 17B depicts a cross-sectional view of the semiconductor nanosheet device of FIG. 15B taken along line Y of FIG. 1A after additional fabrication operations, according to embodiments.
Figure 17C:
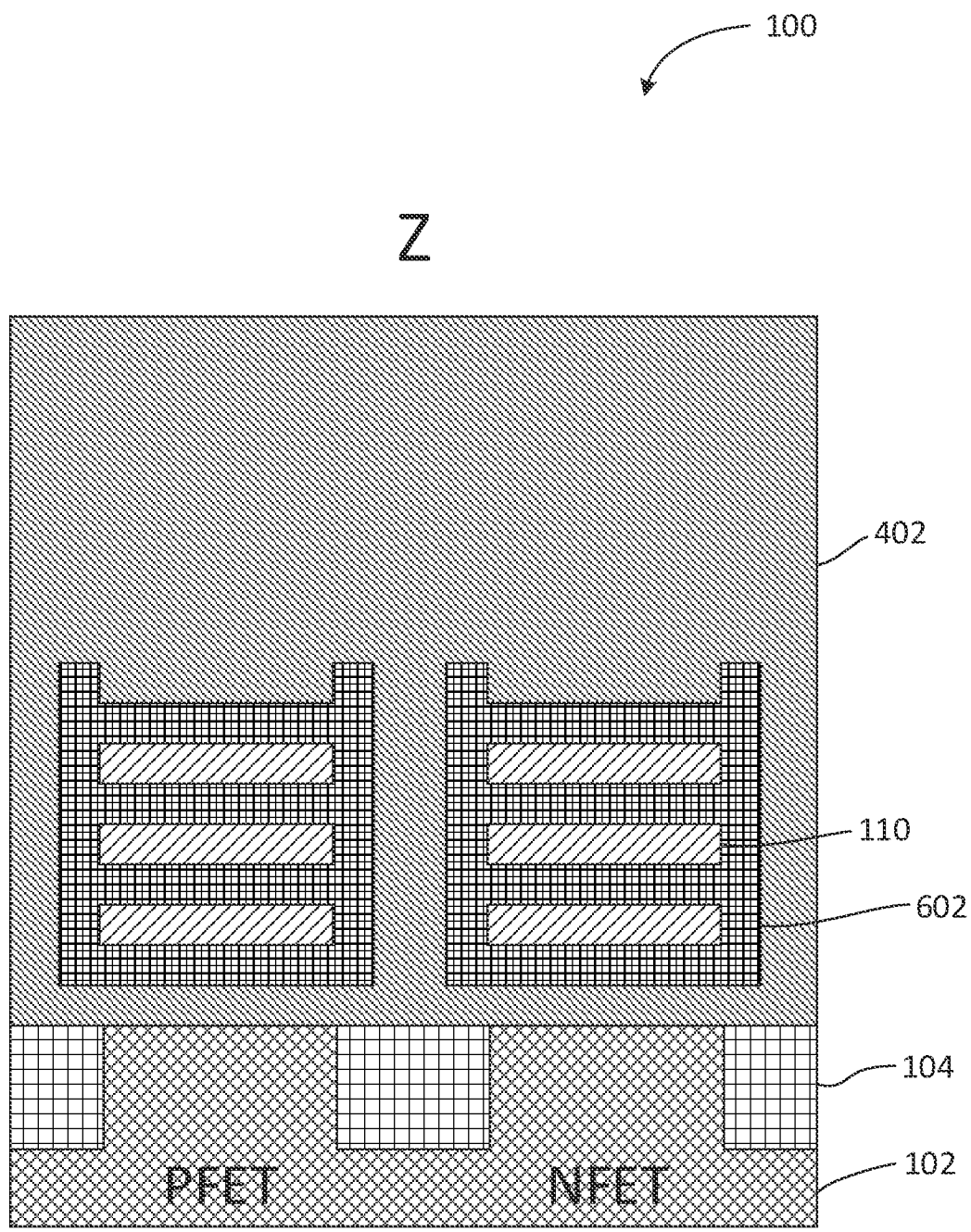
FIG. 17C depicts a cross-sectional view of the semiconductor nanosheet device of FIG. 15C taken along line Z of FIG. 1A after additional fabrication operations, according to embodiments.

In other embodiments, referring now to FIGS. 17A, 17B and 17C, these figures depict cross-sectional views of the semiconductor nanosheet device 100 of FIGS. 15A, 15B and 15C taken along cut lines X, Y and Z of FIG. 1A, respectively, after additional fabrication operations, according to embodiments. In these embodiments, the processing steps are generally the same as in the embodiments described above with respect to FIGS. 1A through 15C, however there are different processing steps with regard to the dielectric fill layer 1002 and the formation of the metal layer 1802 (see, FIG. 18B). In particular, in certain of these embodiments, as shown in FIG. 17B, the dielectric fill layer 1002 pillar is recessed prior to the formation of the metal layer 1802 (see, FIG. 18B). FIGS. 17A and 17C remain unchanged relative to FIGS. 15A and 15C.

Figure 18A:
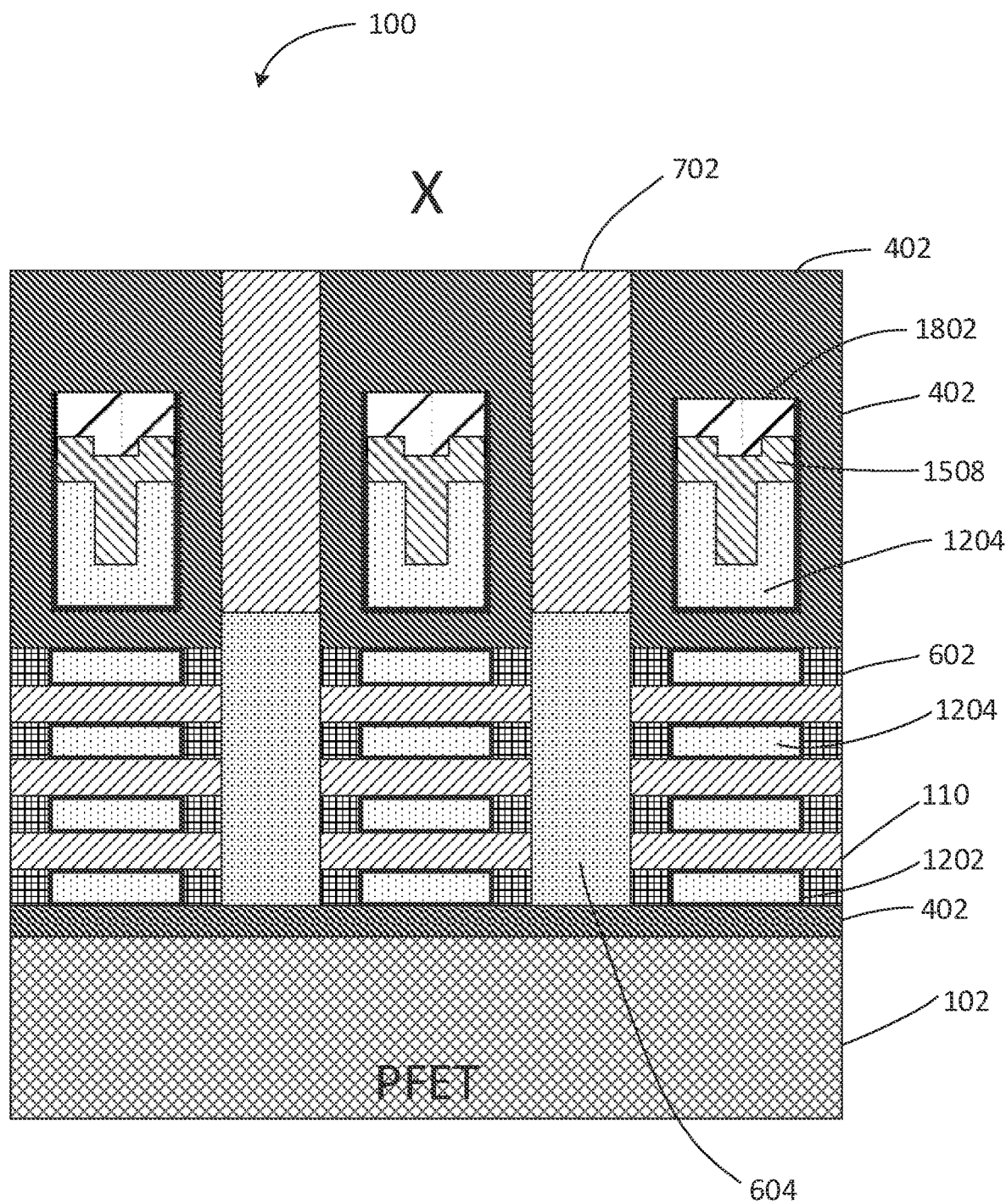
FIG. 18A depicts a cross-sectional view of the semiconductor nanosheet device of FIG. 17A taken along line X of FIG. 1A after additional fabrication operations, according to embodiments.
Figure 18B:
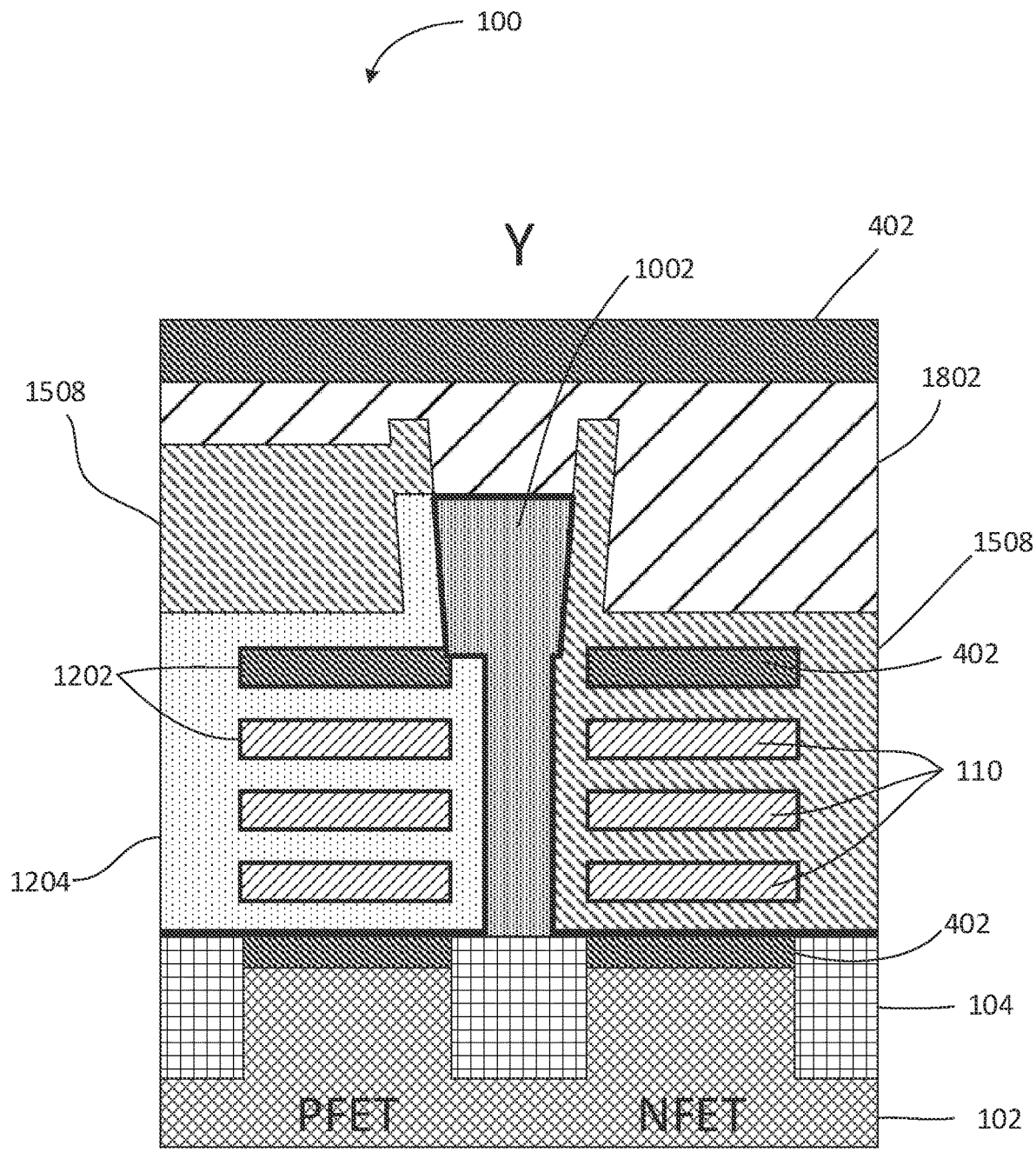
FIG. 18B depicts a cross-sectional view of the semiconductor nanosheet device of FIG. 17B taken along line Y of FIG. 1A after additional fabrication operations, according to embodiments.
Figure 18C:
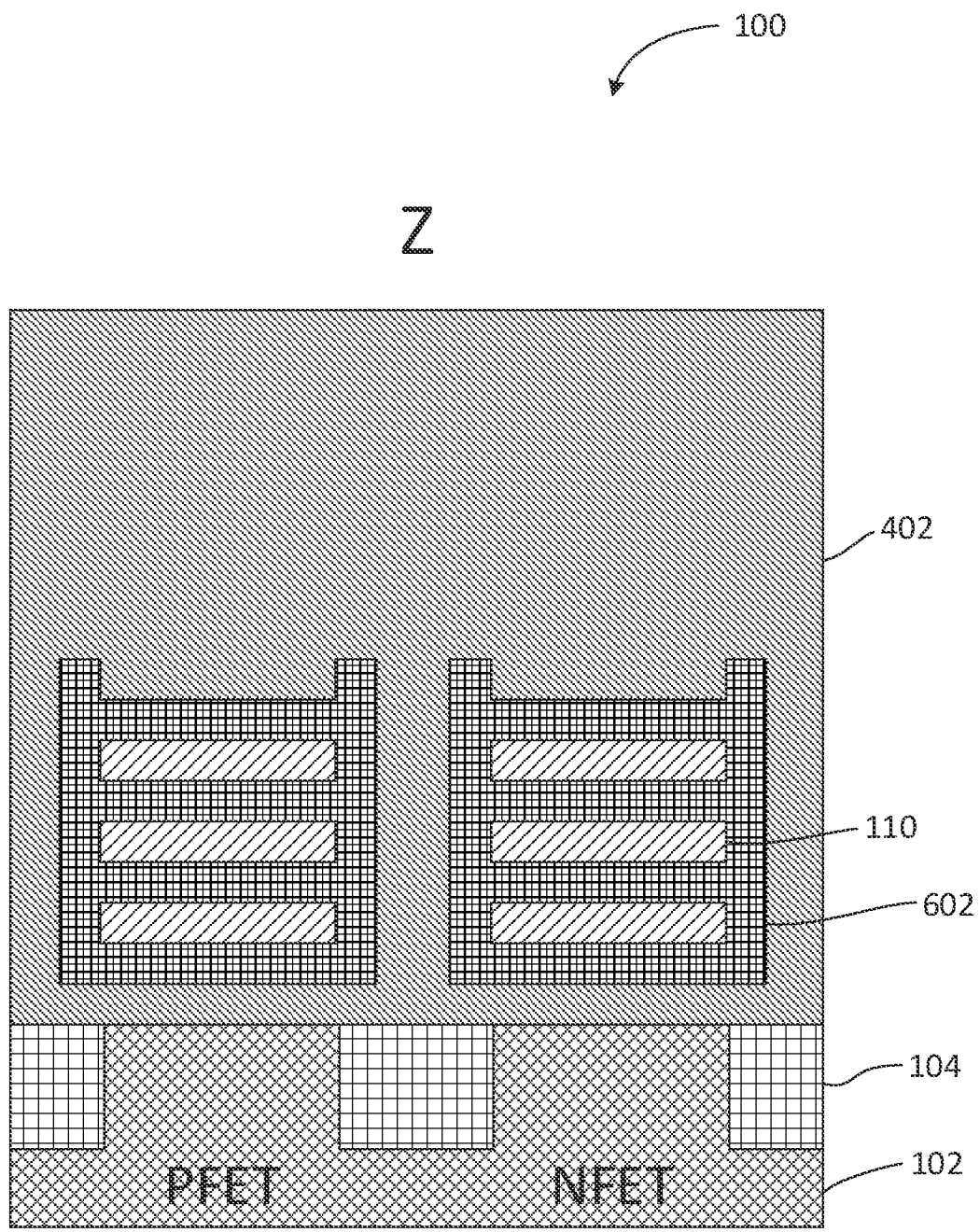
FIG. 18C depicts a cross-sectional view of the semiconductor nanosheet device of FIG. 17C taken along line Z of FIG. 1A after additional fabrication operations, according to embodiments.

Referring now to FIGS. 18A, 18B and 18C, these figures depict cross-sectional views of the semiconductor nanosheet device 100 of FIGS. 17A, 17B and 17C taken along cut lines X, Y and Z of FIG. 1A, respectively, after additional fabrication operations, according to embodiments. In particular, as shown in FIG. 18B, due to the previous recessing of the dielectric fill layer 1002 pillar, the metal layer 1802 crosses over from the PFET side of the semiconductor nanosheet device 100 to the NFET side of the device and is formed in the previously formed recess of the dielectric fill layer 1002. This metal layer 1802 allows for a shared gate structure through the top and bottom part of the gate, and this can assist with the patterning of the PWFM layer 1204 and the NWFM layer 1508. Thus, the metal layer 1802 is a shared gate structure that allows the gate to be shared at the device level rather than at the contact level. The shared metal layer 1802 can also have the effect of reduced parasitic capacitance between the gate and the remainder of the device, relative to the embodiments discussed above with regard to FIGS. 15A-15C.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a nanosheet field effect transistor (FET) device, the method comprising:
   forming a plurality of nanosheet stacks on a substrate, the nanosheet stacks including alternating layers of first type sacrificial layers and active semiconductor layers;
   forming sidewall portions of the first type sacrificial layers on sidewalls of the nanosheet stacks;
   forming a dielectric pillar between the sidewall portions of the first type sacrificial layers of adjacent nanosheet stacks;
   removing the first type sacrificial layers;
   forming a p-type work function metal (PWFM) layer in spaces formed by the removal of the first type sacrificial layers for a first one of the nanosheet stacks; and
   forming an n-type work function metal (NWFM) layer in spaces formed by the removal of the first type sacrificial layers for an adjacent second one of the nanosheet stacks.

2. The method according to claim 1, further comprising forming a lower second type sacrificial layer between the substrate and a lower surface of the nanosheet stacks, and forming an upper second type sacrificial layer on an upper surface of the nanosheet stacks, wherein the sidewall portions of the first type sacrificial layer are also formed on sidewalls of the upper second type sacrificial layer.

3. The method according to claim 2, further comprising:
   removing the upper and lower second type sacrificial layers after the formation of the sidewall portions of the first type sacrificial layer;
   forming a dielectric spacer layer in spaces formed by the removal of the second type sacrificial layers.

4. The method according to claim 2, wherein the first type sacrificial layer is composed of a first content percentage of SiGe material, and the second type sacrificial layer is composed of a second content percentage of SiGe material, wherein the second content percentage is higher than the first content percentage.

5. The method according to claim 1, further comprising:
forming an organic planarization layer (OPL) on the nanosheet stacks;
removing portions of the OPL between adjacent nanosheet stacks to expose vertical side surfaces of the sidewall portions of the first type sacrificial layers; and
forming the dielectric pillar in the space formed by the removal of the portions of the OPL.

6. The method according to claim 5, wherein removing portions of the OPL also exposes a top surface of the sidewall portion of the first type sacrificial layer for a first one of the nanosheets stacks, and wherein the dielectric pillar is formed to also cover top surface of the sidewall portion of the first type sacrificial layer.

7. The method according to claim 1, wherein the dielectric pillar prevents material of the NWFM layer from contacting material of the PWFM layer during formation of the NWFM layer.

8. The method according to claim 1, wherein the PWFM layer is initially formed in the spaces formed by the removal of the second type sacrificial layer for both the first and second nanosheet stacks, the method further comprising:
forming an organic planarization layer (OPL) on the first nanosheet stack and on a portion of an upper surface of the dielectric pillar;
removing the PWFM layer from the second nanosheet stack to reopen the spaces formed by the removal of the second type sacrificial layer; and
forming the NWFM layer in the spaces formed by the removal of the second type sacrificial layer and by the subsequent removal of the PWFM layer for the second nanosheet stack.

9. The method according to claim 8, wherein during removal of the PWFM layer from the second nanosheet stack, the dielectric pillar is a barrier to prevent undercutting of the PWFM layer from the first nanosheet stack.

10. The method according to claim 1, further comprising forming a metal layer on the PWFM layer and the NWFM layer.

11. The method according to claim 10, further comprising forming a self-aligned contact (SAC) cap on the metal layer.

12. A nanosheet field effect transistor (FET) device comprising:
a substrate;
a plurality of nanosheet stacks formed on the substrate, a first one of the nanosheet stacks including alternating layers of p-type work function metal (PWFM) layers and active semiconductor layers, a second adjacent one of the nanosheet stacks including alternating layers of n-type work function metal (NWFM) layers and the active semiconductor layers, where sidewall portions of the PWFM layers and the NWFM layers are formed on sidewalls of the respective nanosheet stacks; and
a dielectric pillar formed between the sidewall portions of the PWFM layers and the NWFM layers of the adjacent nanosheet stacks, the dielectric pillar extending from the substrate to a level above an upper surface of the nanosheet stacks, wherein the dielectric pillar has an upper portion with a larger diameter than a diameter of a lower portion thereof.

13. The nanosheet FET device of claim 12, wherein a portion of the dielectric pillar is formed on an upper surface of the sidewall portion of the PWFM layer.

14. The nanosheet FET device of claim 12, further comprising a first dielectric spacer layer formed between the substrate and the PWFM layer of the first nanosheet stack, and also formed between the substrate and the NWFM layer of the second nanosheet stack.

15. The nanosheet FET device of claim 14, further comprising a second dielectric spacer layer formed above an uppermost active semiconductor layer of the first nanosheet stack and an uppermost active semiconductor layer of the second nanosheet stack.

16. The nanosheet FET device of claim 15, wherein a portion of the dielectric pillar directly contacts a portion of the second dielectric spacer layer of the first nanosheet stack.

17. The nanosheet FET device of claim 16, further comprising a high-κ layer formed between on outer surfaces of the layers of the first and second nanosheet stacks.

18. The nanosheet FET device of claim 12, further comprising a metal layer formed on the PWFM layer and on the NWFM layer.

19. The nanosheet FET device of claim 18, further comprising a self-aligned contact (SAC) cap formed on the metal layer.

* * * * *